(12) United States Patent
Litovsky

(10) Patent No.: US 7,656,061 B2
(45) Date of Patent: Feb. 2, 2010

(54) AUTOMATIC POWER SOURCE CONFIGURATION

(75) Inventor: Roman N. Litovsky, Newton, MA (US)

(73) Assignee: Bose Corporation, Farmingham, MA (US)

( * ) Notice: Subject to any disclaimer, the term of this patent is extended or adjusted under 35 U.S.C. 154(b) by 0 days.

(21) Appl. No.: 11/927,416

(22) Filed: Oct. 29, 2007

(65) Prior Publication Data

US 2009/0108681 A1    Apr. 30, 2009

(51) Int. Cl.
    *G01R 1/20* (2006.01)
(52) U.S. Cl. ...................................... 307/154
(58) Field of Classification Search .................. 307/140, 307/154
    See application file for complete search history.

(56) References Cited

U.S. PATENT DOCUMENTS

| | | | |
|---|---|---|---|
| 5,461,297 A | 10/1995 | Crawford | |
| 5,838,554 A | 11/1998 | Lanni | |
| 5,940,263 A | 8/1999 | Jakoubovitch | |
| 6,057,670 A * | 5/2000 | Sink et al. | 320/117 |
| 6,078,167 A | 6/2000 | Oskowsky et al. | |
| 6,091,611 A | 7/2000 | Lanni | |
| 6,104,759 A | 8/2000 | Carkner et al. | |
| 6,172,884 B1 | 1/2001 | Lanni | |
| 6,396,715 B1 | 5/2002 | Zhang et al. | |
| 6,465,987 B1 | 10/2002 | Haas et al. | |
| 6,608,900 B1 | 8/2003 | Yancey et al. | |
| 6,625,285 B1 | 9/2003 | Ohashi | |
| 6,628,107 B1 | 9/2003 | Bang et al. | |
| 6,653,814 B1 | 11/2003 | Patino | |
| 6,664,766 B2 | 12/2003 | Desprez et al. | |
| 6,949,915 B2 | 9/2005 | Stanley | |
| 7,202,576 B1 * | 4/2007 | Dechene et al. | 307/66 |
| 7,301,249 B2 * | 11/2007 | Stranberg et al. | 307/66 |
| 2001/0043060 A1 | 11/2001 | Brandt | |
| 2002/0102003 A1 | 8/2002 | Ford | |
| 2002/0175522 A1 | 11/2002 | Wacknov et al. | |
| 2003/0222503 A1 | 12/2003 | Lam et al. | |
| 2005/0242885 A1 | 11/2005 | Craynon et al. | |

(Continued)

FOREIGN PATENT DOCUMENTS

EP    0657985    6/1995

(Continued)

OTHER PUBLICATIONS

International Search Report and Written Opinion dated Feb. 10, 2009 for Application No. PT/US2008/080623.

(Continued)

*Primary Examiner*—Robert L. Deberadinis

(57) ABSTRACT

A circuit to supply power to a detachable load incorporates a power source, a power converter and an array of capacitors. Upon connection of the detachable load, the capacitors of the array of capacitors are automatically configured into a desired series, parallel or combination series and parallel configuration of interconnections to accommodate limitations in the voltage ranges of the capacitors in being coupled to the load and/or to achieve other desired characteristics of electrical power to be provided to the load. Further, upon connection of the detachable load, a limit on current flow imposed by the power converter may be set to a desired level to achieve desired characteristics of electrical power to be provided to the load and/or desired characteristics of charging and discharging behaviors of the array of capacitors.

21 Claims, 34 Drawing Sheets

U.S. PATENT DOCUMENTS

| | | | |
|---|---|---|---|
| 2007/0098190 | A1 | 5/2007 | Song et al. |
| 2007/0105415 | A1* | 5/2007 | Jin et al. .................... 439/122 |
| 2008/0048499 | A1 | 2/2008 | Litovsky et al. |
| 2008/0054842 | A1 | 3/2008 | Kim et al. |

FOREIGN PATENT DOCUMENTS

| | | |
|---|---|---|
| EP | 0 902 547 | 3/1999 |
| EP | 1202427 | 5/2002 |
| EP | 1447897 | 8/2004 |
| EP | 1608054 | 12/2005 |
| FR | 2847741 | 5/2004 |
| KR | 100748311 | 8/2007 |
| WO | 0215386 A2 | 2/2002 |
| WO | 0246608 | 6/2002 |
| WO | 02074387 | 9/2002 |

OTHER PUBLICATIONS

CAP-XX Pty Ltd. White Paper, Use of Super Capacitors to Improve Performance of GPRS Mobile Stations, Feb. 2003. pp. 1-77.

Linear Technology document for part LTC3459.

Linear Technology document for part LTC1624.

1st Office Action dated Apr. 4, 2008 for Chinese application No. 200510078392.4.

2nd Office Action dated Sep. 26, 2008 for Chinese Application No. 2005 10078392.4.

Communication from European Patent Office dated Sep. 28, 2007 in Counterpart Application No. 05105040.9.

Search Report dated Nov. 10, 2006 for European Application No. 05105040.9.

Search Report dated Oct. 17, 2008 for PCT Application No. PCT/US2008/065520.

International Search Report and Written Opinion dated Jun. 23, 2009 for Application No. PT/US2008/081258.

International Preliminary Report on Patentability dated Nov. 9, 2009 for Application No. PT/US2008/081258.

* cited by examiner

AUTOMATIC POWER SOURCE CONFIGURATION

BACKGROUND

This description relates to automatic configuration of capacitors and power converters in a power source.

Power converters and capacitors are used to supply power to a load. In some cases, capacitors using various techniques to achieve a very high charge storage capacity in a relatively small volume (i.e., "super capacitors" or "ultra capacitors") are used. Although the higher capacities in smaller physical forms are deemed desirable, such capacitors are also noted for having a very limiting maximum voltage across the anode and cathode. It is not uncommon for super capacitors or ultra capacitors to have a maximum permissible voltage between the anode and cathode of approximately 2.5 volts. This is highly limiting in comparison to, for example, some varieties of electrolytic capacitors which may permit a voltage as high as hundreds of volts.

Highly limiting maximum voltages for such capacitors (such as 2.5 volts) can become even more problematic where such capacitors prove to have an tendency for building up a charge over time from exposure to various electrical environments, since such capacitors will likely build up a charge at its maximum voltage. This tendency can further limit the manner in which such a capacitor is used, since such a capacitor having a maximum voltage of 2.5 volts may effectively be useable only at or near that voltage, rather than throughout a full range of voltages from 0 to 2.5 volts (i.e., from zero to its maximum voltage).

SUMMARY

A circuit to supply power to a detachable load incorporates a power source, a power converter and an array of capacitors. Upon connection of the detachable load, the capacitors of the array of capacitors are automatically configured into a desired series, parallel or combination series and parallel configuration of interconnections to accommodate limitations in the voltage ranges of the capacitors in being coupled to the load and/or to achieve other desired characteristics of electrical power to be provided to the load. Further, upon connection of the detachable load, a limit on current flow imposed by the power converter may be set to a desired level to achieve desired characteristics of electrical power to be provided to the load and/or desired characteristics of charging and discharging behaviors of the array of capacitors.

In one aspect, the invention features an apparatus that includes a connector, a power source to provide power to support at least one part of a load connected to the connector, and a capacitor array comprising a first capacitor and a second capacitor having an alterable interconnection that changes between a series configuration and a parallel configuration in response to the connection of the at least one part of the load to the connector.

Implementations of the invention may include one or more of the following features. Implementations could include a power converter being structured to impose a limit on a flow of current from the power source, where the limit may be changeable in response to a signal received from the load, and being structured to cooperate with the capacitor array to provide a temporary flow of current circumventing the power converter. Implementations could include switches, possibly incorporated into the connector, to change the alterable interconnections of the capacitors. Implementations could include a processing device executing instructions to alter the interconnections of the capacitors and/or the limit imposed by the power converter in response to receiving a signal from the load.

In one aspect, the invention features an apparatus that includes a connector, a power source to provide power to support at least one part of a load connected to the connector, and a power converter, wherein the power converter is structured to impose a predetermined limit on a flow of current from the power source through a portion of the power converter, and wherein the power converter is structured to change the predetermined limit in response to the connection of the at least one part of the load to the connector.

Implementations of the invention may include one or more of the following features. Implementations could include a capacitor array being structured to have alterable interconnections between the capacitors making up the capacitor array, and being structured to cooperate with the power converter to provide a temporary flow of current circumventing the power converter, where the limit may be changeable in response to a signal received from the load. Implementations could include a processing device executing instructions to alter the interconnections of the capacitors and/or the limit imposed by the power converter in response to receiving a signal from the load.

In one aspect, the invention features an apparatus that includes a connector, an audio amplifier to output amplified audio to the connector, a power source to provide power to the amplifier, and a power control device with an alterable power control parameter, wherein the power control device is structured to change the alterable power control parameter in response to the connection of a detachable acoustic driver to the connector.

Implementations of the invention may include one or more of the following features. Implementations could include a capacitor array being structured to have alterable interconnections between the capacitors making up the capacitor array, and being structured to cooperate with the power converter to provide a temporary flow of current circumventing the power converter, where the limit may be changeable in response to a signal received from the load.

Other features and advantages of the invention will become apparent from the following description, and from the claims.

DESCRIPTION

Figure 1:
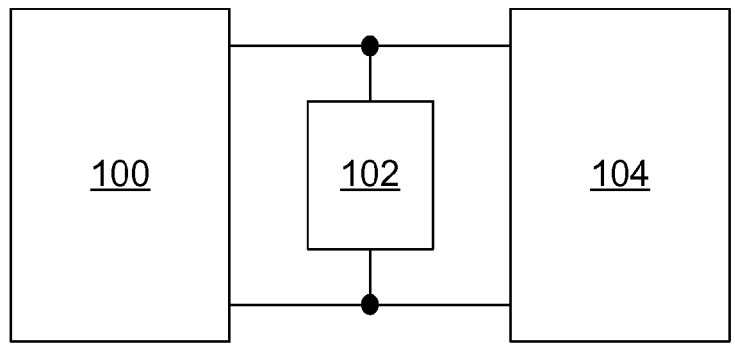
FIG. 1 is a circuit diagram of a power converter in parallel with a capacitive element coupled to a load.

FIG. 1 shows a circuit that includes a power converter 100 in parallel with a capacitive element 102 (e.g., circuitry having an impedance with negative reactance). The power converter 100 and capacitive element 102 are coupled to a load 104 that demands an amount of power $P_L$ based on the input resistance $R_L$ of the load 104. For a load 104 having a variable demand for power (a "variable load"), the input resistance $R_L(t)$ varies as a function of time t. For a power converter 100 that supplies a constant voltage $V_S$, the power $P_L(t)$ supplied to the load 104 is determined by $P_L(t)=V_S^2/R_L(t)$. In steady-state conditions (e.g., $R_L(t)$ is slowly varying with respect to the effective time constant associated with the capacitive element 102), the load 104 draws a current $I_L(t)$ from the power converter 100 that is approximately $I_L(t)=V_S/R_L(t)$.

Some variable loads (e.g., an audio power amplifier or a motor) have a peak power demand that is many times higher than the average power demand. In such cases, a power converter 100 with a controlled current-voltage characteristic, as described in more detail below, is able to supply the average power demanded by the load, while causing a brief demand for a high peak power to be supplied from energy stored in the capacitive element 102. By causing at least some of the peak power to be supplied from the capacitive element 102, the power converter 100 can maintain a relatively low amount of power drawn from a power source such as a battery or AC mains.

Figure 2A:
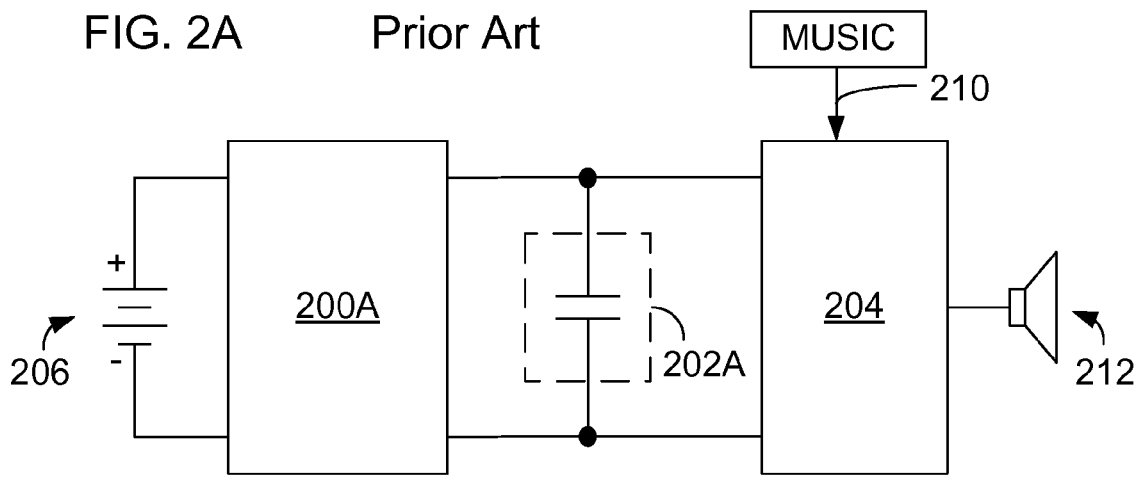
FIG. 2A is a circuit diagram of a DC-DC power converter in parallel with a capacitive element coupled to an audio amplifier.
Figure 2B:
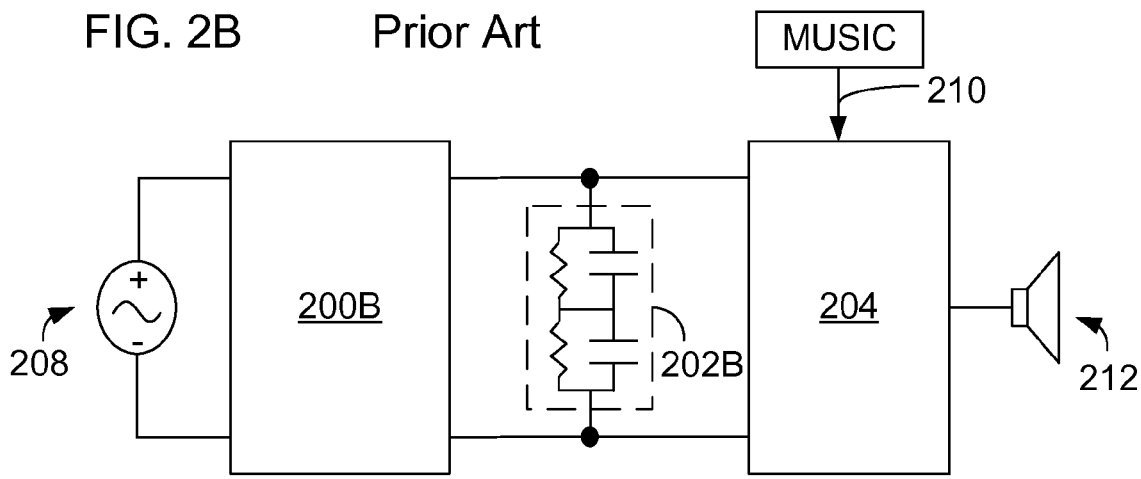
FIG. 2B is a circuit diagram of an AC-DC power converter in parallel with a capacitive element coupled to an audio amplifier.

As shown in FIGS. 2A and 2B, a DC-DC power converter 200A in parallel with a capacitive element 202A can be used to supply power to an audio amplifier 204 from a battery 206 (FIG. 2A), and an AC-DC power converter 200B in parallel with a capacitive element 202B can be used to supply power to the audio amplifier 204 from an AC mains 208 (FIG. 2B). The varying nature of the power demand from the audio amplifier 204 is determined, for example, by a music signal 210 that is amplified to drive a speaker 212. A power converter and capacitive element can be used to supply power to other types of devices or combinations of devices where power demand may vary (e.g., a charging cradle for a cell phone, where the cradle also acts as a powered loudspeaker and many other examples).

The capacitive element 202A can be implemented using a "super capacitor" or "ultra capacitor" (e.g., using aerogel technology) to obtain a capacitance in the range of approximately 1-30 Farads (F) and a maximum voltage of approximately 2.5 V. In another implementation, the capacitive element 202B includes two 10 F/2.5 V capacitors in series, each capacitor having a 5.1 kΩ shunt resistor (e.g., to provide even steady-state charge storage among the capacitors). The resulting capacitance of the capacitive element 202B is 5 F, and the maximum voltage of the capacitive element 202B is 5 V. In other implementations the capacitive element can include three or more capacitors connected in series. Any of a variety of implementations of a capacitive element including 202A, 202B or others may be used in any of a variety of power converter configurations including a DC-DC power converter, an AC-DC power converter or others.

Figure 3A:
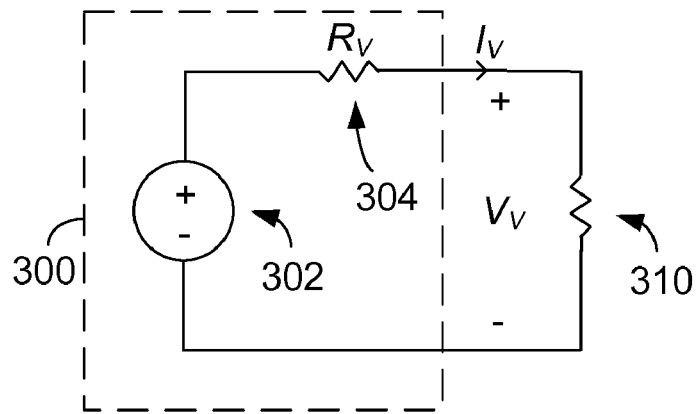
FIG. 3A is a circuit diagram of a voltage source driving a load.
Figure 3B:
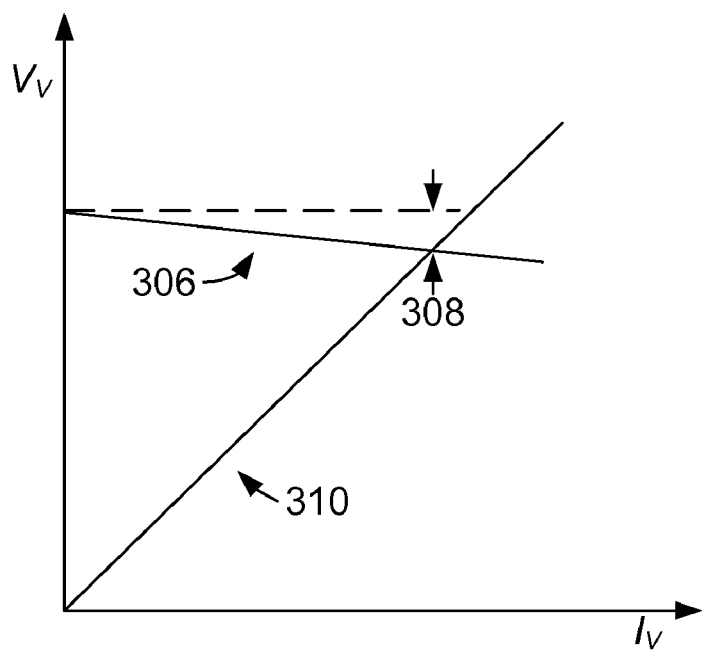
FIG. 3B is a current-voltage characteristic for the circuit of FIG. 3A.

FIG. 3A shows a circuit with a voltage source 300 and a load resistor 310. The voltage source 300 (e.g., a Li-Ion or NiMHd battery) is modeled by an ideal voltage source 302 (of constant voltage $V_O$) in series with a resistor 304 representing the output resistance of the voltage source 300. The current-voltage characteristic 306 for this voltage source 300 is shown in FIG. 3B, along with the "load line" for the load 310 (i.e., the current-voltage characteristic of the load resistor 310). The small output resistance $R_V$ represented by the resistor 304 causes a sag 308 in the output voltage $V_V$ of the voltage source 300 as a function of output current $I_V$. The size of the sag 308 increases as the load resistance $R_L$ (i.e., the slope of the load line) decreases.

Figure 4A:
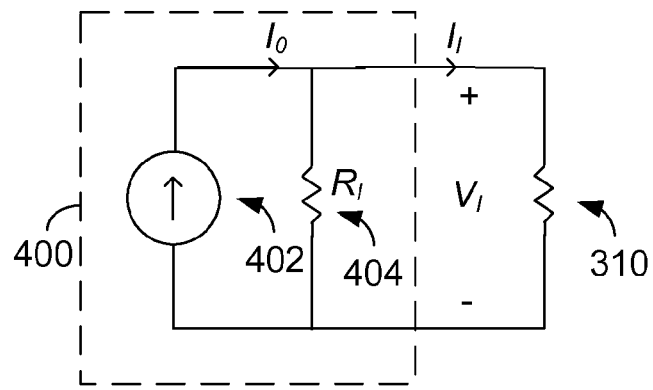
FIGS. 4A and 4C are equivalent circuit diagrams of a current source driving a load.
Figure 4B:
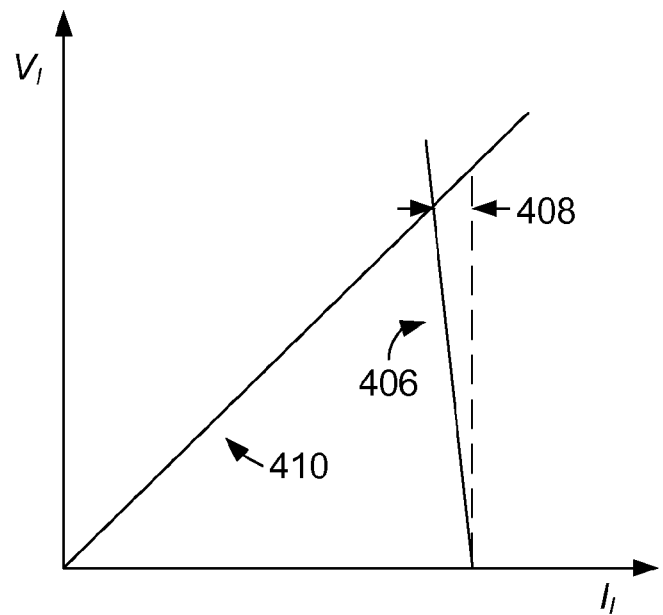
FIG. 4B is current-voltage characteristic for the circuit of FIGS. 4A and 4C.
Figure 4C:
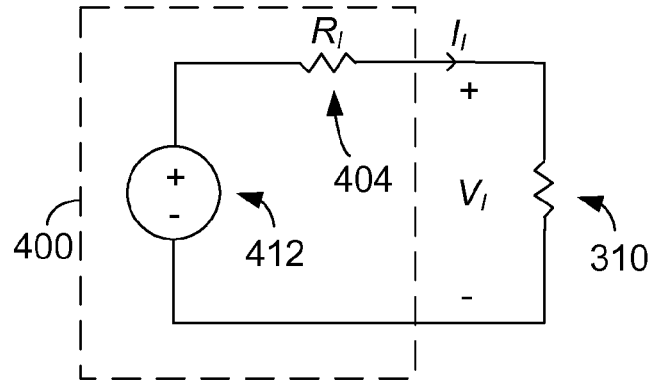

FIG. 4A shows a circuit with a current source 400 and a load resistor 310. The current source 400 is modeled by an ideal current source 402 (of constant current $I_0$) in parallel with a resistor 404 representing the output resistance of the current source 400. The current-voltage characteristic 406 for this current source 400 is shown in FIG. 4B, along with the load line for the load resistor 310. In this case, the large output resistance $R_I$ represented by the resistor 404 causes a sag 408 in the output current $I_I$ of the current source 400 as a function of output voltage $V_I$. The size of the sag 408 increases as the load resistance $R_L$ increases. This current source 400 can equivalently be modeled by an ideal voltage source 412 in series with the resistor 404, where the voltage $V_{EQ}$ of the equivalent ideal voltage source 412 is $V_{EQ}=I_0 R_I$ (FIG. 4C).

Figure 5A:
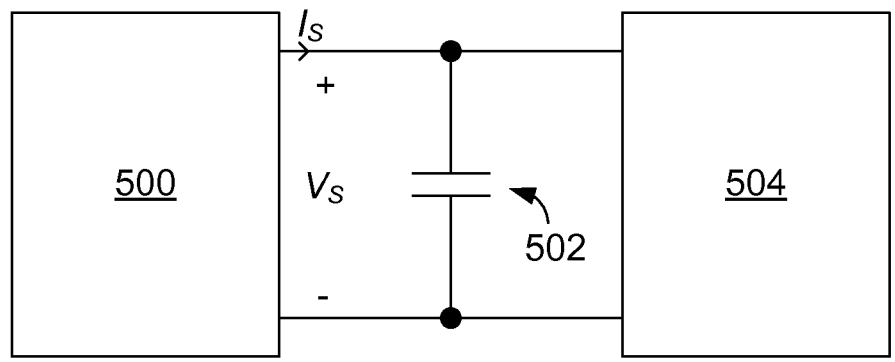
FIG. 5A and 6A are circuit diagrams of a power converter in parallel with a capacitor coupled to a load.
Figure 5B:
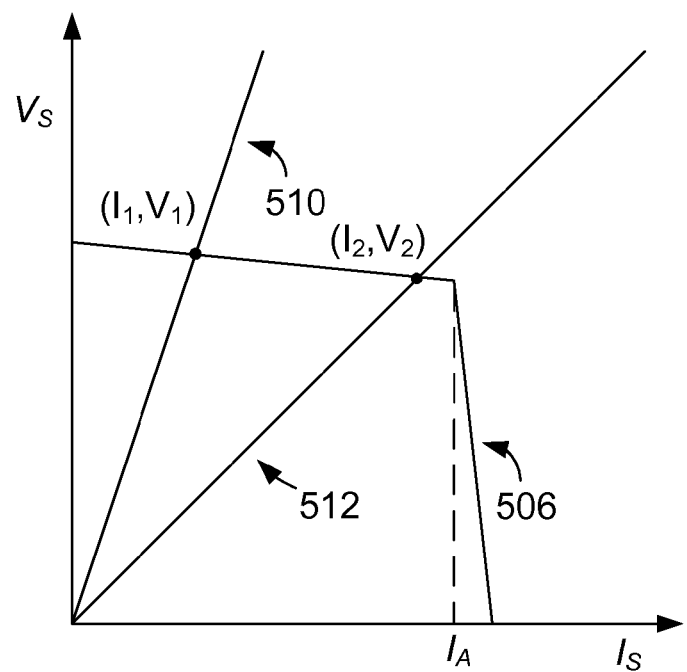
FIGS. 5B and 6B are current-voltage characteristics for the circuits of FIGS. 5A and 6A, respectively.
Figure 5C:
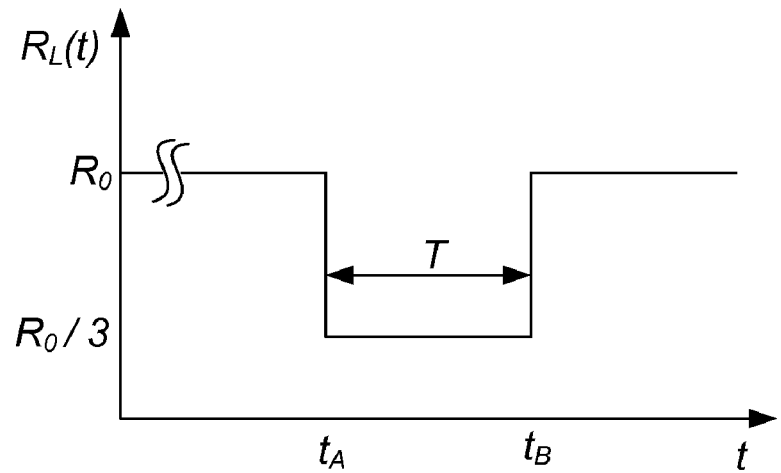
FIGS. 5C and 5D are time plots for circuit variables of the circuit of FIG. 5A.

FIG. 5A shows an example of a power converter 500 in parallel with a capacitor 502. The power converter and the capacitor cooperatively supply power to a variable load 504. In this example, the power converter 500 has a current-voltage characteristic 506 as shown in FIG. 5B. The power converter 500 has the characteristics of the voltage source 300 (e.g., has a low effective output resistance $R_V$) for output current $I_S$ values from 0 to $I_A$ and has the characteristics of the current source 400 (e.g., has a high effective output resistance $R_I$) for output current $I_S$ above $I_A$, limiting the current that can be supplied from the power converter 500. In one example, the variable load 504 temporarily demands more power by dropping an input resistance $R_L(t)$ from a value of $R_0$ (corresponding to a "nominal" load line 510) to a value of $R_0/3$ (corresponding to a "peak" load line 512) for a time period $T=t_A-t_B$, after which the resistance returns to the value $R_0$, as shown in the plot of FIG. 5C.

Figure 5D:
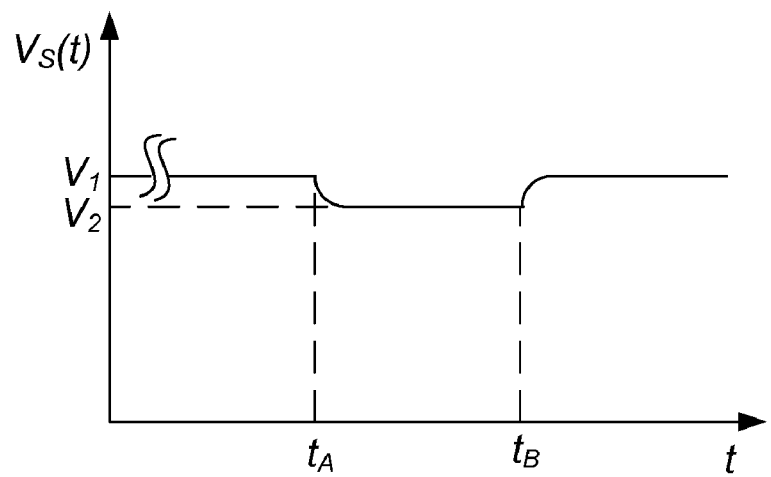

The nominal load line 510 intersects the current-voltage characteristic 506 at a current $I_1$ and a voltage $V_1$. The peak load line 512 intersects the current-voltage characteristic 506 at a current $I_2$ that is larger than $I_1$, and a voltage $V_2$ that is slightly lower than $V_1$. These intersections of the load lines with the current-voltage characteristic 506 give the asymptotic "DC solutions" for current and voltage after transients due to the capacitor 502 decay. The capacitor 502 provides continuity in the change of the capacitor voltage (equal to $V_S(t)$) over time. FIG. 5D shows the voltage $V_S(t)$ across the power converter 500, the capacitor 502, and the variable load 504 as a function of time. After the load resistance drops at time $t_A$, the voltage $V_S(t)$ drops exponentially from $t_A$ and $t_B$ according to:

$$V_S(t)=V_2+(V_1-V_2)\exp(-(t-t_A)/\tau_A),$$

where $\tau_A$ is the effective time constant associated with the capacitor 502 (with capacitance C), which in this example, is $$\tau_A = \left[\frac{1}{CR_V} + \frac{3}{CR_0}\right]^{-1} \approx CR_V$$

since the output resistance $R_V$ of the power converter 500 is much smaller than the input resistance $R_0/3$ of the variable load 504. After time $t_B$, the voltage $V_S(t)$ rises exponentially back to $V_1$ with the same time constant $\tau_A$. The values of other circuit variables between times $t_A$ and $t_B$, such as the capacitor current $I_C(t)$ and the load current $I_L(t)$, are determined from $V_S(t)$ as:

$$I_C(t) = C\frac{dV_S(t)}{dt} \text{ and } I_L(t) = 3\frac{V_S(t)}{R_0}.$$

In this example, the power supplied by the capacitor 502

$$\left(I_C(t)V_S(t) = C\frac{dV_S(t)}{dt}V_S(t)\right)$$

is limited since the capacitor does not discharge deeply when the variable load 504 demands more power. The change in voltage $V_S(t)$ only lasts for a small fraction of the time interval T, causing $$\frac{dV_S(t)}{dt}$$

and thus the power $I_C(t)V_S(t)$ supplied by the capacitor 502 to be limited. To cause the capacitor to discharge deeply (e.g., by more than about 20% and in some examples by more than about 50%) to supply more power to the variable load 504, the current limit can be lowered to correspond to the expected peak demand of the variable load 504 so that the power converter 500 provides a dual-mode capability, as described in the next example (FIGS. 6A-6D).

Figure 6A:
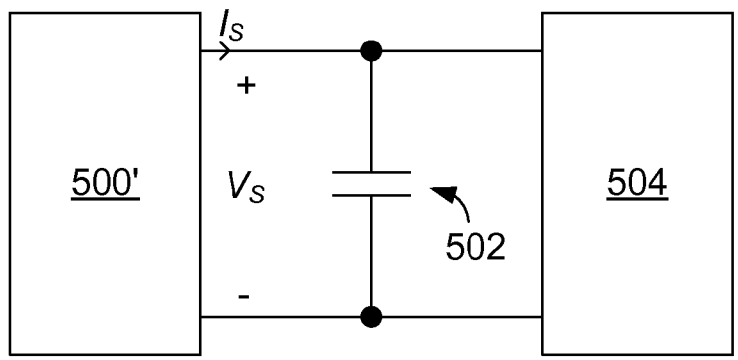
Figure 6B:
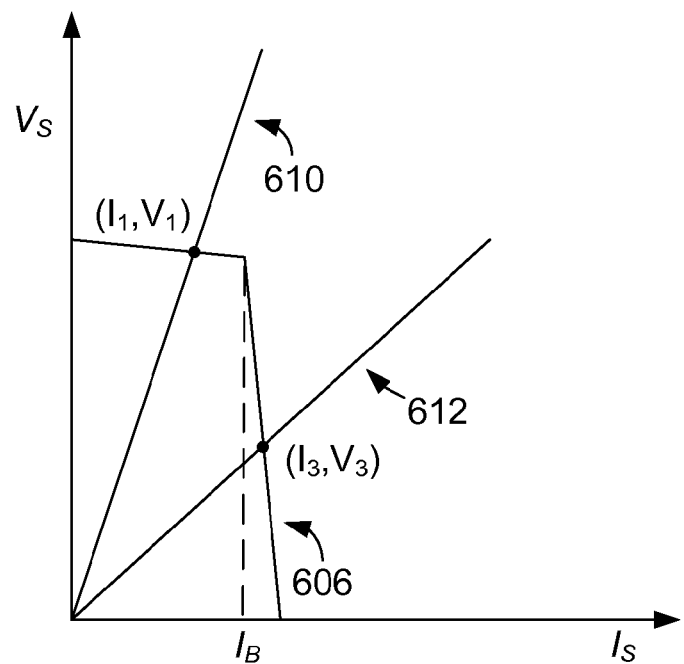

FIG. 6A shows an example of a power converter 500' in parallel with a capacitor 502 cooperatively supplying power to a variable load 504. In this example, the power converter 500' has a current-voltage characteristic 606 as shown in FIG. 6B. The power converter 500' has the characteristics of the voltage source 300 (e.g., has a low effective output resistance) for output current $I_S$ values from 0 to $I_B$ and has the characteristics of the current source 400 (e.g., has a high effective output resistance) for output current $I_S$ above $I_B$. Again, in one example, the variable load 504 temporarily demands more power by dropping an input resistance $R_L(t)$ from a value of $R_0$ (corresponding to a "nominal" load line 610) to a value of $R_0/3$ (corresponding to load line 612) over a time period T, after which the resistance returns to the value $R_0$, as shown in the plot of FIG. 5C.

Figure 6C:
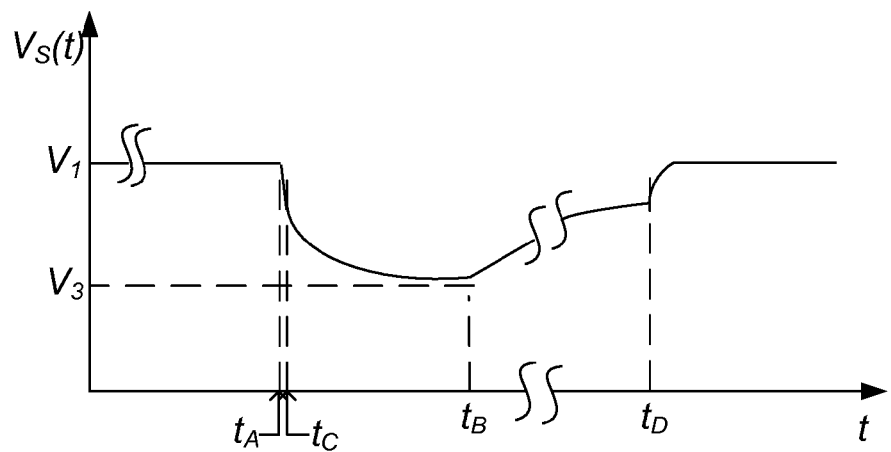
FIGS. 6C is a time plot for a circuit variable of the circuit of FIG. 6A.

The nominal load line 610 intersects the current-voltage characteristic 606 at a current $I_1$ and a voltage $V_1$, as in the previous example (FIG. 5B). However, in this example (FIG. 6B), the peak load line 612 intersects the current-voltage characteristic 606 at a current $I_3$ that is larger than $I_1$ but less than $I_2$ and a voltage $V_3$ that is substantially lower than $V_1$ and $V_2$. These intersections of the load lines with the current-voltage characteristic 606 also give the asymptotic DC solutions for current and voltage. FIG. 6C shows the voltage $V_S(t)$ across the power converter 500', the capacitor 502, and the variable load 504 as a function of time. After the load resistance drops at time $t_A$, the voltage $V_S(t)$ drops exponentially from $t_A$ and $t_C$ according to:

$$V_S(t)=V_2+(V_1-V_2)\exp(-(t-t_A)/\tau_A).$$

In this example, at $t_C$ the power converter 500' shifts from a "voltage source" (e.g., a low output resistance) mode to a "current source" (e.g., a high output resistance) mode. Accordingly, the voltage $V_S(t)$ drops exponentially from $t_C$ and $t_B$ according to:

$$V_S(t)=V_3+(V_S(t_C)-V_3)\exp(-(t-t_C)/\sigma_B).$$

where $\tau_B$ is the effective time constant associated with the capacitor 502 when the power converter 500 is in the current source mode $$\tau_B = \left[\frac{1}{CR_I} + \frac{3}{CR_0}\right]^{-1} \approx CR_0/3$$

since the output resistance $R_1$ of the power converter 500' in the current source mode is much larger than the input resistance $R_0/3$ of the variable load 504. Since $V_3$ is substantially lower than $V_1$, the capacitor 502 is able to discharge deeply (e.g., by about 50% in this example). After time $t_B$, the voltage $V_S(t)$ rises exponentially back to the voltage $V_S(t_C)$ at which the power converter 500' switches modes with the time constant $$\tau_C = \left[\frac{1}{CR_I} + \frac{1}{CR_0}\right]^{-1} \approx CR_0.$$

At a time $t_D$, the power converter 500' switches back to the voltage source mode. As in the previous example, the values of other circuit variables between times $t_A$ and $t_B$, such as the capacitor current $I_C(t)$ and the load current $I_L(t)$, are determined from $V_S(t)$ as:

$$I_C(t) = C\frac{dV_S(t)}{dt} \text{ and } I_L(t) = 3\frac{V_S(t)}{R_0}.$$

In this example, the power supplied by the capacitor $$502\left(I_C(t)V_S(t) = C\frac{dV_S(t)}{dt}V_S(t)\right)$$

is larger since the capacitor does discharge deeply when the variable load 504 demands more power. The change in voltage $V_S(t)$ lasts over the entire time interval T, causing $$\frac{dV_S(t)}{dt}$$

and thus the power $I_C(t)V_S(t)$ supplied by the capacitor 502 to be large enough to supply most of the additional power in a brief demand for more power by a variable load.

Figure 6D:
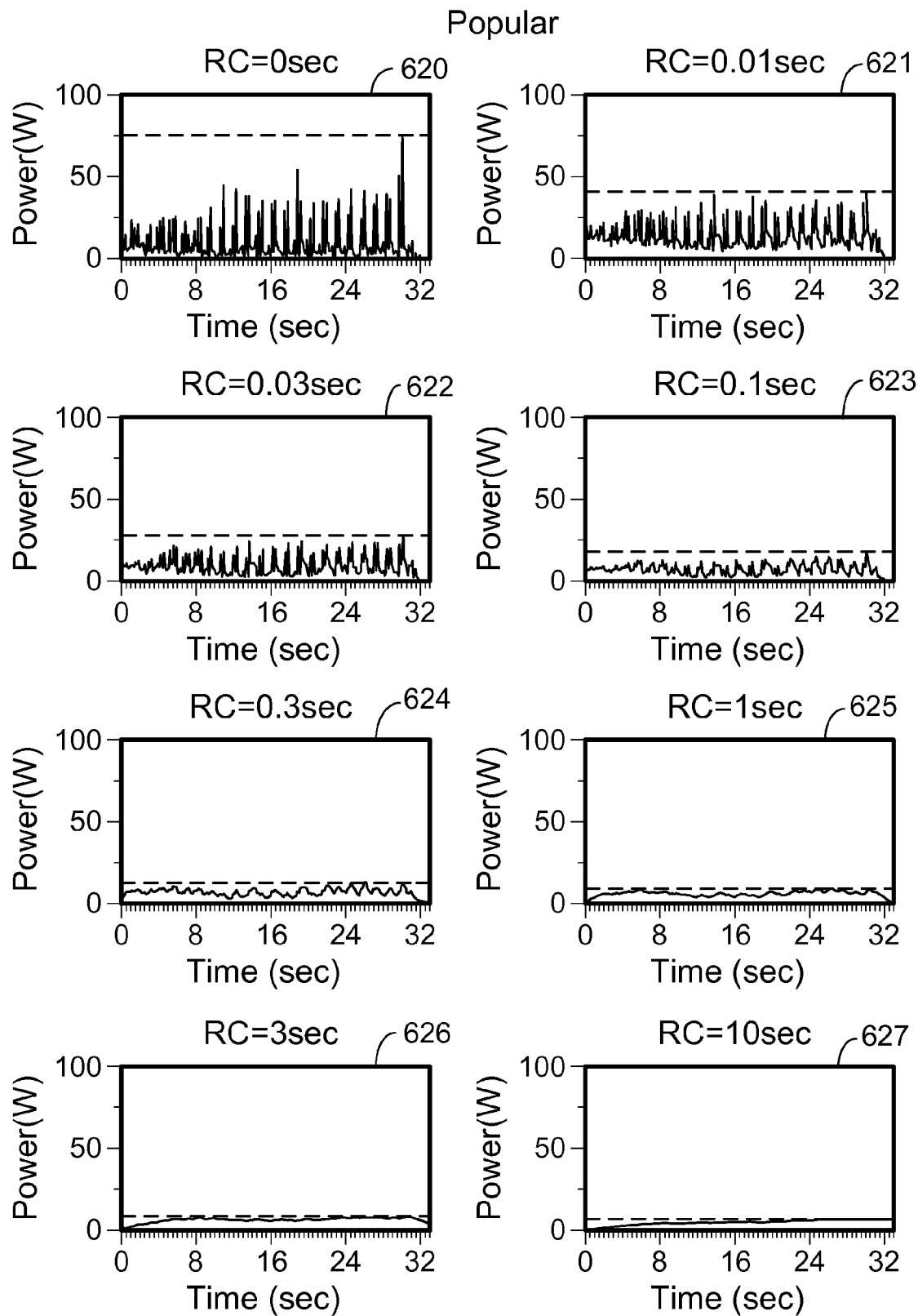
FIGS. 6D-6F are plots of power consumption dynamics for different types of music.
Figure 6E:
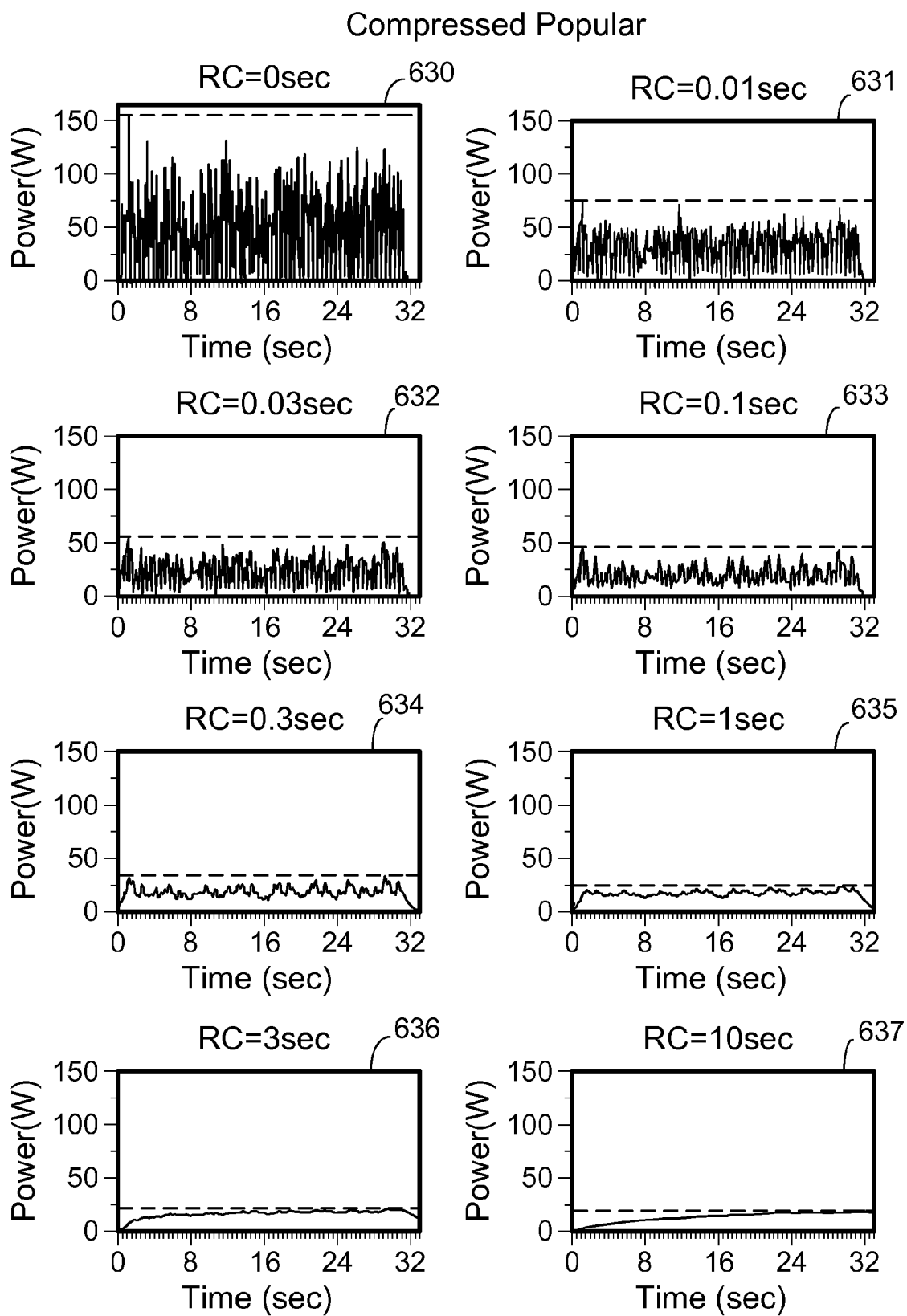
Figure 6F:
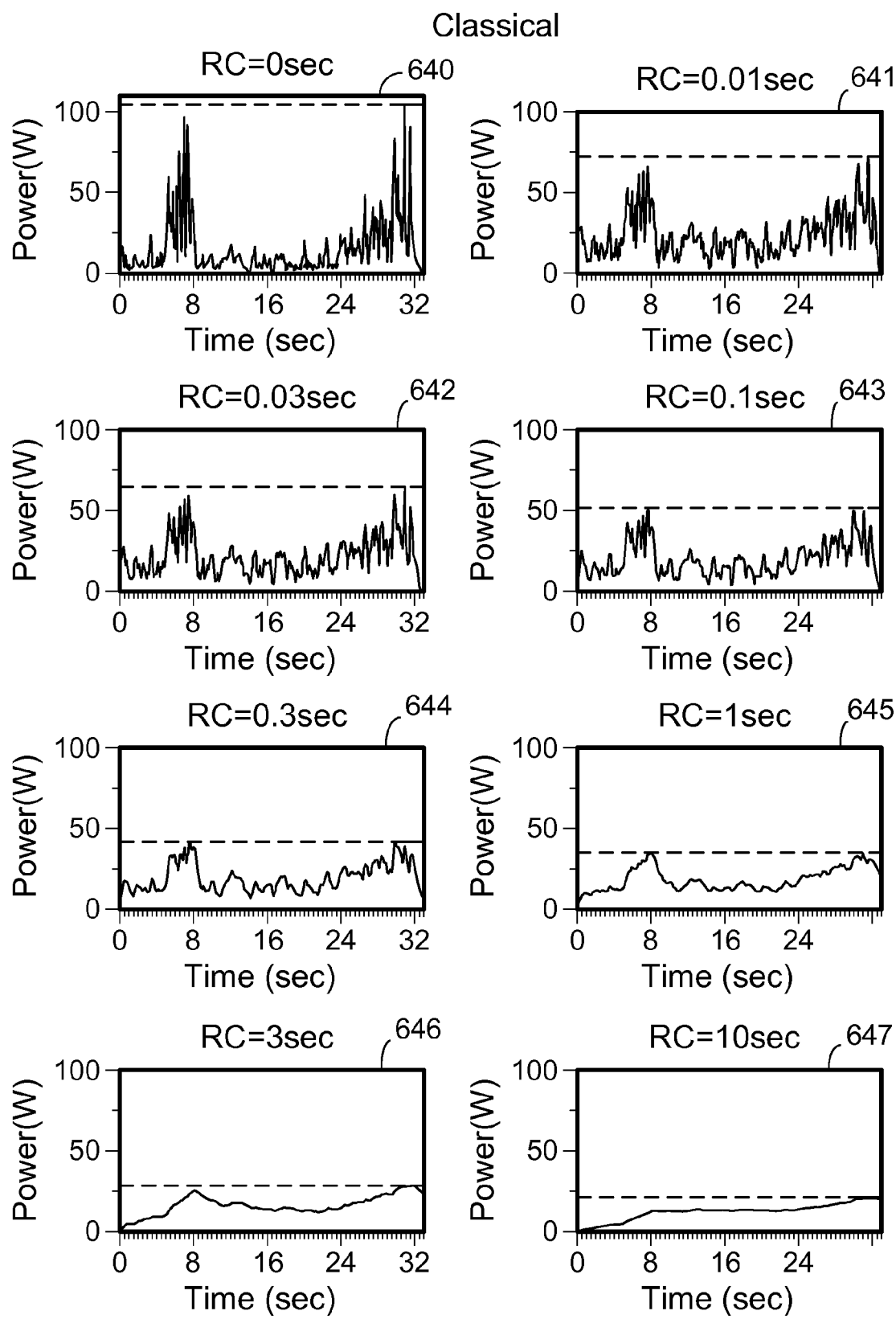

While the demand for more power in these examples is modeled as an instantaneous reduction of input resistance $R_L(t)$ for a time period T, a variable load such as an audio power amplifier may exhibit a continuous change in input resistance $R_L(t)$ with a more complex time dependency having changes that follow time scales present in a music signal (e.g., on the order of milliseconds or as high as tens of seconds) that represent a brief demand for a high peak power. Examples of power consumption dynamics for different types of music are shown in FIGS. 6D-6F. The plots shown in FIGS. 6D-6F are based on a simulated typical audio system, incorporating power converter control as described herein, playing exemplary music passages of different music types.

FIG. 6D shows plots 620-627 of residual power drawn from a power source to play an exemplary passage of uncompressed popular music (after the power converter causes some of the power to be supplied from a capacitive element) as a function of time for different values of the effective time constant T of the capacitive element during a peak power demand (e.g., $\tau=R_{Lp}C$ where C is the effective capacitance of the capacitive element 102 and $R_{Lp}$ is the resistance of the amplifier at peak power demand). In each plot, the vertical axis gives instantaneous residual power drawn from the power source in Watts, and the horizontal axis gives time in seconds. Each of the plots 620-627 corresponds to a different time constant labeled as "RC." The peak residual power for each plot is shown as a dotted line. In this example, peak residual power is progressively reduced from about 40 W (plot 621) to about 7 W (plot 627) when RC is increased from 0.01 seconds (plot 621) to 10 seconds (plot 627). For comparison, plot 620 shows the power without a capacitive element (or RC=0).

FIG. 6E shows similar plots 630-637 for an exemplary passage of compressed popular music. In this example, peak residual power is reduced from about 70 W (plot 631) to about 20 W (plot 637) when RC is increased from 0.01 seconds (plot 631) to 10 seconds (plot 637).

FIG. 6F shows similar plots 640-647 for an exemplary passage of classical music. In this example, peak residual power is reduced from about 67 W (plot 641) to about 20 W (plot 647) when RC is increased from 0.01 seconds (plot 641) to 10 seconds (plot 647).

These plots in FIGS. 6D-6F demonstrate the difference in power dynamics of various types of music: the uncompressed popular music passage has a lot of strong spikes of a relatively short duration (e.g., about 1-100 ms), the compressed popular music passage has on average about a 12 dB lower peak-to-average (PTA) power ratio (or "crest factor"), while the classical music passage exhibits periods of very loud passages which may last, for example, for many seconds or tens of seconds.

Figure 7A:
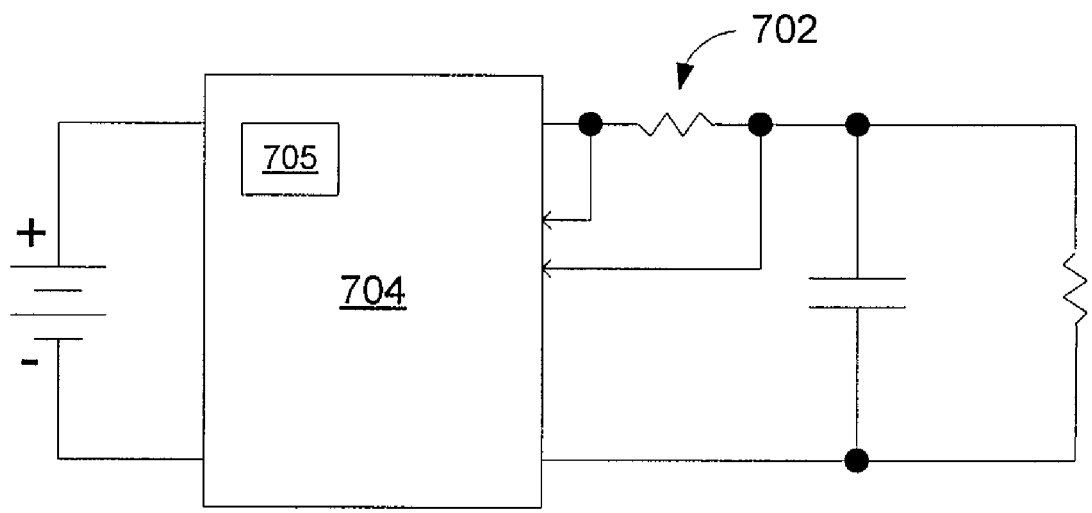
FIGS. 7A-7D are circuit diagrams showing different sensing techniques.
Figure 7B:
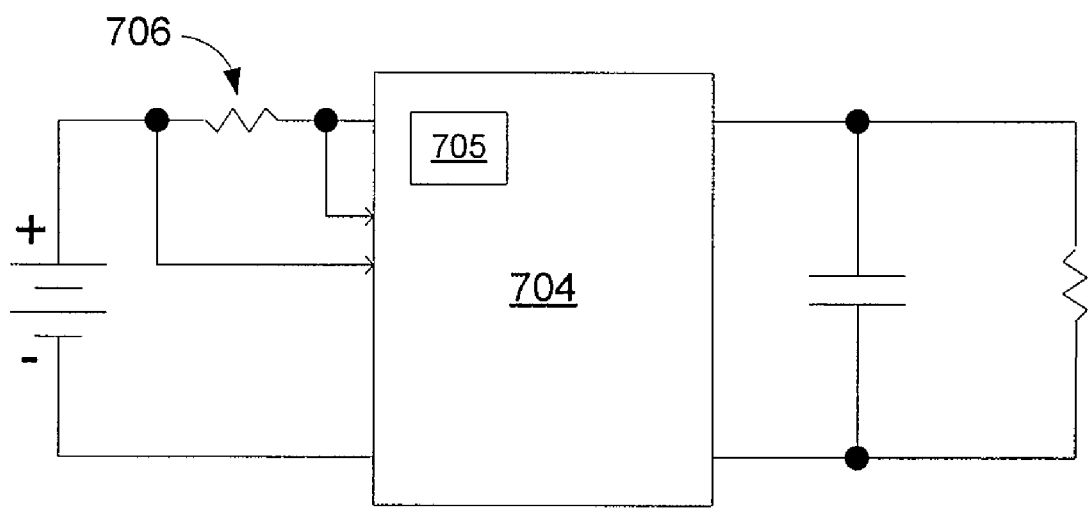
Figure 7C:
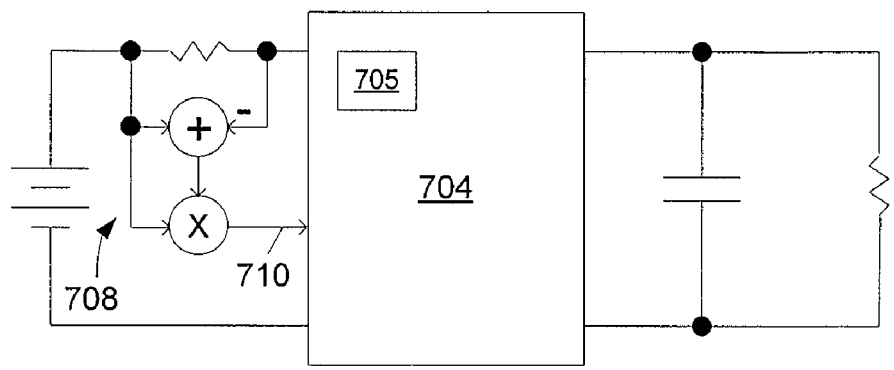

As shown in FIGS. 7A-7C, the DC-DC power converter 200A (FIG. 2A) can use any of a variety of parameters to implement the dual-mode capabilities described above. For example, the circuit in FIG. 7A includes a resistor 702 for sensing the output current of a switching power supply 704. The voltage across the resistor 702 is fed back to the switching power supply 704 and used to control the output voltage according to a desired current-voltage characteristic. In another example, the circuit in FIG. 7B includes a resistor 706 for sensing the input current of the switching power supply 704 for achieving a desired current-voltage characteristic. In another example, the circuit in FIG. 7C includes circuitry 708 for sensing the input power of the switching power supply 704. The circuitry 708 generates a voltage 710 that is the product of the input voltage and a voltage proportional to the input current, and is therefore proportional to the input power.

When the input power is below a threshold power level the power supply 704 operates according to a current-voltage characteristic of a first mode, and when the input power is above the threshold power level the power supply 704 operates according to a current-voltage characteristic of a second mode. Other parameters can be used to control the current-voltage characteristic of the switching power supply 704. The power supply 704 includes a control module 705 to switch modes based on the sensed parameter. One possible implementation of such a control module is described in more detail below (e.g., control module 814 in FIG. 8).

In order to achieve high system efficiency, there should be negligible loss in the power converter 200A. The switching power supply 704 can use any of a variety of low-loss conversion techniques (e.g., a boost converter, a buck converter, a flyback converter, or a single-ended primary inductance converter).

Figure 7D:
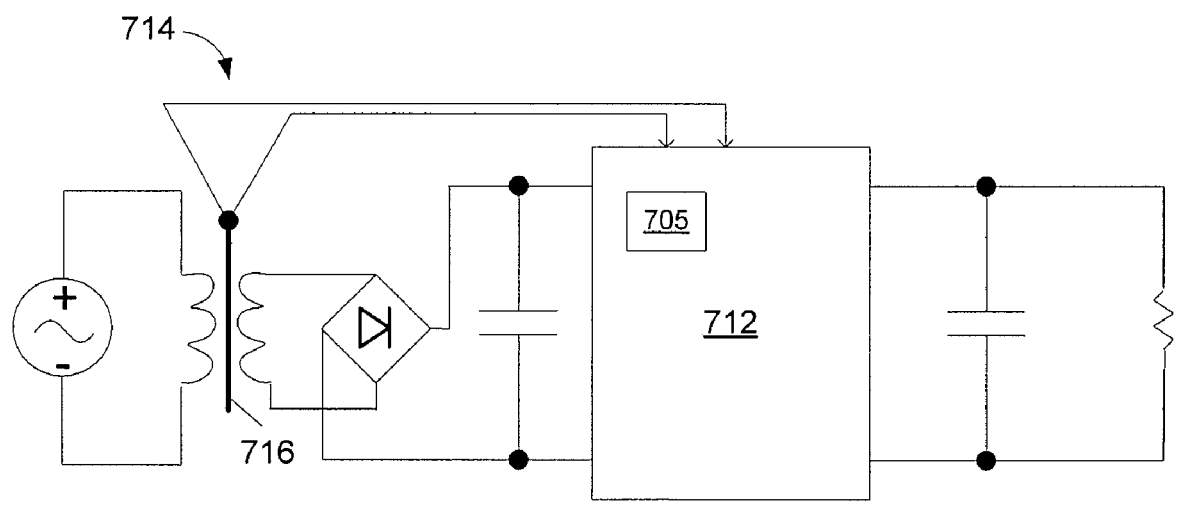

Similarly, the AC-DC power converter 200B (FIG. 2B) can use any of a variety of parameters to implement the dual-mode capabilities described above. The AC-DC power converter 200B can use techniques similar to those described above. Alternatively, as shown in FIG. 7D, an AC-DC converter 712 includes circuitry 714 for sensing the temperature of the AC transformer core 716. The AC-DC converter 712 switches between different current-voltage characteristics (i.e., different modes) based on comparing the sensed temperature to a threshold temperature. In some implementations temperature may optionally be used in conjunction with other control parameters (e.g., output current, input power, input current, etc.). In some implementations temperature modifies the current-voltage characteristic (e.g., by making $I_B$ a function of temperature). Other parameters can be used to control the current-voltage characteristic of the switching converter 712. The converter 712 also includes a control module 705 to switch modes based on the sensed parameter.

In some implementations, the trigger condition that causes the control module 705 to switch modes is programmable (e.g., by programming the trigger condition into a microprocessor). For example, the converter 712 senses various circuit parameters (e.g., input power, output current, temperature, etc.) and the circuit parameter that is used by the control module 705 to switch modes is programmable. Alternatively, the value of a circuit parameter that triggers a change in modes can be programmable.

Figure 8:
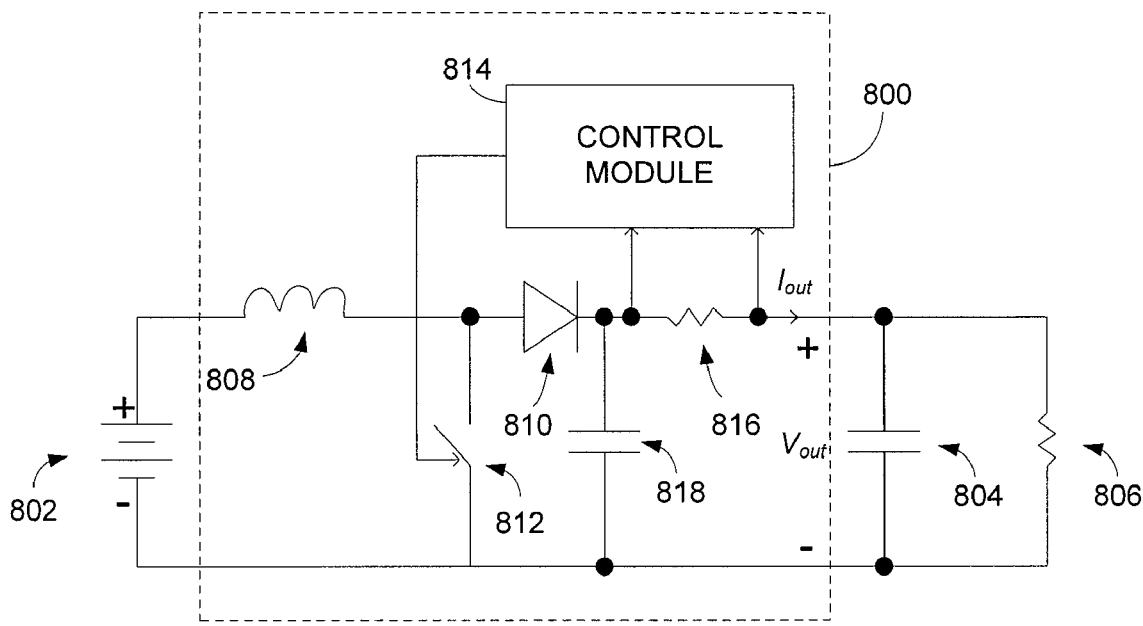
FIG. 8 is a circuit diagram for an implementation of the sensing technique of FIG. 7A.

FIG. 8 shows a Boost type power converter circuit 800 implementing the sensing technique of FIG. 7A. The input of the circuit 800 is connected to a battery 802 with voltage $V_B$ and the output of the circuit 800 is coupled to a capacitor 804 in parallel with a variable load 806. The circuit 800 includes an inductor 808, a diode 810, and a switch 812 that is controlled by a control module 814 based on the output current $I_{out}(t)$ in a sensing resistor 816. The circuit 800 also includes a capacitor 818 with a relatively small capacitance to filter out much of the switching frequency, and reduce ripple on the output voltage. In some implementations, the control module 814 includes a microprocessor for controlling the switch operation as a function of sensed output current. The resistance $R_S$ of the sensing resistor 816 is small compared to the load resistance $R_L(t)$.

Figure 9:
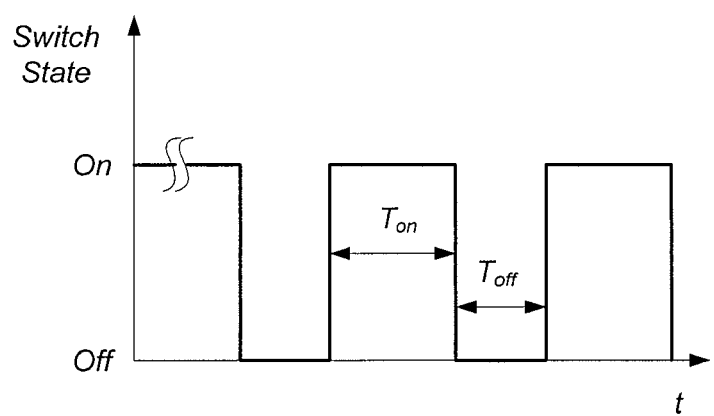
FIG. 9 is a plot of a converter switch operation as a function of time.

Since the circuit 800 is a Boost type, the output voltage $V_{out}(t)$ is higher than the constant input voltage $V_B$. The output voltage is determined by the duty cycle D of the opening and closing of the switch 812. As shown in FIG. 9, the switch 812 is closed for a time $T_{on}$ and open for a time $T_{off}$, so the duty cycle is $D=T_{on}/(T_{on}+T_{off})$. The output voltage $V_{out}(t)$ in steady-state conditions (and neglecting losses in the inductor 808 and the diode 810) is:

$$V_{out}(t) = V_B/(1-D). \quad (1)$$

When the control module 814 senses an output current $I_{out}(t)$ less than a threshold current $I_{th}$, the control module 814 sets the circuit 800 to a voltage source mode. In the voltage source mode, the target output voltage is approximately constant $V_{out}(t)=V_0$. To generate this voltage, the control module 814 sets the duty cycle D to:

$$D=D_0=1-V_B/V_0. \quad (2)$$

When the control module 814 senses an output current $I_{out}(t)$ greater than the threshold current $I_{th}$, the control module 814 sets the circuit 800 to a current source mode. In the current source mode the, the target output voltage varies with output current according to a target current-voltage characteristic:

$$V_{out}(t)=V_0-(I_{out}(t)-I_{th})R_{out}, \quad (3)$$

where $R_{out}$ is a simulated output resistance parameter for the circuit 800 that is controlled by the control module 814. To implement a high output impedance source, the control module 814 selects a large value of $R_{out}$ (e.g., $R_{out} \gg R_L(t)$). The value of $R_{out}$ may be constant, or alternatively, the value of $R_{out}$ may vary with sensed output current $I_{out}(t)$. Equations (1)-(3) yield the following value of duty cycle D that the control module 814 uses to control the switch 812 in response to the sensed output current $I_{out}(t)$ in the current source mode:

$$D = D_0 + \frac{1-D_0}{1-V_B/[(I_{out}(t)-I_{th})R_{out}(1-D_0)]} \quad (4)$$

A control module using other control parameters can be implemented in a similar way. For example, the duty cycle of a Boost type or other type of switching power converter can be a function of input power when the input power crosses a threshold value.

Figure 10A:
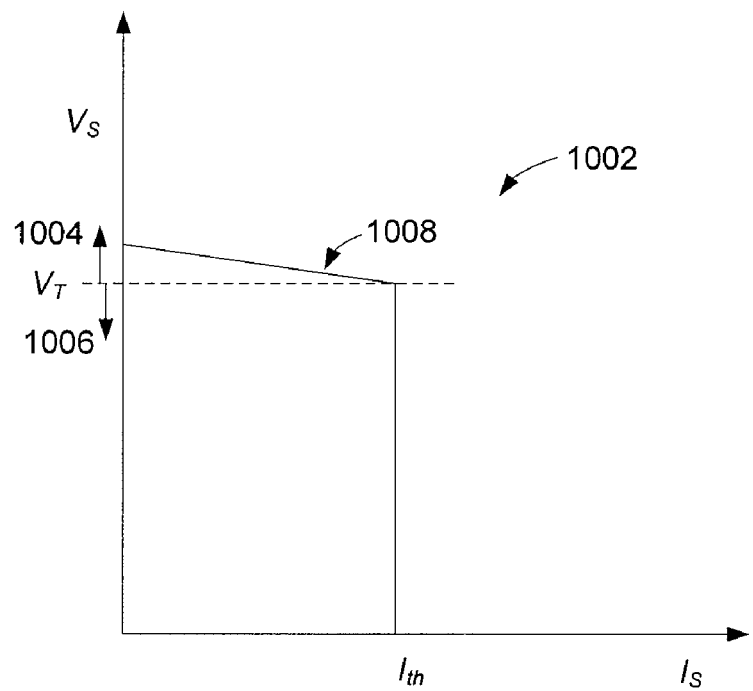
FIGS. 10A and 10B are exemplary current-voltage characteristics.
Figure 10B:
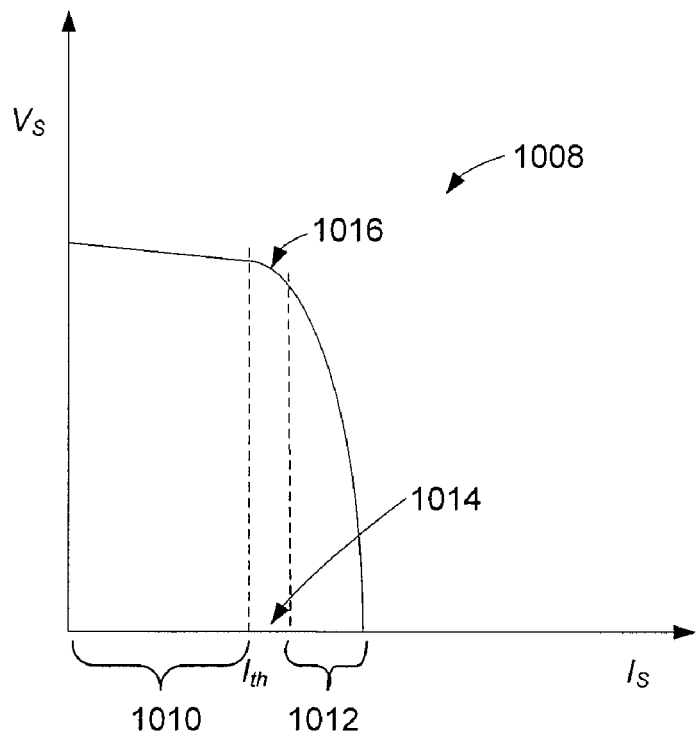

FIGS. 10A and 10B show exemplary current-voltage characteristics for a power converter that can be used to cause a capacitive element to discharge deeply to supply more power to a variable load. In FIG. 10A, the characteristic 1002 has a first mode 1004 characterized by a shallow slope of the voltage versus current plot, and a second mode 1006 in which the current $I_S$ is limited to a maximum current $I_{th}$ for voltages $V_S$ below a transition voltage $V_T$. For example, in the implementation of FIG. 8, the first mode 1004 may be achieved by setting $R_{out}$ in Equation (4) to small value for $I_S$ values less than $I_{th}$, and the second mode 1006 may be achieved by setting $R_{out}$ in Equation (4) to a large value for $I_S$ values equal to or greater than $I_{th}$.

In FIG. 10B, the characteristic 1008 has a first mode 1010 characterized by a shallow slope of the voltage versus current plot, and a second mode 1012 characterized by a steep slope of the voltage versus current plot. Between the first and second modes, the characteristic 1008 has a "transition zone" 1014 that has a "knee" 1016 in the voltage versus current plot. For example, in the implementation of FIG. 8, the first mode 1010 may be achieved by setting $R_{out}$ in Equation (4) to a small value for $I_S$ values less than $I_{th}$. The transition zone 1014 and second mode 1012 may be achieved by setting $R_{out}$ in Equation (4) to an increasing value as a function of $I_S$ for $I_S$ values equal to or greater than $I_{th}$. In one implementation, the value of D in Equation (4) can be controlled using a programmable device (e.g., a microprocessor). In this implementation, the value of $R_{out}$ in Equation (4) can be controlled (as a function of $I_S$) in software, for example, using a look-up table or a polynomial curve fit.

Other features of a current-voltage characteristic can be controlled in various implementations. For example, the transition between modes and the slope of the voltage versus current plot can be selected to ensure a minimum operating voltage (e.g., for an audio amplifier) is maintained for a given peak demand (e.g., minimum load resistance). The transition between modes can optionally be tunable.

Figure 10C:
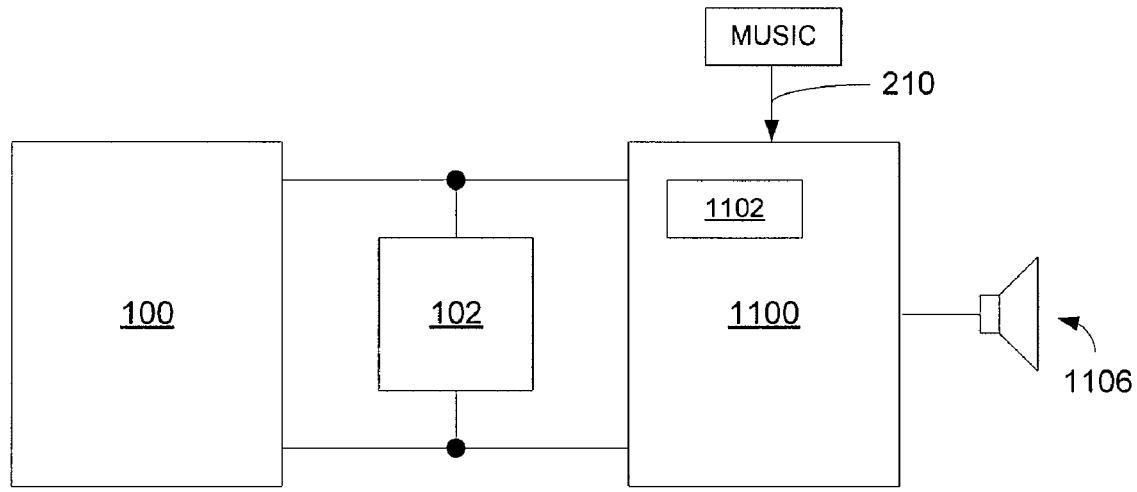
FIGS. 10C and 10D are examples including an audio amplifier with gain that depends on the power converter behavior.
Figure 10D:
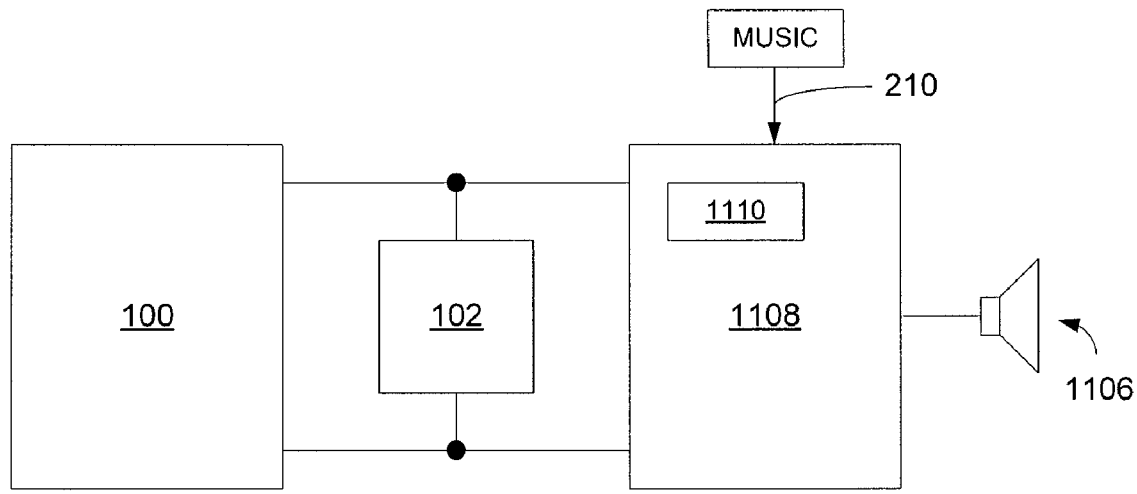

For a power converter that supplies power to an audio amplifier (e.g., power converter 200A or 200B), features of the audio amplifier can be dependent on the power converter behavior. For example, when the voltage supplied by the power converter drops (e.g., after switching to the current supply mode) the gain of the audio amplifier can be reduced to avoid distortion in the music signal 210 at the amplifier or speaker (e.g., due to signal clipping). In one implementation, shown in FIG. 10C, an audio amplifier 1100 includes a compressor 1102 with a threshold that scales with the voltage supplied by the power converter 100 and capacitive element 102. This variable-threshold compressor 1102 reduces distortion of music played over a speaker 1106. In another implementation, shown in FIG. 10D, an audio amplifier 1108 includes a variable gain circuit 1110 that reduces the gain as the voltage $V_S(t)$ supplied by the power converter 100 and capacitive element 102 reduces, according to a predetermined function. These or other techniques (e.g., a system with any kind of wide-band or multi-band amplitude compressor) can be used to reduce the likelihood of signal clipping at any power converter voltage above a given minimum operating voltage. A compressor could operate based on the voltage supplied by the power converter and capacitor, or on other parameters such as power transformer temperature, loudspeaker temperature, loudspeaker displacement, or any other parameter indicative of an amplified signal level.

By causing some of an increased demand for power to be supplied from a capacitive element, the residual peak power demanded from a source is reduced. The amount of reduction in residual peak power demand depends on the effective time constant τ and on the type of music that is being amplified. One characteristic of the music that affects the reduction in residual peak power demand is the PTA power ratio. Music with a high PTA power ratio (e.g., uncompressed popular music) is more affected by the integrating effect of a large time constant than music with a low PTA power ratio (e.g., broadcast AM music).

Figure 11:
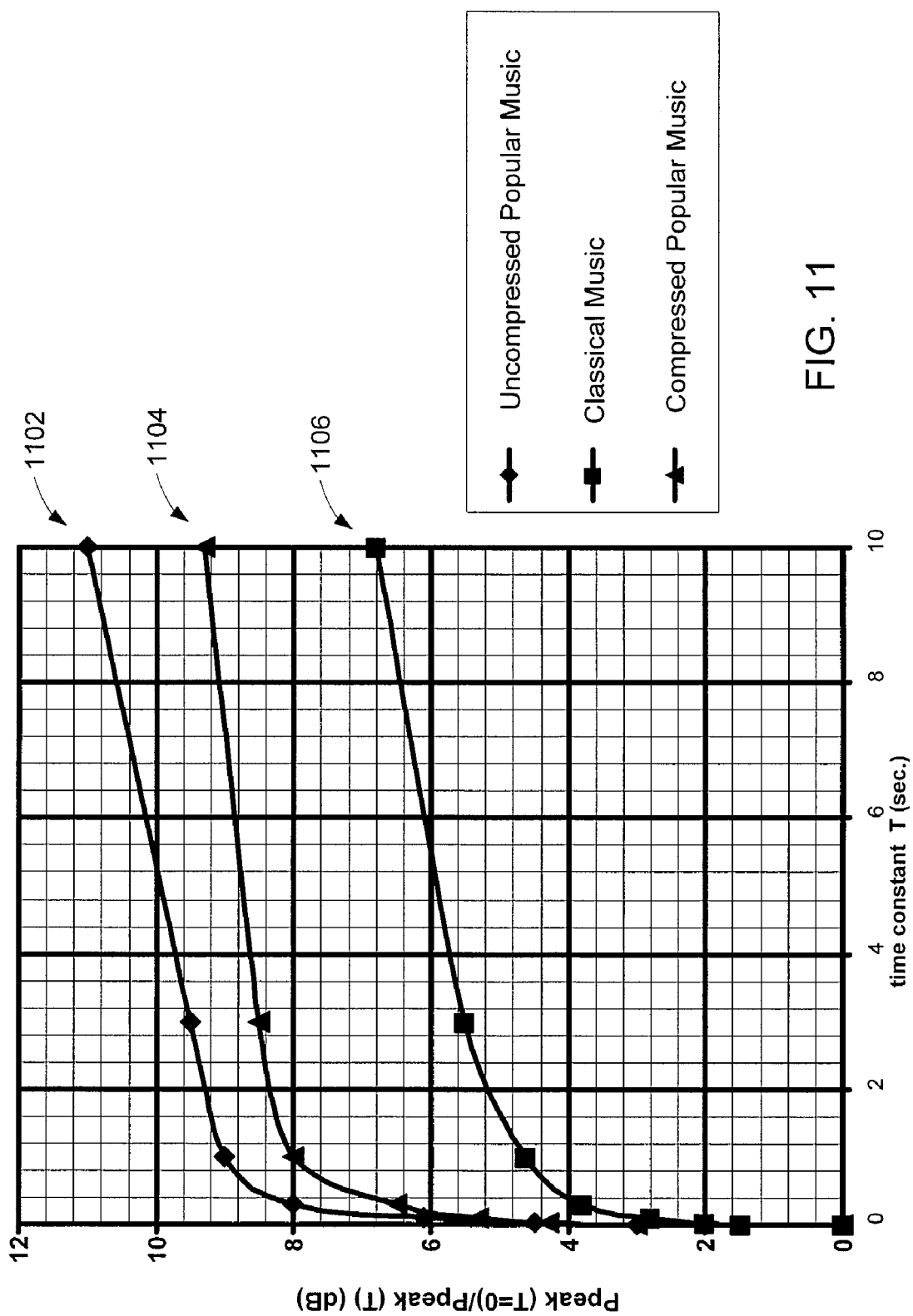
FIG. 11 is a plot of reduction in peak power demand versus effective time constant for different types of music.

FIG. 11 shows semi-log plots of the reduction R in peak power demand due to the capacitive element (in dB) versus the effective time constant τ (in seconds) for three different types of music: uncompressed popular music (plot 1102), compressed popular music (plot 1104), and classical music (plot 1106). The reduction in peak power demand R is quantified as the ratio between peak power for a power converter having a time constant of zero to peak power for a power converter having the given effective time constant τ, $R=P_{peak}(\tau=0)/P_{peak}(\tau)$. These empirically derived plots demonstrate that the uncompressed popular music used in this example, due to its high PTA power ratio and relatively short duration of the amplitude spikes is the most affected by effective time constant τ of the power converter. For example, for τ~5.5 seconds (FIG. 11, plot 1102), the reduction of the residual peak power demand is 10 dB (or 10 times).

On another end—compressed popular music (e.g., FM or AM broadcast type) has a much lower PTA power ratio (in order to sound louder on average), so the effects of the effective time constant τ are less pronounced. For example, for the same time constant τ~5.5 seconds (FIG. 11, plot 1104) the reduction of the residual peak power demand is 8.7 dB (or 7.5 times).

Classical music typically has PTA power ratio in between that of compressed and uncompressed popular music, but much longer duration of the amplitude spikes. Therefore, the classical music used in this example is affected by the effective time constant of the power supply the least. For example, for the same time constant τ~5.5 sec (FIG. 11, plot 1106) the reduction of the residual peak power demand is only 6 dB (or 4 times).

Another way to look at FIG. 11 is that a system having a power source with limited power capabilities is able to play louder by using a capacitive element to provide some of the peak power demand. From the example above for uncompressed popular music with τ~5.5 seconds, the available peak power for playing the music will be 10 dB higher from a system that causes peak power to be supplied from a capacitive element than from a system that does not.

Figure 12:
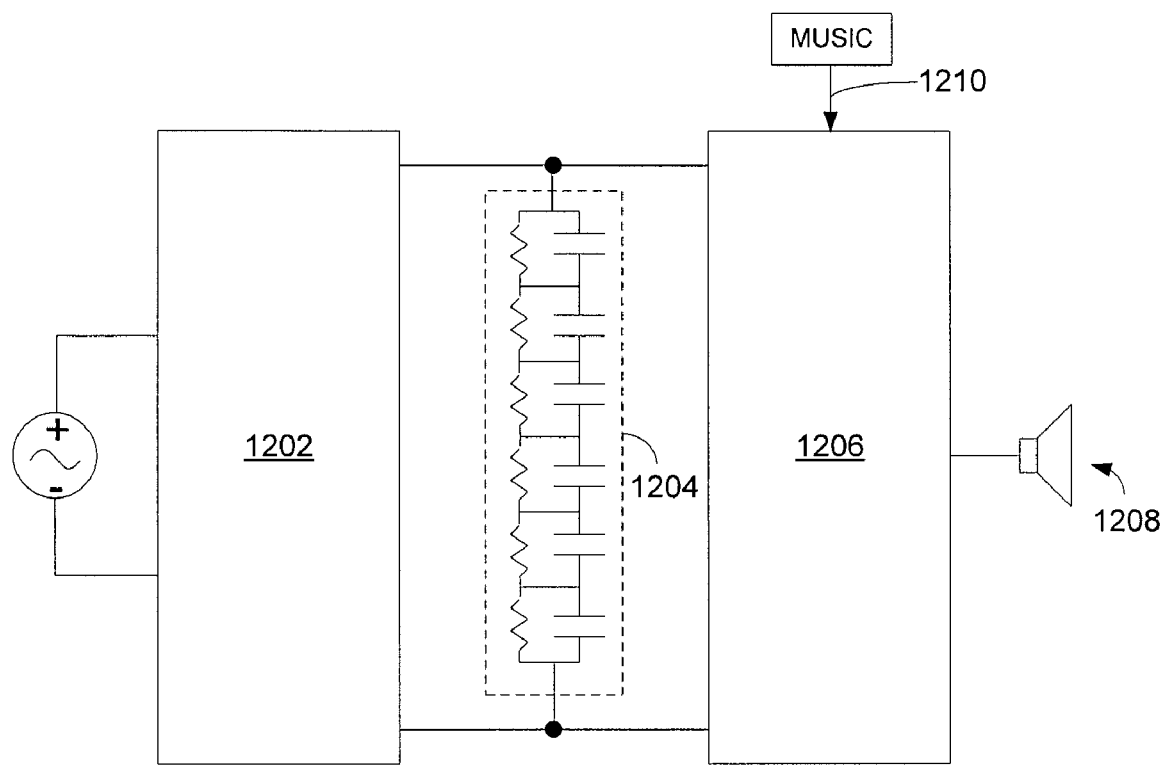
FIGS. 12-14 are circuit diagrams for implementations of a power converter in parallel with a capacitive element coupled to an audio amplifier.

In one implementation shown in FIG. 12, a power supply 1202 (a Hewlett Packard model 6253A DC power supply) powered from an AC mains is connected in parallel with a capacitive element 1204 consisting of six 33 F/2.5 V aerogel super capacitors in series, each capacitor having a 5.1 kΩ shunt resistor, providing a total capacitance of 5.5 F and a maximum voltage of 15 V. The power supply 1202 and capacitive element 1204 power a switching audio amplifier 1206 (a Bose 100 W switching audio amplifier, Bose Corporation) driving a speaker 1208. A music signal 1210 is input into amplifier 1206. When the power supply 1202 had an output current limit set to approximately 3.2 A and a nominal output voltage (i.e., with no load) set to 15 V (for a maximum output power of 48 W), the power supply 1202 and capacitive element 1204 together provided a peak power of 98.7 W to the amplifier 1206 with the output voltage staying above 9 V for all music tested.

Figure 13:
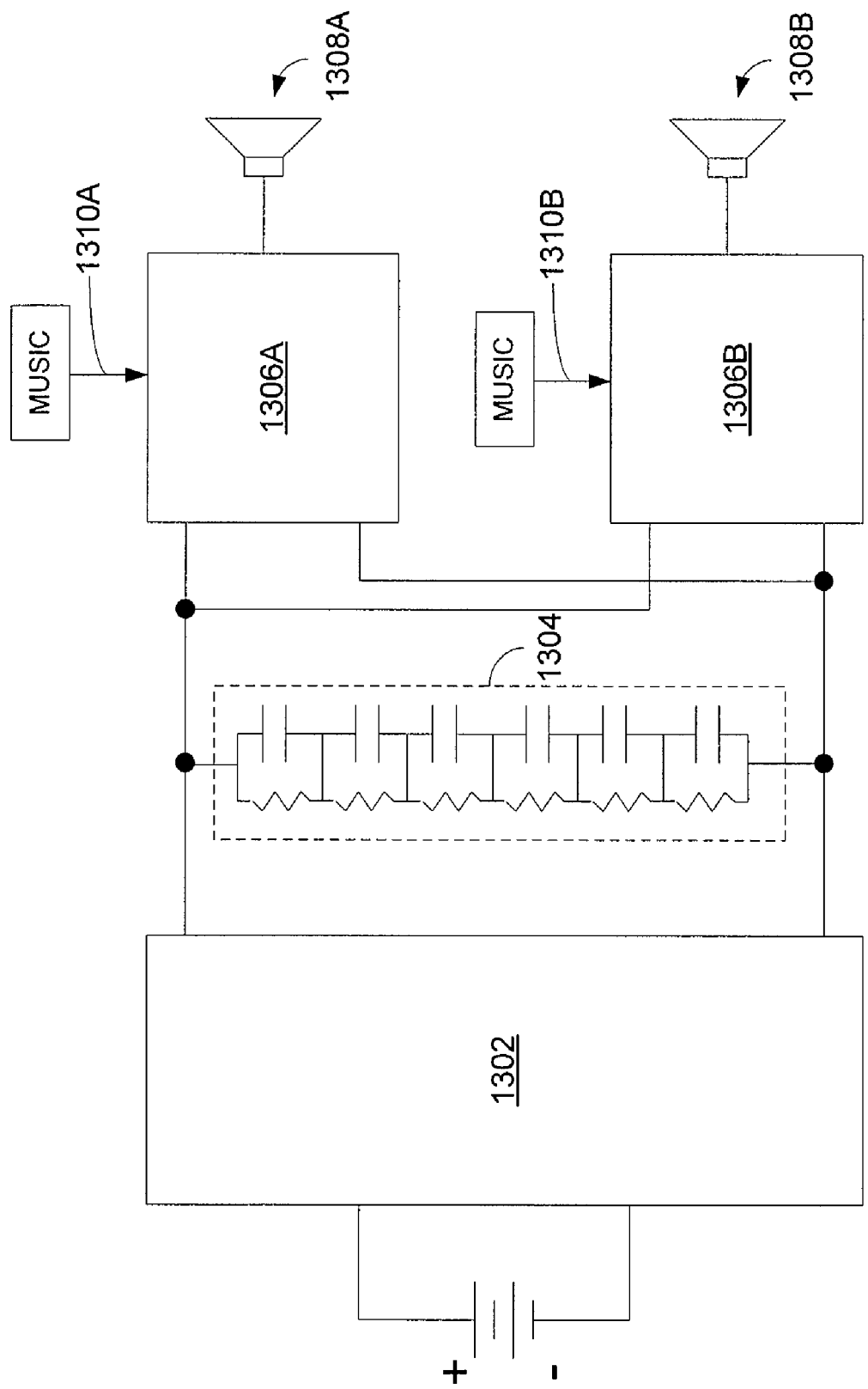

In another implementation shown in FIG. 13, a power supply 1302 (a DC-DC boost converter based on a Linear Technology model LTC1624 switching regulator controller) powered from six 1.2 V batteries (providing 7.2 V total input voltage) is connected in parallel with a capacitive element 1304 consisting of six 10 F/2.5 V aerogel super capacitors in series, each capacitor having a 5.1 kΩ shunt resistor, providing a total capacitance of 1.67 F and a maximum voltage of 15 V. The power supply 1302 and capacitive element 1304 power a pair of audio amplifiers 1306A and 1306B each driving a speaker 1308A and 1308B, respectively. Music signals 1310A and 1310B input into amplifiers 1306A and 1306B, respectively. When the power supply 1302 had an output current limit set to approximately 0.6 A and a nominal output voltage set to 14 V (for a maximum output power of 8.4 W), the power supply 1302 and capacitive element 1304 together provided a peak power of 25.2 W to the amplifiers 1306A and 1306B with the output voltage staying above 9.5 V for all music tested.

Figure 14:
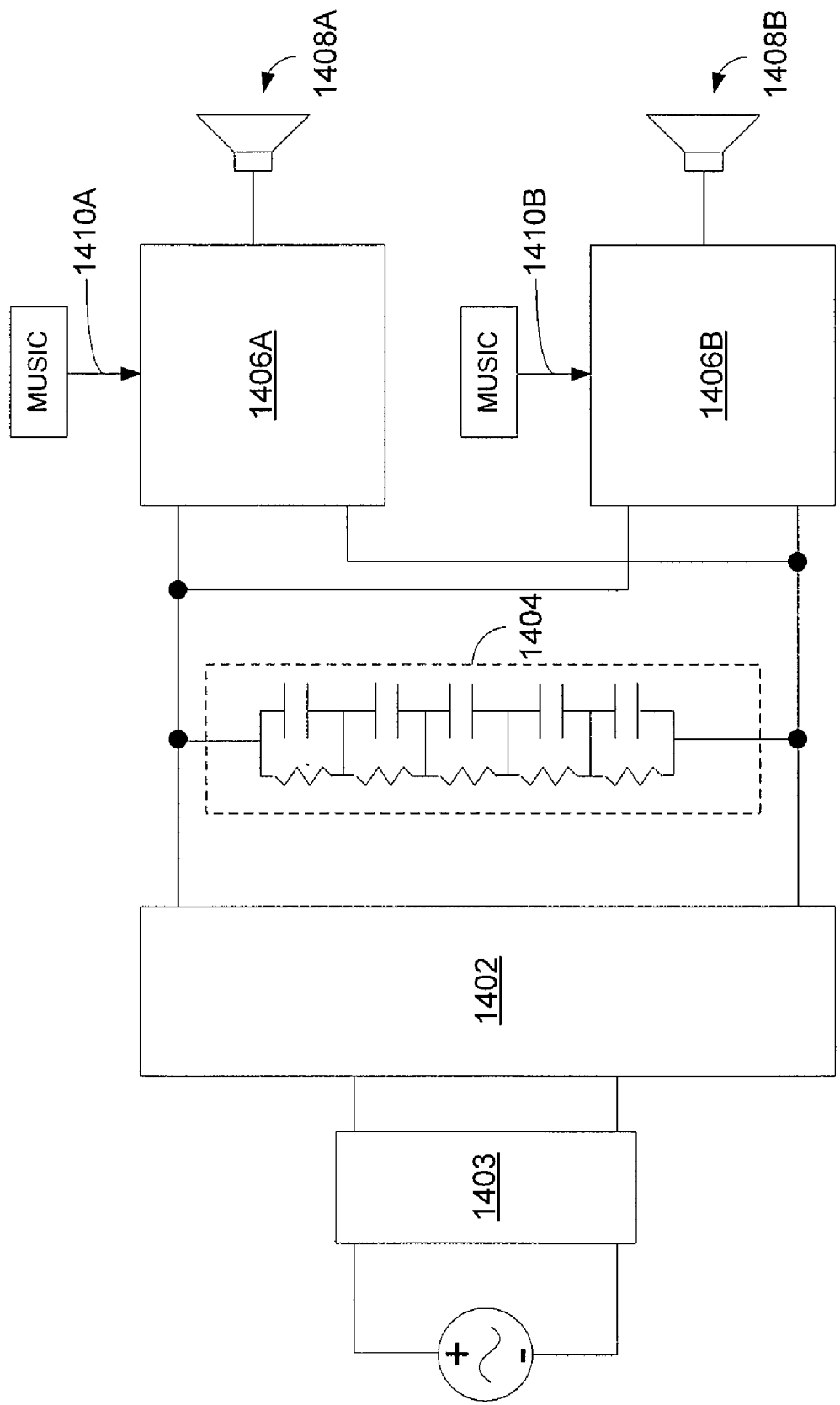

In another implementation shown in FIG. 14, a power supply 1402 (a DC-DC buck converter based on a Linear Technology model LTC1624 switching regulator controller) powered from an AC mains via an AC-DC converter 1403 (an Apple Computer 12 V/1 A wall pack) is connected in parallel with a capacitive element 1404 consisting of five 4 F/2.5 V aerogel super capacitors in series, each capacitor having a 20 kΩ shunt resistor, providing a total capacitance of 0.8 F and a maximum voltage of 12.5 V. The power supply 1402 and capacitive element 1404 power a pair of audio amplifiers 1406A and 1406B each driving a speaker 1408A and 1408B, respectively. Music signals 1410A and 1410B input into amplifiers 1406A and 1406B, respectively. When the power supply 1402 had an input current limit set to approximately 0.8 A and a nominal output voltage set to 12 V (for a maximum input power of 9.6 W), the power supply 1402 and capacitive element 1404 together provided a peak power of 25 W to the amplifiers 1406A and 1406B with the output voltage staying above the minimum operating voltage for all music tested.

FIGS. 15*a*-15*d* depict circuits 2100-2400, respectively, in which a power source is in series with a capacitor to supply power to a load with a voltage that is the sum of the voltages output by the power source and the capacitor. In each of the circuits 2100-2400, a power converter selectively either charges the capacitor or cooperates with the capacitor to limit the current drawn from the power source, depending on how much current the load attempts to draw from the combination of the power source and the capacitor. In each of the circuits 2100-2400, the power source may be a battery, a power source providing DC output from an AC main, a power feed provided from an external device (e.g., cabling conveying power in additional to digital serial communications from an electronic device such as a computer), or any of a variety of other types of power source. Also, the capacitor may be any of a variety of types of capacitive element, including a super capacitor or ultra capacitor. Further, although the power converter is preferably a buck converter, those skilled in the art will readily understand that other types of power converter may be used. Although circuit 2100 will now be described in detail, the operation of each of these circuits 2100-2400 is substantially similar. However, in some embodiments, the manner in which the anodes, cathodes and terminals of the power source, capacitor and power converter are coupled in the circuit 2100 may be preferred due to its efficiency in comparison to the configurations depicted in the circuits 2200-2400.

Figure 15A:
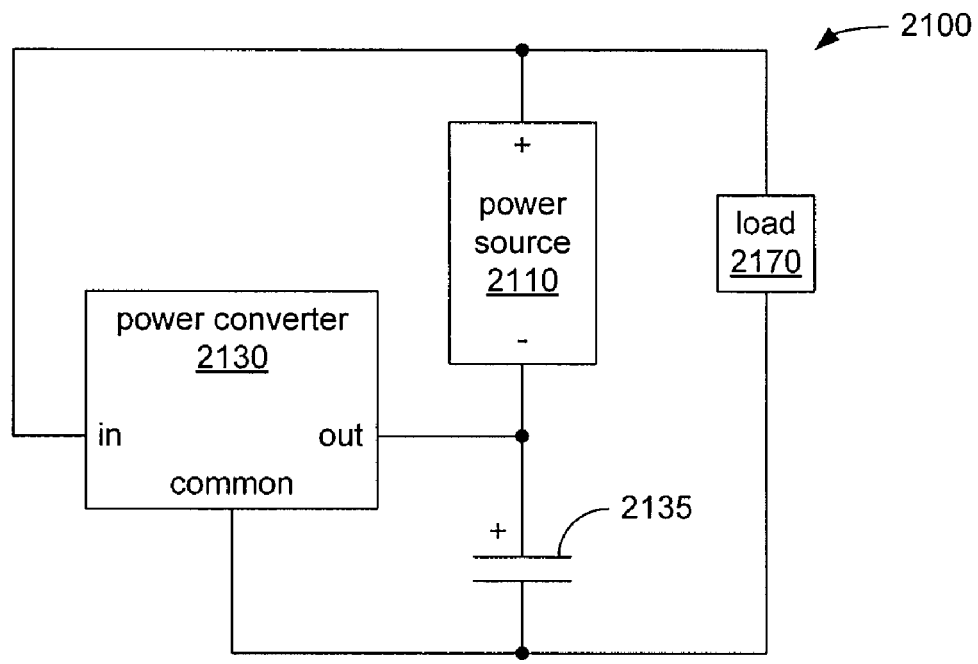
FIGS. 15A-15D are circuit diagrams of a power source, power converter and capacitive element coupled to a load.
Figure 15B:
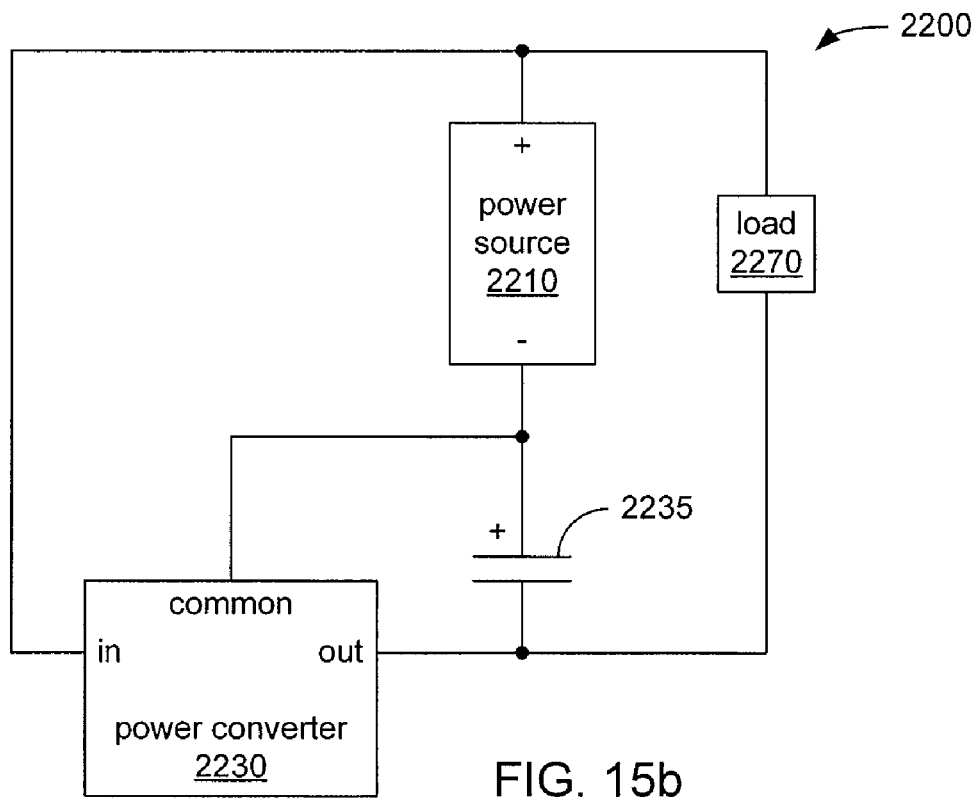
Figure 15C:
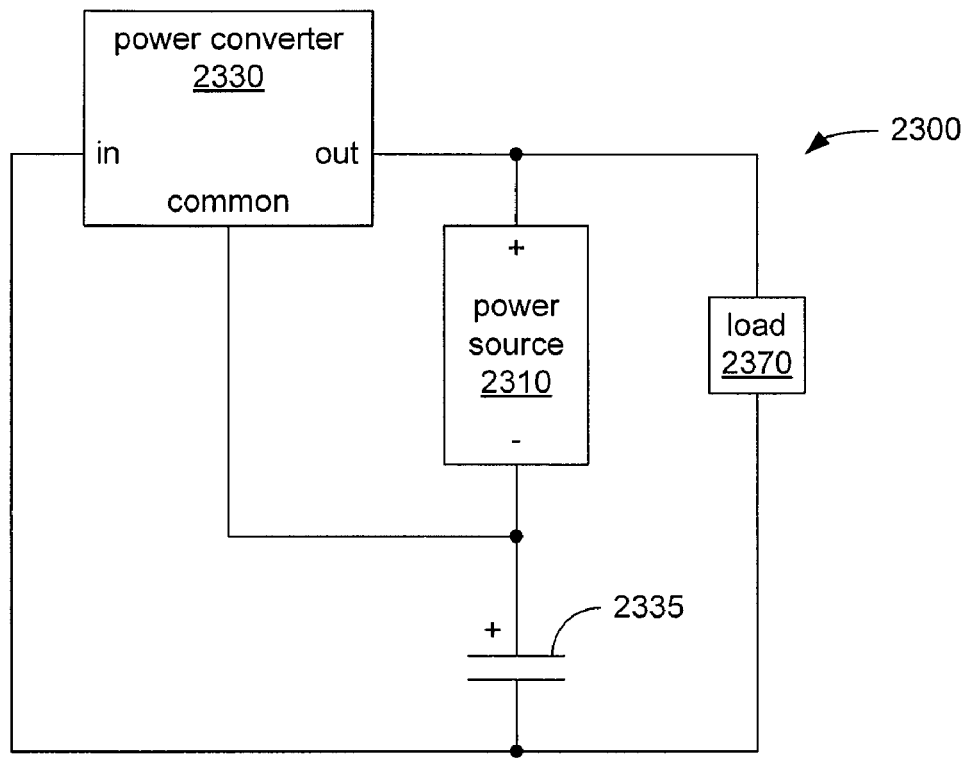
Figure 15D:
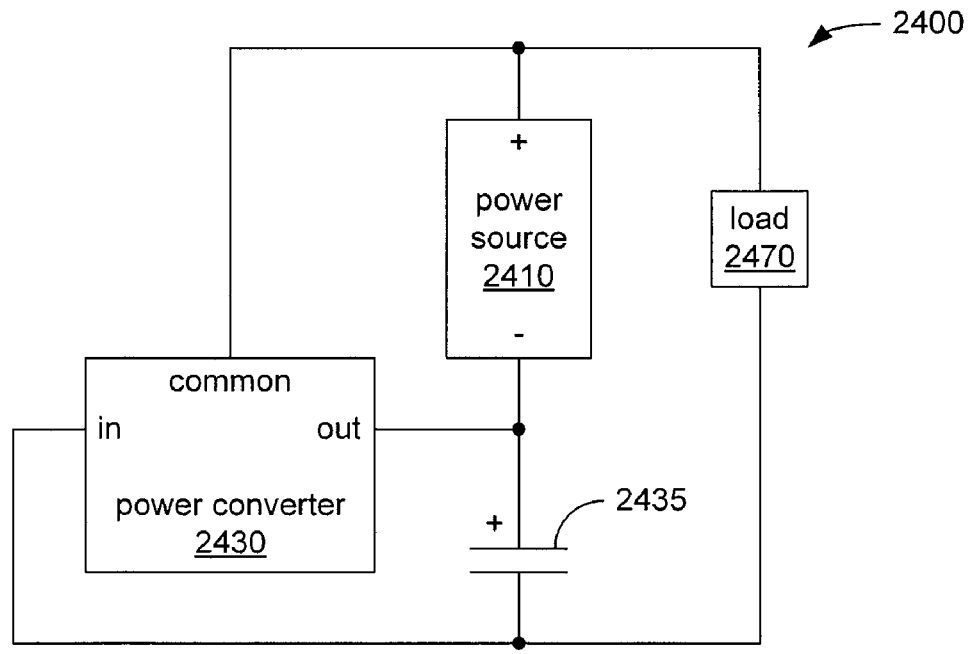

In the circuit 2100 depicted in FIG. 15*a*, a load 2170 is supplied with power having a voltage that is the sum of the voltages output by the power source 2110 and the capacitor 2135, which are coupled in series. The load 2170 is coupled to the anode of the power source 2110 and the cathode of the capacitor 2135, and the cathode of the power source 2110 is coupled to the anode of the capacitor 2135. Further, the input terminal of the power converter 2130 is coupled to the anode of the power source 2110, the output terminal of the power converter 2130 is coupled to both the cathode of the power source 2110 and the anode of the capacitor 2135, and the common terminal of the power converter 2130 is coupled to the cathode of the capacitor 2135.

There are two current flows provided by the power source 2110 that flow out through the output terminal of the power converter 2130. A first current flows from the anode of the power source 2110, through the load 2170, through the common and output terminals of the power converter 2130, and back to the cathode of the power source 2110. A second current flows from the anode of the power source 2110, through the input and output terminals of the power converter 2130, and back to the cathode of the power source 2110. The power converter 2130 imposes a limit on the amount of current that it permits to flow out through the output terminal, and the sum of these two current flows out through the output terminal is not permitted by the power converter 2130 to exceed this limit. It is this limit imposed on the sum of these two current flows that determines whether the capacitor 2135 is charged or discharged, depending on the amount of current drawn by the load 2170, as will now be explained.

At times when the load 2170 draws a relatively small amount of current, such that the limit of current flowing out through the output terminal of the power converter 2130 is not exceeded, both of the first and second current flows are able to take place without limits being imposed on them by the power converter 2130. The power converter 2130 is able to function as a voltage source with a portion of the current flowing out through the output terminal being able to charge the capacitor 2135. As a result, the load 2170 is supplied with power having a voltage equal to the sum of the full output voltage of the power source 2110 and the full capacity voltage of the capacitor 2135.

However, at times when the load 2170 attempts to draw a relatively large amount of current, such that the limit of current flowing out through the output terminal of the power converter 2130 would be exceeded if this amount of current were permitted through the power converter, the second current flow is reduced as a greater proportion of the current flow out through the output terminal is taken by the first current flow. The power converter 2130 then functions as a current source, and the capacitor 2135 discharges. The discharging of the capacitor 2130 allows a portion of the higher current draw of the load 2170 to circumvent the limit on current flowing out through the output terminal of the power converter 2130 allows the power source 2110 to support the higher current draw of the load 2170. As a result, voltage of the power source 2110 is able to be initially maintained at the full output voltage of the power source 2110. However, the power source 2110 is permitted to support this higher current draw of the load 2170 for only the amount of time that the capacitor 2135 requires to fully discharge, and after that, the amount of current that the power source 2110 is permitted to provide is limited by the limit imposed by the power converter 2130 through its output terminal.

In other words, at times when the load 2170 attempts to draw a relatively large amount of current, the capacitor 2135 and the power converter 2130 cooperate to initially allow the power source 2110 to support that higher amount of current for only the brief period of time required for the capacitor 2135 to discharge. After that, the discharged state of the capacitor 2135 and the limit on current flowing out through the output terminal of the power converter 2130 cooperate to limit the amount of current that the power source 2110 is allowed to provide. This accommodates the ability of a number of types of power sources to support a relatively large draw of current for only a brief period without damage. However, after that brief period, many of those power sources may be damaged due to overheating or other factors if they are allowed to continue supporting such a relatively large draw of current. Indeed, the storage capacity of the capacitor 2135 may be deliberately selected to control both the amount of time during which the power source 2110 is permitted to supply all of the relatively large amount of current (an amount of time that ends when the capacitor 2135 is discharged), and/or the limit on current flowing out through the output terminal of the power converter 2130 may be deliberately selected to control the amount of current that the power source 2110 is permitted to supply after the capacitor 2135 is discharged.

Although a single capacitor 2135 is depicted, it will be readily apparent to those skilled in the art that multiple capacitors may be grouped together in some embodiments in series and/or in parallel to increase voltage and/or storage capacity. Further, in some embodiments, including embodiments in which the power source 2110 is a battery or other type of power storage device, the power converter 2130 may be designed and/or selected to enable the capacitor 2135 to discharge stored power back to the power source 2110 (perhaps back through the output and input connections of the power converter 2130) when the circuit 2100 is to be turned off. This may be implemented as part of a sequence of steps for powering down the circuit 2100 in which the power converter 2130 is signaled to cease charging the capacitor 2135, and instead, to allow current from the capacitor 2135 to return to the power source 2110.

Figure 16B:
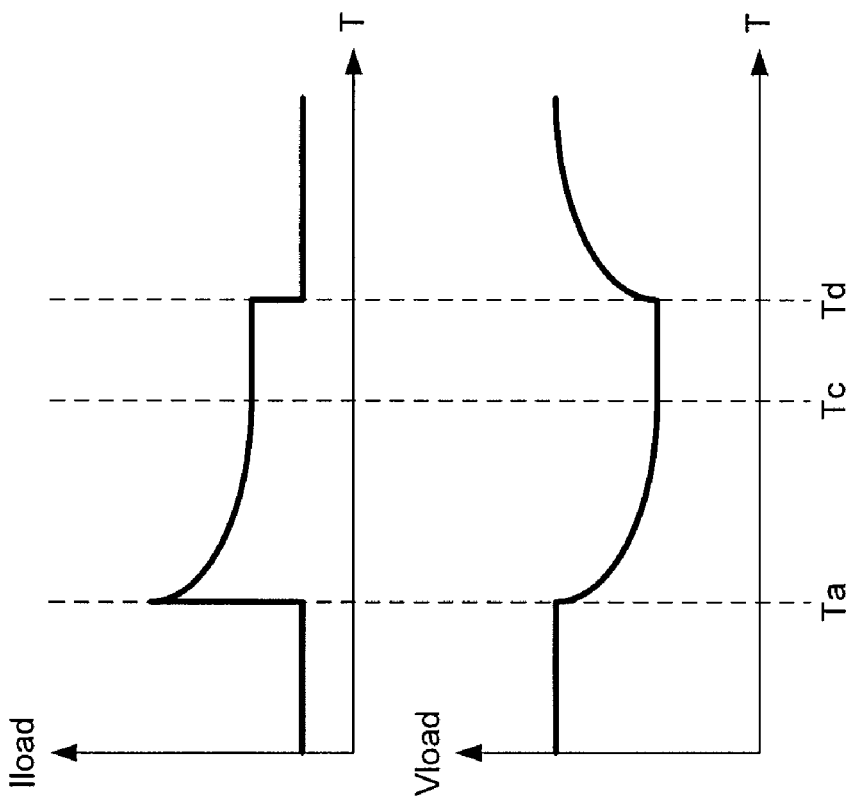
FIGS. 16A-16B are time plots of electrical current and voltage provided to the load of FIG. 15A.
Figure 16A:
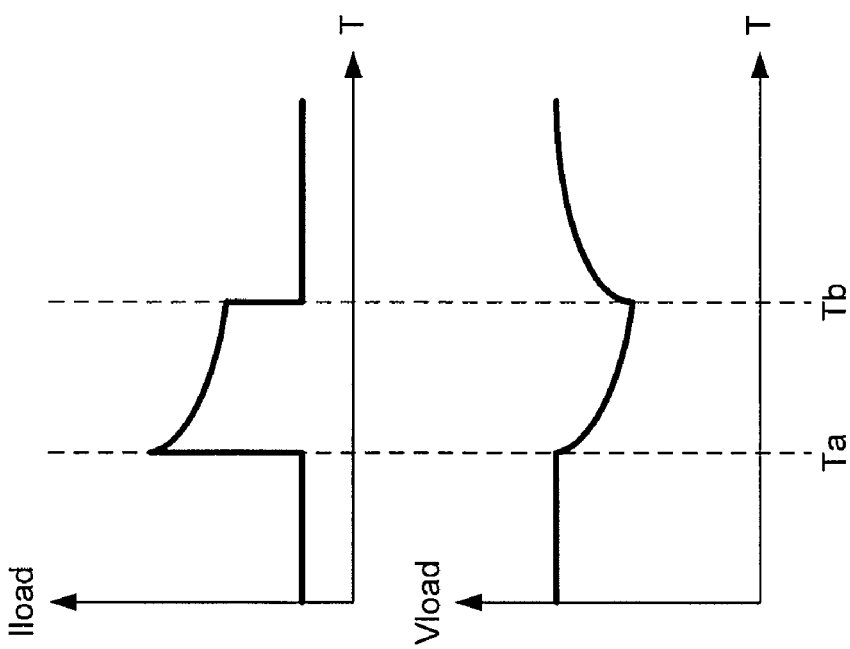

FIGS. 16a and 16b depict possible changes in the voltage (Vload) provided to the load 2170 in the circuit 2100 as a result of changes in the current (Iload) drawn by the load 2170 from drawing a relatively small amount of current to drawing a relatively large amount of current. Prior to time Ta in both FIGS. 16a and 16b, the load 2170 draws a relatively small Iload that does not cause the limit imposed by the power converter 2130 on the amount of current flowing out through its output terminal to be exceeded. As a result, the power converter 2130 is able to function as a voltage source, and Vload is the sum of the full voltage output of the power source 2110 and the full capacity voltage of the capacitor 2135.

However, at time Ta, the load 2170 begins attempting to draw a relatively larger Iload. This relatively larger Iload causes the limit on the total current flowing out through the output terminal of the power converter 2130 to be reached, and would cause that limit to be exceeded if the power converter 2130 did not impose the limit. As a result, there is no longer current capacity through the output terminal to allow a current flow from the input terminal to be used to charge the capacitor 2135, and the capacitor 2135 starts to discharge. The discharging of the capacitor 2135 allows part of the relatively larger Iload to flow through the capacitor 2135, thereby circumventing the limit imposed by the power converter 2130 and allowing Iload to initially increase considerably at time Ta. However, starting at time Ta, the discharging of the capacitor 2135 causes both the voltage output by the capacitor 2135 and the current flowing through the capacitor 2135 to fall exponentially towards zero, thereby forcing both Vload and Iload to drop starting at time Ta.

If, as shown in FIG. 16a, the load 2170 ceases at time Th to attempt to draw the relatively larger Iload before the capacitor 2135 is fully discharged, then the amount of current flowing out through the output terminal of the power converter 2130 ceases to exceed the limit imposed by the power converter 2130. As a result, the capacitor 2135 is once again charged, and Vload returns to the level at which it was before time Ta.

Alternatively, if as shown in FIG. 16b, the load 2170 continues attempting to draw a relatively larger Iload past time Tc, at which the capacitor is fully discharged, then Iload is forced to be limited by the limit in current flow imposed by the power converter 2130. As a result, Vload is also forced to be limited to a level dictated by the limit on current flow imposed by the power converter 2130 as the power converter 2130 functions as a current source. Later at time Td, when the load 2170 ceases to attempt to draw a relatively larger Iload and returns to drawing the relatively small Iload, the amount of current flowing out through the output terminal of the power converter return to a level that does not exceed the limit and the capacitor 2135 again charges. As a result, Vload returns to the level at which it was before time Ta.

Figure 17:
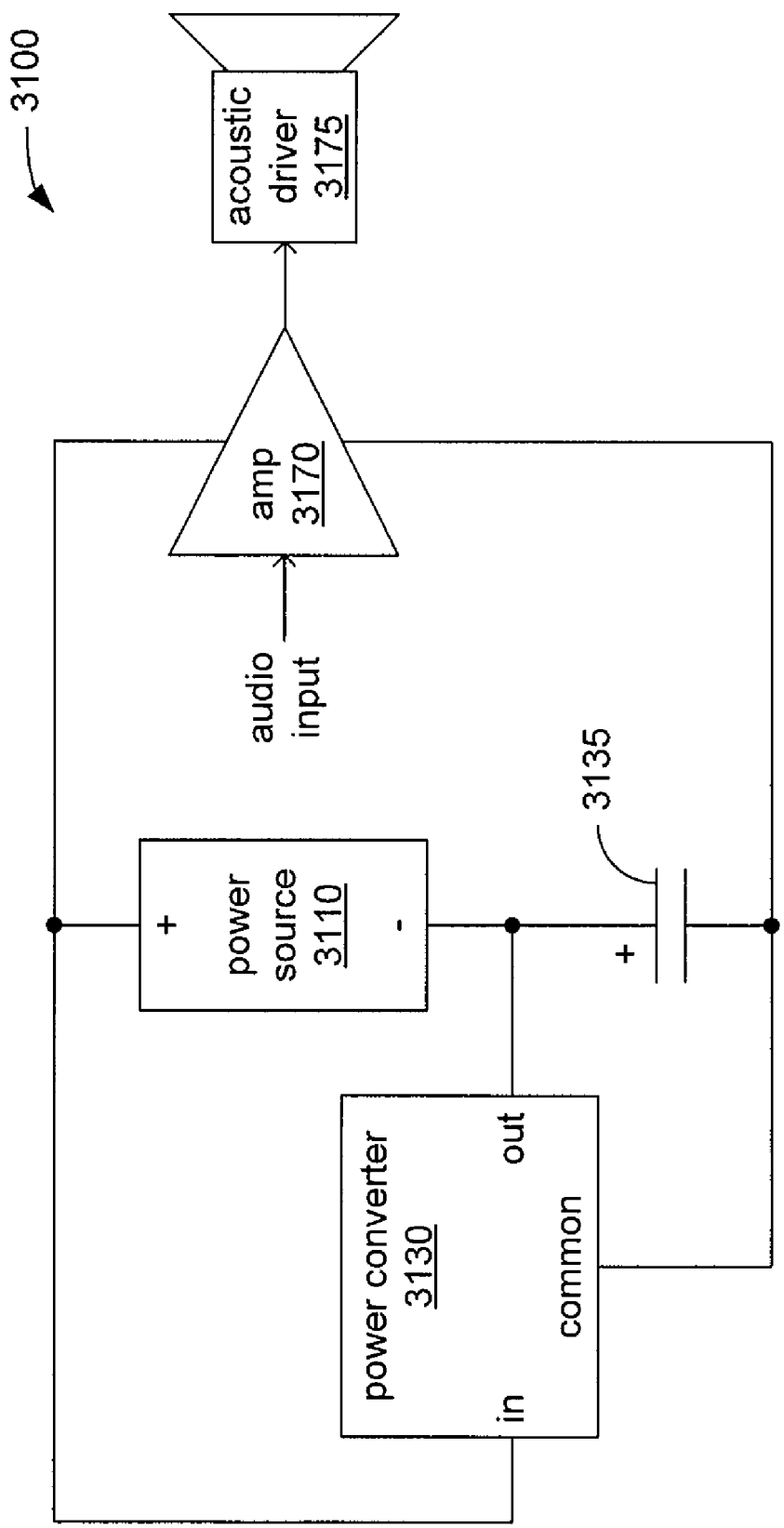
FIG. 17 is a circuit diagram of a power source, power converter and capacitive element coupled to an amplifier and an acoustic driver.

FIG. 17 depicts a circuit 3100 having an amplifier 3170 that is powered by a power source 3110 in series with a capacitor 3135 that is selectively charged by a power converter 3130. The amplifier 3170 is able to drive an acoustic driver 3175 when the acoustic driver 3175 is coupled to the circuit 3100. The coupling of anodes, cathodes and terminals among the power source 3110, the capacitor 3135 and the power converter 3130 in the circuit 3100 is substantially similar to that in the circuit 2100 of FIG. 15a. However, as those skilled in the art will readily recognize, the coupling of these anodes, cathodes and terminals may alternatively be made substantially similar to that in any of the circuits 2200-2400 of FIGS. 15b-15d, respectively. In a manner not unlike the load 2170 of the circuit 2100, the amplifier 3170 of the circuit 3100 is supplied with power having a voltage that is the sum of the voltages output by the power source 3110 and the capacitor 3135. Also not unlike the power converter 2130 of the circuit 2100, the power converter 3130 of the circuit 3100 selectively charges the capacitor 3135 depending on the amount of current drawn by the amplifier 3170.

As was the case with the circuits 2100-2400, the power source 3110 may be a battery, a power source providing DC output from an AC main, a power feed provided from an external device (e.g., cabling conveying power in additional to digital serial communications from an electronic device such as a computer), or any of a variety of other types of power source. Also, the capacitor 3135 may be any of a variety of types of capacitive element, including a super capacitor or ultra capacitor. Further, although the power converter 3130 is preferably a buck converter, those skilled in the art will readily understand that other types of power converter may be used. The acoustic driver 3175 may represent one or more speakers in an entertainment system, one or more sound emitting elements of a pair of headphones, or any of a variety of other types of device capable of producing sound.

In a manner not unlike previously discussed embodiments of power being supplied to an amplifier, the amount of current drawn by the amplifier 3170 of the circuit 3100 at any given time is based primarily on the amount of power the amplifier 3170 requires to drive the acoustic driver 3175 to produce a given sound at a given volume. As previously discussed, many pieces of music have brief portions that cause the amplifier 3170 to briefly draw a relatively greater amount of current in order to drive the acoustic driver 3175 during those portions. Not unlike the circuit 2100, in the circuit 3100 there are two current flows provided by the power source 3110 that flow out through the output terminal of the power converter 3130. A first current flows from the power source 3110, through the amplifier 3170, through the common and output terminals of the power converter 3130, and back to the power source 3110. A second current flows from the power source 3110, through the input and output terminals of the power converter 3130, and back to the power source 3110. The power converter 3130 imposes a limit on the amount of current that it permits to flow out through the output terminal, and the sum of these two current flows out through the output terminal is not permitted by the power converter 3130 to exceed this limit.

At times when the amplifier 3170 draws a relatively small amount of current, such that the limit of current flowing out through the output terminal of the power converter 3130 is not exceeded, both of the first and second current flows are able to take place without limits being imposed on them by the power converter 3130. As a result, the capacitor 3135 is charged, and the amplifier 3170 is supplied with power having a voltage equal to the sum of the full output voltage of the power source 3110 and the full capacity voltage of the capacitor 3135. However, at times when a piece of music (or other signal representative of a sound) causes the amplifier 3170 to attempt to draw a relatively large amount of current, such that the limit of current flowing out through the output terminal of the power converter 3130 would be exceeded if this amount of current were permitted through the power converter, the second current flow is reduced as a greater proportion of the current flowing out through the output terminal is taken by the first current flow. As a result, the capacitor 3135 discharges, and while this discharging continues to take place, the power source 3110 is permitted to support the higher current draw of the amplifier 3170. Part of this higher current returns to the power source 3110 through the power converter 3130 and part through the capacitor 3135 such that the limit on current flow through the output terminal of the power converter is circumvented. As a result, voltage of the power source 3110 is able to be initially maintained at the full output voltage of the power source 3110. However, after the capacitor 3135 has fully discharged, current no longer flows through the capacitor 3135, and so the amount of current that the power source 3110 is permitted to provide is limited by the limit imposed by the power converter 3130 on the flow of current out through its output terminal.

The storage capacity of the capacitor 3135 may be selected to be large enough to ensure that the time required to discharge the capacitor is sufficiently long as to accommodate a desired percentage of brief passages requiring increased power as are known to exist within a known set of pieces of music. Additionally or alternatively, the storage capacity of the capacitor 3135 may be selected to be small enough to ensure that the time required to discharge the capacitor is sufficiently limited to prevent the power source 3110 from being permitted to support a relatively higher current draw for too long a period of time such that the power source 3110 is damaged. Also, the limit on current flowing out through the output terminal of the power converter 3130 may be selected to control the amount of current that the power source 3110 is permitted to supply after the capacitor 3135 is discharged to prevent damage to the power source 3110.

Although a single capacitor 3135 is depicted, it will be readily apparent to those skilled in the art that multiple capacitors may be grouped together in some embodiments in series and/or in parallel to increase voltage and/or storage capacity. Further, in some embodiments, including embodiments in which the power source 3110 is a battery or other type of power storage device, the power converter 3130 may be designed and/or selected to enable the capacitor 3135 to discharge stored power back to the power source 3110 (perhaps back through the output and input connections of the power converter 3130) when the circuit 3100 is to be turned off. This may be implemented as part of a sequence of steps for powering down the circuit 3100 in which the power converter 3130 is signaled to cease charging the capacitor 3135, and instead, to allow current from the capacitor 3135 to return to the power source 3110.

FIGS. 16a-16b, although discussed with regard to Vload provided to the load 2170 of the circuit 2100 in FIG. 15a, are also indicative of the changes that may occur in the voltage provided to the amplifier 3170 of the circuit 3100. Further, as was the case with the circuit 2100, whether the voltage provided to the amplifier 3170 follows the changes depicted in FIG. 16a or the changes depicted in FIG. 16b depends on whether the amplifier 3170 ceases drawing a relatively larger amount of current either before the capacitor 3135 is fully discharged (i.e., at time Th, or after the capacitor 3135 is fully discharged (i.e., at time Td).

Figure 18:
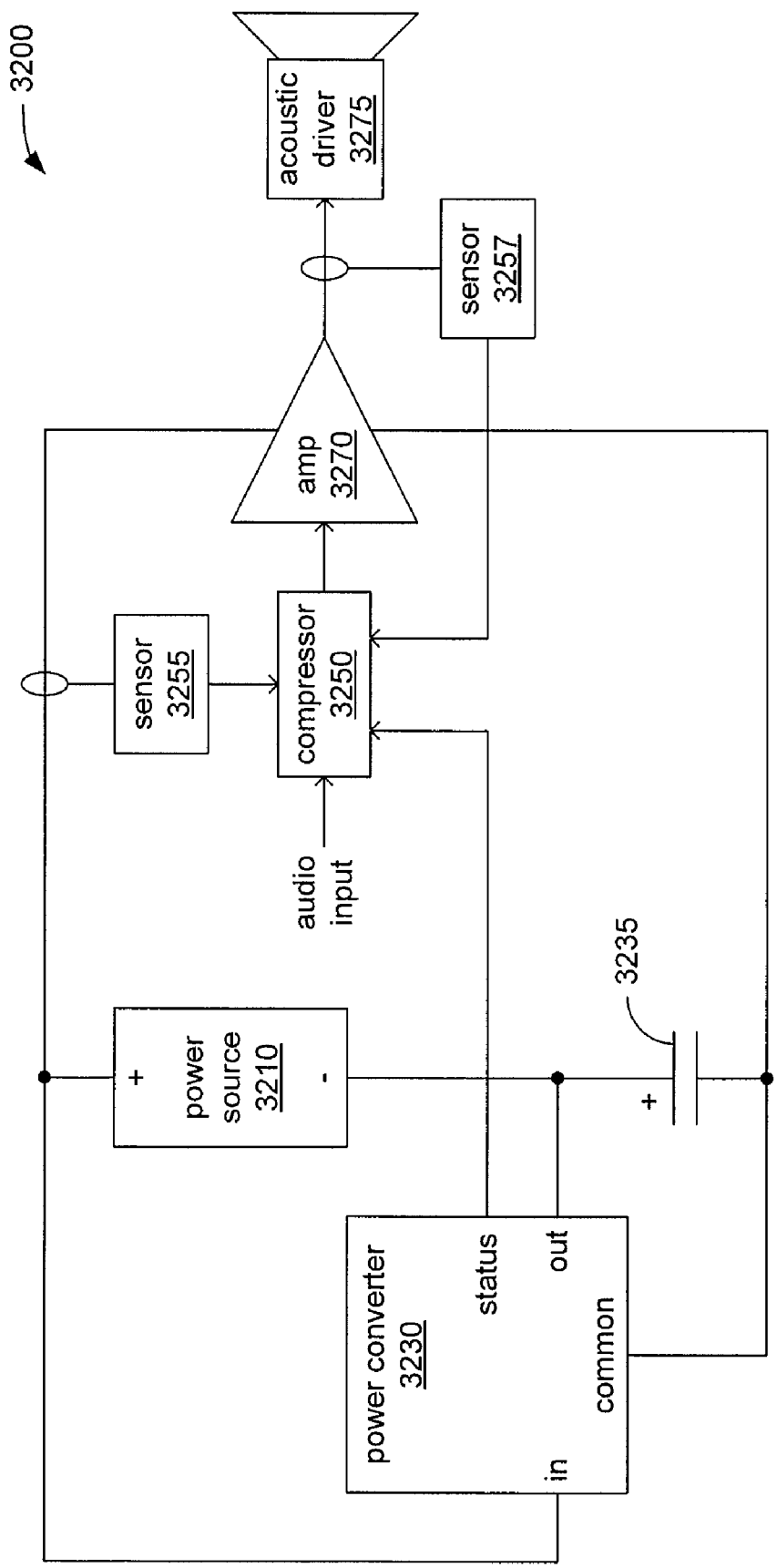
FIG. 18 is a circuit diagram of a power source, power converter, capacitive element and compressor coupled to an amplifier and an acoustic driver.

FIG. 18 depicts a circuit 3200 having an amplifier 3270 that is powered by a power source 3210 in series with a capacitor 3235 that is selectively charged by a power converter 3230. The amplifier 3270 is able to drive an acoustic driver 3275 with audio input received through a compressor 3250 when the acoustic driver 3275 is coupled to the circuit 3200. The coupling of anodes, cathodes and terminals among the power source 3210, the capacitor 3235 and the power converter 3230 in the circuit 3200 is substantially similar to that in the circuits 2100 and 3100 of FIGS. 15a and 17, respectively. However, as those skilled in the art will readily recognize, the coupling of these anodes, cathodes and terminals may alternatively be made substantially similar to that in any of the circuits 2200-2400 of FIGS. 15b-15d, respectively. In a manner not unlike the amplifier 3170 of the circuit 3100, the amplifier 3270 of the circuit 3200 is supplied with power having a voltage that is the sum of the voltages output by the power source 3210 and the capacitor 3235. Also not unlike the power converter 3130 of the circuit 3100, the power converter 3230 of the circuit 3200 selectively charges the capacitor 3235 depending on the amount of current the amplifier 3270 is caused to draw as a result of driving the acoustic driver 3275.

As was the case with previously discussed circuits, the power source 3210 may be any of a variety of other types of power source, and the power converter 3230 may be any of a variety of types of power converter. Further, the power converter 3230 may be capable of enabling energy stored in the capacitor 3235 to be returned to the power source 3210 upon the powering down of the circuit 3200. Also, the capacitor 3235 may be any of a variety of types of capacitive element, including more than one capacitive element, and the acoustic driver 3275 may be any of a variety of types of device capable of producing sound, including more than one of such devices.

The substantial difference between the circuit 3200 and the circuit 3100 of FIG. 17 is the addition of the compressor 3250 in the circuit 3200 that serves to selectively reduce the amplitude of at least some peak portions of the audio input presented to the amplifier 3270. As previously discussed, many pieces of music have brief portions that cause an amplifier to require relatively greater amounts of current. However, a small percentage of music may have relatively longer portions that cause such relatively greater amounts of current to be required, and these longer portions may be long enough to exceed the amount of time during which the power source 3210 is able to provide such relatively greater amounts of current without damage and/or long enough to exceed the amount of time during which the capacitor 3235 is able to allow the power source 3210 to support such relatively greater amounts of current. In other words, such longer portions may be long enough that the capacitor 3235 is substantially discharged before such longer portions end, thereby removing the path by which part of the relatively larger amount of current circumvents the limit imposed by the power converter 3230. Where a situation arises in which the amplifier 3270 requires more current, but that amount of current is not provided, undesirable events may occur in the signal driven by the amplifier 3270 to the acoustic driver 3275, such as the clipping of peaks in that output.

The compressor 3250 may be coupled to a sensor 3255 to sense the voltage provided to the amplifier 3270, may be coupled to a sensor 3257 to sense occurrences of undesirable events in the signal driven to the acoustic driver 3275 (e.g., clipping), and/or may receive an input from the power converter 3230 indicating occurrences of the current flowing out through the output terminal reaching the limit imposed by the power converter 3230. As will be explained in greater detail, as a relatively longer portion of music (or other sound) is encountered that continues beyond the time at which the capacitor 3235 is substantially discharged, the compressor 3250 is triggered to reduce the amplitude of at least some peak portions of the audio input provided to the amplifier 3270. As a result, the amplitude of at least some peak portions of the output driven by the amplifier 3270 to the acoustic driver 3275 is reduced to avoid clipping and/or other undesirable events.

Not unlike the circuits 2100 and 3100, in the circuit 3200 there are two current flows that are provided by the power source 3210 and that both flow out through the output terminal of the power converter 3230, and the power converter 3230 imposes a limit on the amount of current that it permits to flow out through the output terminal. At times when the amplifier 3270 draws a relatively small amount of current, such that the limit of current flowing out through the output terminal of the power converter 3230 is not exceeded, both current flows are able to take place without limits being imposed on them by the power converter 3230. As a result, the capacitor 3235 is charged, and the amplifier 3270 is supplied with power having a voltage equal to the sum of the full output voltage of the power source 3210 and the full capacity voltage of the capacitor 3235.

At times when a piece of music (or other signal representative of a sound) causes the amplifier 3270 to begin drawing a relatively large amount of current, such that the limit of current flowing out through the output terminal of the power converter 3230 would be exceeded if this amount of current were permitted through the power converter, the second current flow is reduced as a greater proportion of the current flowing out through the output terminal is taken by the first current flow. As a result, the capacitor 3235 discharges, and while this discharging continues to take place, the power source 3210 is permitted to support the higher current draw of the amplifier 3270. Part of this higher current returns to the power source 3210 through the power converter 3230 and part through the capacitor 3235 such that the limit on current flow through the output terminal of the power converter is circumvented. As a result, voltage of the power source 3210 is able to be initially maintained at the full output voltage of the power source 3210. However, after the capacitor 3235 has fully discharged, current no longer flows through the capacitor 3235, and so the amount of current that the power source 3210 is permitted to provide is limited by the limit imposed by the power converter 3230 on the flow of current out through its output terminal.

However, unlike the circuit 3100 of FIG. 17, if the period of time during which the amplifier 3270 draws relatively more current approaches or exceeds the time required for the capacitor 3235 to substantially discharge, then the compressor 3250 is triggered to alter the audio signal provided to the amplifier 3270 to reduce the amplitude of at least some peaks. In embodiments where the compressor 3250 is coupled to the sensor 3255 sensing the voltage provided to the amplifier 3270, the compressor 3250 may be triggered in response to the drop in the voltage provided to the amplifier 3270 as the capacitor 3235 is substantially discharged. In embodiments where the compressor 3250 is coupled to the sensor 3257 sensing undesired events in the signal driven to the acoustic driver 3275, the compressor 3250 may be triggered in response to the occurrence of one or more of such undesired events. In embodiments where the compressor 3270 receives an input from the power converter 3230 indicating occurrences of the limit on current flowing out through the output terminal being reached, the compressor 3250 may be triggered in response to that limit being reached. In other embodiments, the compressor 3250 may employ a timer that triggers the compressor 3250 if the audio input continues to exhibit a characteristic (e.g., a threshold of amplitude being exceed by at least one peak) that causes the amplifier 3270 to require a relatively greater amount of current for a period of time longer than a preset interval of time, and that interval may chosen to correspond to the amount of time required for the capacitor 3235 to substantially discharge. In each of these embodiments, the compressor 3250 may monitor one or more characteristics of the audio input and cease reducing the amplitude of at least some peaks in the signal provided to the amplifier 3270 in response to the audio input ceasing to have a characteristic causing the amplifier 3270 to require a relatively greater amount of current.

Not unlike the capacitor 3135 of the circuit 3100, the storage capacity of the capacitor 3235 may be selected to be large enough to ensure that the time required to discharge the capacitor is sufficiently long as to accommodate a desired percentage of brief passages requiring increased power as are known to exist within a known set of pieces of music. Additionally or alternatively, the storage capacity of the capacitor 3235 may be selected to be small enough to ensure that the time required to discharge the capacitor is sufficiently limited to prevent the power source 3210 from being permitted to support a relatively higher current draw for too long a period of time such that the power source 3210 is damaged. Also, the limit on current flowing out through the output terminal of the power converter 3230 may be selected to control the amount of current that the power source 3210 is permitted to supply after the capacitor 3235 is discharged to prevent damage to the power source 3210.

Figure 19:
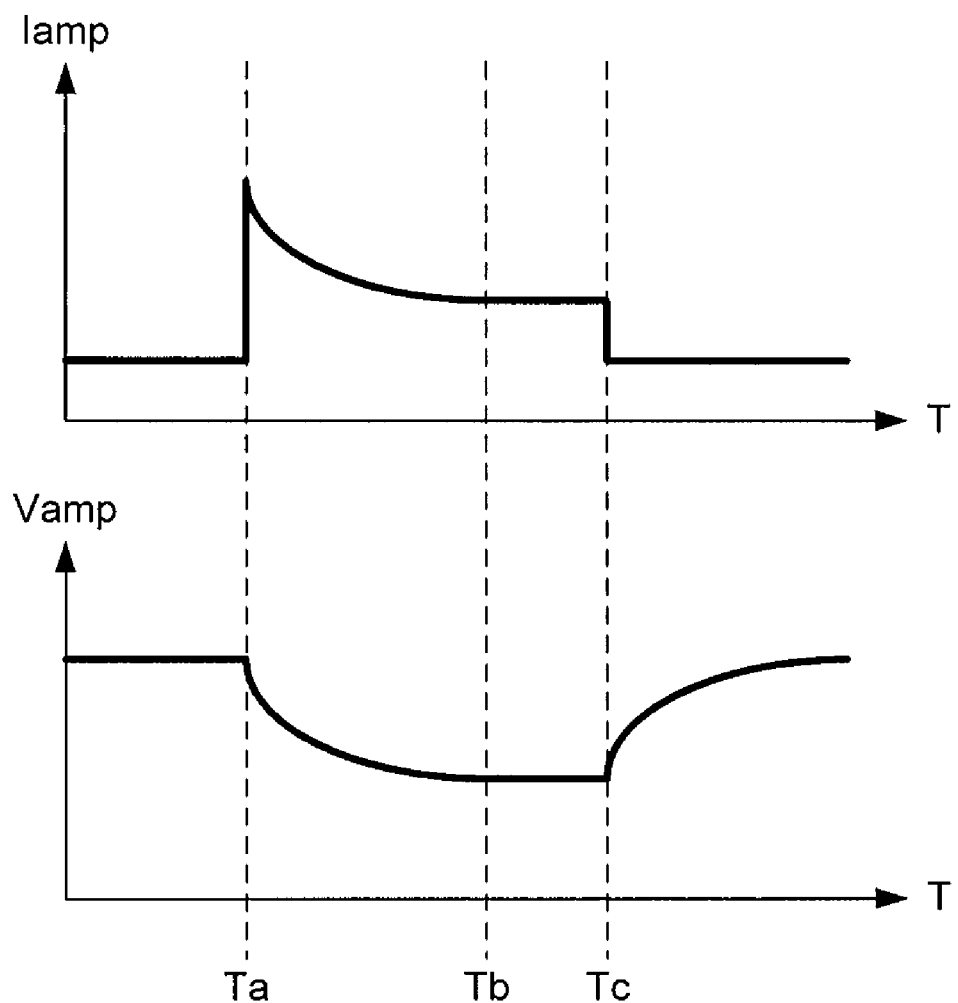
FIG. 19 is a time plot of electrical current and voltage provided to the amplifier of FIG. 18.

FIG. 19 depicts the possible changes in the voltage (Vamp) provided to the amplifier 3270 in the circuit 3200 as a result of changes in the current (lamp) drawn by the amplifier 3270, including attempt to draw a relatively large amount for a period of time sufficiently long as to trigger the compressor 3250. Prior to time Ta, the amplifier 3270 draws a relatively small lamp that does not cause the limit imposed by the power converter 3230 on the amount of current flowing out through its output terminal to be exceeded. As a result, the power converter 3230 is able to function as a voltage source, and Vamp is the sum of the full voltage output of the power source 3210 and the full capacity voltage of the capacitor 3235.

However, at time Ta, a portion of music (or other sound) received as an audio input causes the amplifier 3270 to attempt to draw a relatively larger lamp. This causes the limit on the total current flowing out through the output terminal of the power converter 3230 to be reached, and would cause that limit to be exceeded if the power converter 3230 did not impose this limit. As a result, there is no longer current capacity through the output terminal to allow a current flow from the input terminal to be used to charge the capacitor 3235, and the capacitor 3235 starts to discharge. The discharging of the capacitor 3235 allows part of the relatively larger lamp to flow through the capacitor 3235, thereby circumventing the limit imposed by the power converter 3230. However, starting at time Ta, the discharging of the capacitor 3235 causes the voltage output by the capacitor 3235 and the capacity for current flowing through the capacitor 3235 to fall exponentially towards zero, forcing both lamp and Vamp to drop.

As the amplifier 3270 continues drawing the relatively larger lamp, at time Th, the compressor 3250 is triggered to begin altering the audio input to reduce the amplitude of at least some peaks in the audio input, and provides this version of the audio input to the amplifier 3270. This altered version of the audio input reduces the current requirements of the amplifier 3270, thereby allowing the amplifier 3270 to operate within the forcibly limited lamp and continue to provide an output to the acoustic driver 3275 while avoiding at least one or more undesirable events (e.g., clipping).

As previously discussed, the compressor 3250 may be triggered by one or more of a number of events, including an event corresponding or otherwise linked to the discharge of the capacitor 3235. As a result, time Tb may coincide or be otherwise coordinated with the time at which the capacitor 3235 is discharged to a preselected degree or at which the capacitor 3235 is fully discharged. From the time the capacitor 3235 is fully discharged such that there can no longer be current flowing through the capacitor 3235, lamp will be limited by the limit imposed on current flowing out through the output terminal of the power converter 3230. As a result, by the time the capacitor 3235 has fully discharged, Vamp has dropped to a level dictated by the limit on current flow imposed by the power converter 3230 as the power converter 3230 functions as a current source.

At time Tc, the audio input changes such that the one or more characteristics of the audio input that had caused the amplifier 3270 to attempt to draw a relatively greater lamp are no longer present, and the compressor 3250 ceases altering the audio input. Furthermore, with the amplifier 3270 no longer attempting to draw a relatively greater lamp, the amount of current flowing out through the output terminal of the power converter returns to a level that does not exceed the limit. As a result, the capacitor 3235 again charges, and Vamp returns to the level at which it was before time Ta.

Figure 20:
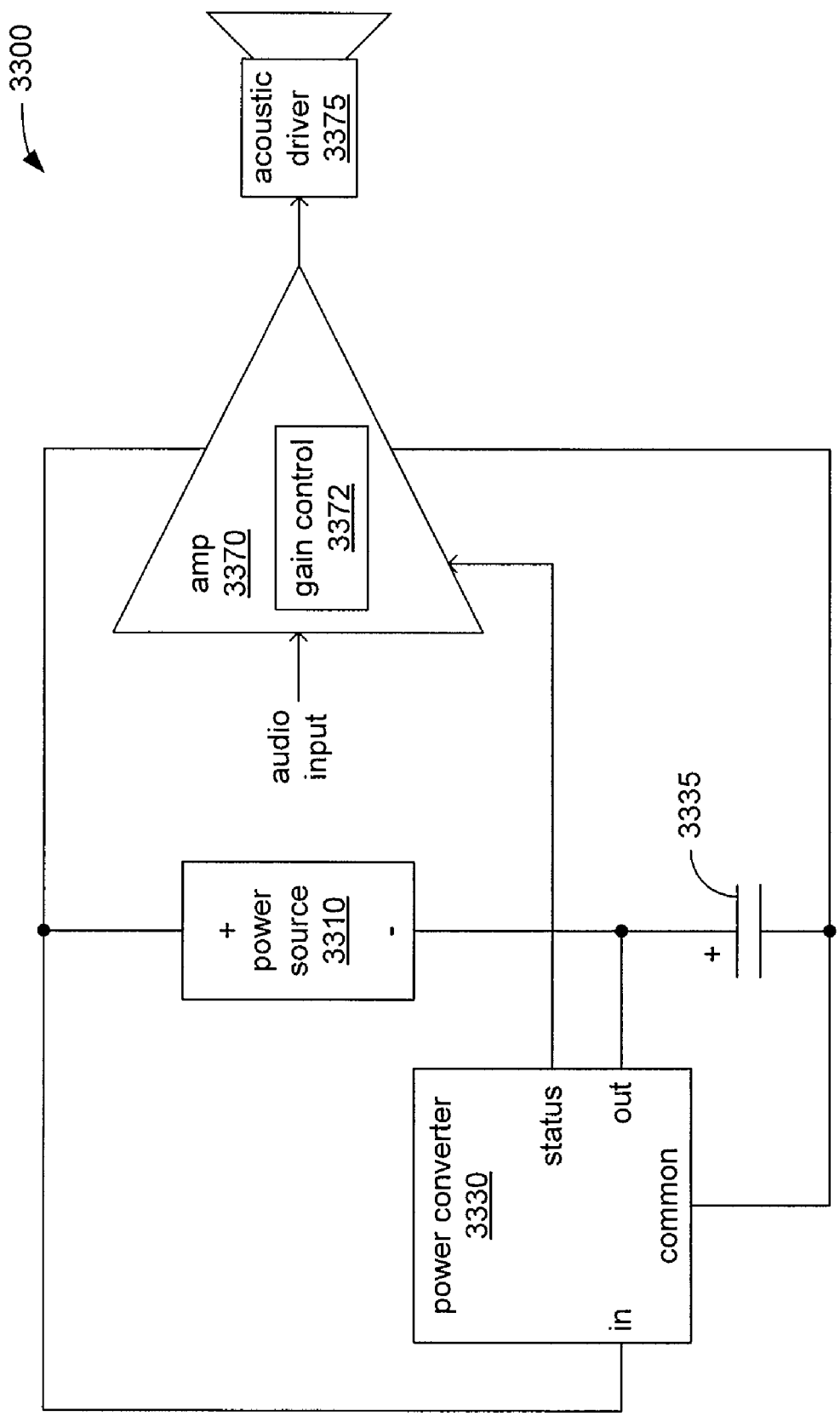
FIG. 20 is a circuit diagram of a power source, power converter and capacitive element coupled to an amplifier having a gain control and an acoustic driver.

FIG. 20 depicts a circuit 3300 having an amplifier 3370 that is powered by a power source 3310 in series with a capacitor 3335 that is selectively charged by a power converter 3330. The amplifier 3370 has a gain control 3372 and is able to drive an acoustic driver 3375 when the acoustic driver 3375 is coupled to the circuit 3300. The coupling of anodes, cathodes and terminals among the power source 3310, the capacitor 3335 and the power converter 3330 in the circuit 3300 is substantially similar to that in the circuits 2100, 3100 and 3200 of FIGS. 15a, 17 and 18, respectively. However, as those skilled in the art will readily recognize, the coupling of these anodes, cathodes and terminals may alternatively be made substantially similar to that in any of the circuits 2200-2400 of FIGS. 15b-15d, respectively. In a manner not unlike the amplifiers 3170 and 3270 of the circuits 3100 and 3200, the amplifier 3370 of the circuit 3300 is supplied with power having a voltage that is the sum of the voltages output by the power source 3310 and the capacitor 3335. Also not unlike the power converters 3130 and 3230 of the circuits 3100 and 3200, respectively, the power converter 3330 of the circuit 3300 selectively charges the capacitor 3335 depending on the amount of current the amplifier 3370 is caused to draw as a result of driving the acoustic driver 3375.

As was the case with previously discussed circuits, the power source 3310 may be any of a variety of other types of power source, and the power converter 3330 may be any of a variety of types of power converter. Further, the power converter 3330 may be capable of enabling energy stored in the capacitor 3335 to be returned to the power source 3310 upon the powering down of the circuit 3300. Also, the capacitor 3335 may be any of a variety of types of capacitive element, including more than one capacitive element, and the acoustic driver 3375 may be any of a variety of types of device capable of producing sound, including more than one of such devices.

The substantial difference between the circuit 3300 from the circuit 3200 is the substitution of the gain control 3372 for the compressor 3250. Whereas the compressor 3250 selectively reduces at least some peaks of the audio input presented to the amplifier 3270, the gain control 3372 selectively reduces the gain employed by the amplifier 3370 in amplifying the audio input. In support of triggering of the gain control 3372, the amplifier 3370 may receive an input from the power converter 3330 indicating occurrences of the current flowing out through the output pin reaching the limit imposed on that current flow by the power converter 3330. As a relatively longer portion of music (or other sound) causes the amplifier 3370 to require a relatively larger amount of current for a period of time long enough to substantially discharge the capacitor 3335, the gain control 3372 is triggered to reduce the gain of amplifier 3370 in amplifying the audio input such that the amplitude of the output of the driven by the amplifier 2370 to the acoustic driver 2375 is reduced to avoid clipping and/or other undesirable events.

Not unlike the circuits 2100, 3100 and 3200, in the circuit 3300, at times when the amplifier 3370 draws a relatively small amount of current, such that the limit imposed by the power converter 3330 on current flowing out through the output terminal is not exceeded, no limit is placed on current flowing out through the output terminal. As a result, the capacitor 3335 is charged, and the amplifier 3370 is supplied with power having a voltage equal to the sum of the full output voltage of the power source 3310 and the full capacity voltage of the capacitor 3335. At times when a piece of music (or other signal representative of a sound) causes the amplifier 3370 to begin drawing a relatively large amount of current, such that the limit of current flowing out through the output terminal of the power converter 3330 would be exceeded if this amount of current were permitted through the power converter, the imposed limit results in the capacitor 3335 discharging. While this discharging takes place, the power source 3310 is permitted to support the higher current draw of the amplifier 3370 and part of this higher current returns to the power source through the capacitor 3335 such that the limit imposed on current flowing out through the output terminal is circumvented. As a result, the full output voltage of the power source 3210 is able to be maintained until the capacitor 3335 has fully discharged, resulting in the amount of current that the power source 3310 is permitted to provide being limited by the limit imposed by the power converter 3230 on the flow of current out through its output terminal.

However, if the period of time during which the amplifier 3370 draws relatively more current begins to exceed the time during which the capacitor 3335 substantially discharges, then the gain control 3372 alters the gain applied by the amplifier 3370 to the audio input to reduce the amplitude of the resulting output driven to the acoustic driver 3375. In some embodiments, the gain control 3372 may monitor the voltage provided to the amplifier 3370, and reduce the gain in response to the drop in the voltage provided to the amplifier 3370 as the capacitor 3335 is substantially discharged. In some embodiments, the gain control 3372 may monitor the output driven to the acoustic driver 3375 for undesired events (including clipping), and reduce the gain in response to the occurrence of one or more of such undesired events. In embodiments where the amplifier 3370 receives an input from the power converter 3330 indicating occurrences of disconnection of the output connection of the power converter 3330, the gain control 3372 may reduce the gain in response to the occurrence of one or more instances of such disconnection. In other embodiments, the gain control 3372 may employ a timer triggering a reduction in the gain if the audio input continues to cause the amplifier 3370 to require relatively greater amounts of power for a period of time longer than a preset interval of time that may be chosen to correspond to the amount of time required for the capacitor 3335 to substantially discharge. In each of these embodiments, the gain control 3372 may monitor one or more characteristics of the audio input and cease reducing the gain if the audio input changes so as to no longer cause the amplifier 3370 to require such relatively greater amounts of power.

Not unlike the capacitors of previously discussed circuits, the storage capacity of the capacitor 3335 may be selected to be large enough to ensure that the time required to discharge the capacitor is sufficiently long as to accommodate a desired percentage of brief passages requiring increased power as are known to exist within a known set of pieces of music. Additionally or alternatively, the storage capacity of the capacitor 3335 may be selected to be small enough to ensure that the time required to discharge the capacitor is sufficiently limited to prevent the power source 3310 from being permitted to support a relatively higher current draw for too long a period of time such that the power source 3310 is damaged. Also, the limit on current flowing out through the output terminal of the power converter 3330 may be selected to control the amount of current that the power source 3310 is permitted to supply after the capacitor 3335 is discharged to prevent damage to the power source 3310.

The effect of the operation of the circuit 3300 on the voltage provided to the amplifier 3370 may, in some embodiments, be substantially the same as depicted in FIG. 19, with the substantial difference being that at time Tc, the gain with which the audio input is amplified by the amplifier 3370 is changed, rather than the amplitude of peaks in the audio input.

It should be noted that although speakers 212, 1106, 1208, 1308A, 1308B, 1408A and 1408B have all been depicted in their respective Figures as though they were single devices receiving a single channel of an audio signal from which to produce sound, as already alluded to in the later discussion of the acoustic drivers 3175, 3275 and 3375, those skilled in the art will readily recognize that each of these depicted components may represent a plurality of devices capable of producing sound. Indeed, each of these depicted components may represent a more complex device capable of producing sound, including speakers employing at least one crossover and/or a multitude of sound-producing elements. Furthermore, each of these depicted components may represent a sound-producing device in which further amplification and/or signal processing is employed. Also, in the various embodiments discussed herein in which a compressor, a gain control or other adjustable device capable of altering a signal providing audio to an amplifier or altering the amplification of such a signal, such compressor, gain control or other adjustable device may be provided with the ability to employ select and/or utilize preselected settings based on one or more characteristics of one or more known sound-producing devices. Such preselected settings may be utilized to provide the ability to automatically adjust the gain or output driving strength employed by an amplifier and/or the timing at which a compressor or a gain control may begin or cease acting on a signal representing an audio input in coordination with the use of a capacitor to boost the power provided to an amplifier.

In some embodiments, one of the circuits 2100, 2200 or 2300, or one of the circuits incorporating an amplifier that is depicted in one of the earlier Figures is disposed about the casing of an electronic device to produce sound from an audio signal (e.g., a docking station for a digital audio file player, a "boom box" audio device, a cell phone, a "satellite" speaker for a computer system, a pair of amplified headphones, an amplifying component of a home entertainment system, etc.). Such a casing may also incorporate one of the speakers 212, 1106, 1208, 1308A, 1308B, 1408A or 1408B, or one of the acoustic drivers 3175, 3275 or 3375, or may incorporate the ability for the electronic device to be coupled to one of these speakers or acoustic drivers.

Figure 21:
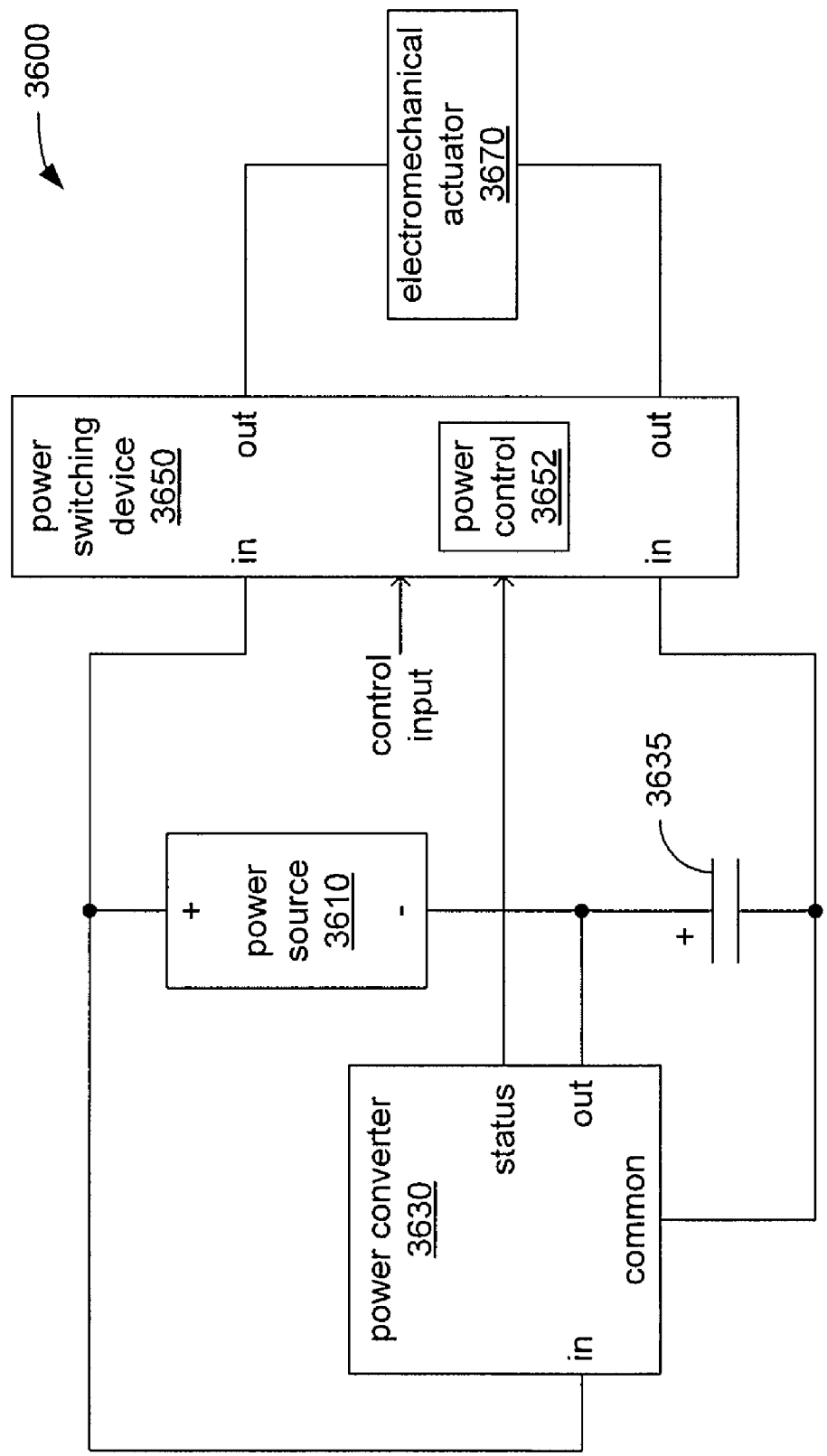
FIG. 21 is a circuit diagram of a power source, power converter and capacitive element coupled to an electromechanical actuator through a power switching device.

FIG. 21 depicts a circuit 3600 having an electromechanical actuator 3670 that is powered by a power source 3610 in series with a capacitor 3635 that is selectively charged by a power converter 3630. A power switching device 3650 is interposed between the electromechanical actuator 3670 and the supply of power provided by the power source 3610 and the capacitor 3635 to control the provision of power and/or the polarity of power to the electromechanical actuator 3670 in response to a control input. The coupling of anodes, cathodes and terminals among the power source 3610, the capacitor 3635 and the power converter 3630 in the circuit 3600 is substantially similar to that in the circuits 2100, 3100, 3200 and 3300 of FIGS. 15a, 17, 18 and 20, respectively. However, as those skilled in the art will readily recognize, the coupling of these anodes, cathodes and terminals may alternatively be made substantially similar to that in any of the circuits 2200-2400 of FIGS. 15b-15d, respectively. In a manner not unlike the loads and amplifiers of previously discussed circuits, the electromechanical actuator 3670 of the circuit 3600 is supplied with power (through the power switching device 3650) having a voltage that is the sum of the voltages output by the power source 3610 and the capacitor 3635. Also, the power converter 3630 of the circuit 3600 selectively charges the capacitor 3635 depending on the amount of current drawn by the electromechanical actuator 3670.

As was the case with previously discussed circuits, the power source 3610 may be any of a variety of other types of power source, and the power converter 3630 may be any of a variety of types of power converter. Further, the power converter 3630 may be capable of enabling energy stored in the capacitor 3635 to be returned to the power source 3610 upon the powering down of the circuit 3600. Also, the capacitor 3635 may be any of a variety of types of capacitive element, including more than one capacitive element.

The electromechanical actuator 3670 may be any of a variety of types of electromechanical device, including a rotary motor, a stepper motor, a linear motor, a solenoid, a relay, a contactor, a magnet, etc. Like the amplifiers discussed at length herein, there are moments where the electromechanical actuator 3670 momentarily requires a relatively greater amount of power, although for the electromechanical actuator 3670, such moments are usually associated with being actuated, changes in speed of movement, or changes in direction of movement.

Not unlike the circuit 2100 of FIG. 15a, in the circuit 3600 there are two current flows provided by the power source 3610 that flow out through the output terminal of the power converter 3630. A first current flows from the power source 3610, through the combination of the power switching device 3650 and the electromechanical actuator 3670, through the common and output terminals of the power converter 3630, and back to the power source 3610. A second current flows from the power source 3610, through the input and output terminals of the power converter 3630, and back to the power source 3610. The power converter 3630 imposes a limit on the amount of current that it permits to flow out through the output terminal, and the sum of these two current flows out through the output terminal is not permitted by the power converter 3630 to exceed this limit.

At times when the electromechanical actuator 3670 draws a relatively small amount of current, such that the limit of current flowing out through the output terminal of the power converter 3630 is not exceeded, both of the first and second current flows are able to take place without limits being imposed on them by the power converter 3630. As a result, the capacitor 3635 is charged, and the electromechanical actuator 3670 is supplied with power having a voltage equal to the sum of the full output voltage of the power source 3610 and the full capacity voltage of the capacitor 3635. However, at times when an obstruction or other mechanical interference/malfunction causes the electromechanical actuator 3670 to attempt to draw a relatively large amount of current, such that the limit of current flowing out through the output terminal of the power converter 3630 would be exceeded if this amount of current were permitted through the power converter, the second current flow is reduced as a greater proportion of the current flowing out through the output terminal is taken by the first current flow. As a result, the capacitor 3635 discharges, and while this discharging continues to take place, the power source 3610 is permitted to support the higher current draw of the electromechanical actuator 3670. Part of this higher current returns to the power source 3610 through the power converter 3630 and part through the capacitor 3635 such that the limit on current flow through the output terminal of the power converter is circumvented. As a result, voltage output by the power source 3610 is able to be initially maintained at the full output voltage of the power source 3610. However, after the capacitor 3635 has fully discharged, current no longer flows through the capacitor 3635, and so the amount of current that the power source 3610 is permitted to provide is limited by the limit imposed by the power converter 3630 on the flow of current out through its output terminal.

The storage capacity of the capacitor 3635 may be selected to be large enough to ensure that the time required to discharge the capacitor is sufficiently long as to accommodate the amount of time that the electromechanical actuator 3670 is expected to require a relatively greater amount of current during normal operation. Additionally or alternatively, the storage capacity of the capacitor 3635 may be selected to be small enough to ensure that the time required to discharge the capacitor is sufficiently limited to prevent the power source 3610 from being permitted to support a relatively higher current draw for too long a period of time such that the power source 3610 is damaged. Also, the limit on current flowing out through the output terminal of the power converter 3630 may be selected to control the amount of current that the power source 3610 is permitted to supply after the capacitor 3635 is discharged to prevent damage to the power source 3610.

In some embodiments, the power switching device 3650 may incorporate a power control 3652 capable of addressing instances in which the electromechanical actuator 3670 requires a relatively greater amount of current for an extended period of time longer than can be accommodated by the amount of time required to discharge the capacitor 3635 and/or the amount of time that the power source 3610 is able to supply a relatively greater amount of current without damage. The power control 3652 may respond to such an extended period of time for which a relatively greater amount of current is required by cutting off all power to the electromechanical actuator 3670, and after an interval of time, may attempt to reapply power to the electromechanical actuator 3670. Such a cutting off response may be desirable to protect the power source 3610 and/or the electromechanical actuator 3670 from damage due to instances of the electromechanical actuator 3670 being physically prevented from performing its function (e.g., debris or some other object being in the path of movement of the electromechanical actuator 3670, etc.).

To determine when the electromechanical actuator 3670 requires a relatively greater amount of current, the power control 3652 may monitor the amount of current drawn by the electromechanical actuator 3670 through the power switching device 3650, or the power control 3652 may receive a signal from the power converter 3630 indicating when the amount of current flowing out through its output terminal has reached the imposed limit. To determine when the capacitor 3635 has been discharged such that the power source 3610 is no longer permitted to supply a relatively greater amount of current, the power control 3652 may maintain a timer preset to an amount of time chosen to be coordinated with the amount of time required to discharge the capacitor 3635, or the power control 3652 may monitor the voltage provided to the electromechanical actuator 3670 for the decay of the voltage provided by the discharge of the capacitor 3635.

The power control 3652 may be coupled to a thermal sensor (not shown) monitoring the temperature of the electromechanical actuator 3670 and/or the capacitor 3635, or may employ a timer to determine how long to wait after cutting off all power to the electromechanical actuator 3670 before attempting to reapply power to the electromechanical actuator. Where a timer is used, the timer may be preset to an interval long enough to ensure a substantial recharging of the capacitor 3635.

Figure 22:
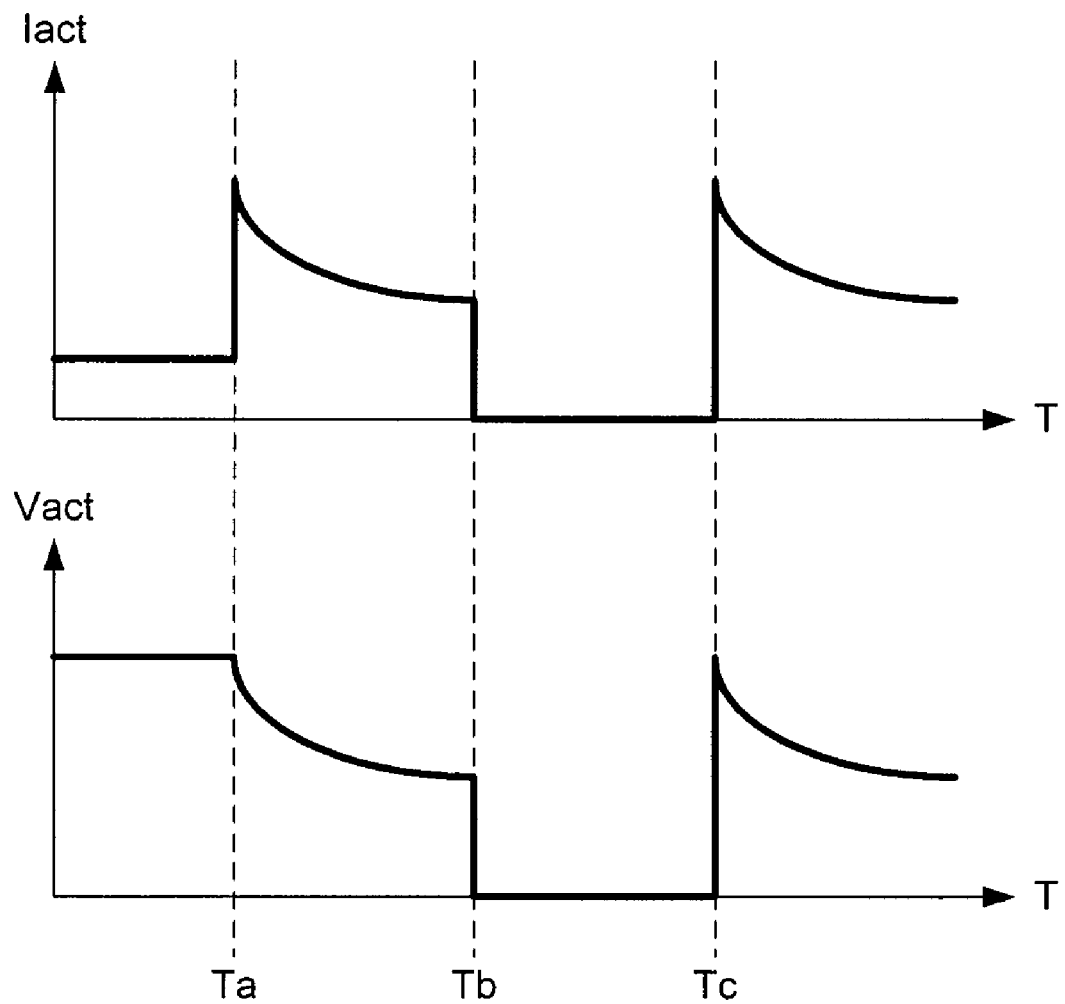
FIG. 22 is a time plot of electrical current and voltage provided to the mechanical actuator of FIG. 21.

FIG. 22 depicts the possible changes in the voltage (Vact) provided to the electromechanical actuator 3670 in the circuit 3600 as a result of changes in the current (Iact) drawn by the electromechanical actuator 3670, including the electromechanical actuator 3670 momentarily attempting to draw a requiring relatively greater Iact. At time Ta, a control input to the power switching device 3650 causes the power switching device 3650 to alter the application of power to the electromechanical actuator 3670 such that the electromechanical actuator 3670 requires a relatively greater Iact. From time Ta to time Tb, the capacitor 3635 discharges, initially allowing the power source 3610 to supply the relatively greater Iact. However, as the capacitor 3635 discharges, both Iact and Vact diminish as the voltage output and capacity for current flow of the capacitor 3635 drop towards zero. At time Tb, the power control 3652 responds to an impetus corresponding to the discharge of the capacitor 3635 (such as the drop in the voltage output of the capacitor 3635, a timer preset to a time corresponding to the amount of time required for the capacitor 3635 to fully discharge, etc.) by operating the power switch 3650 to cut power to the electromechanical actuator 3670 such that both Iact and Vact drop to zero.

The cutting off of power to the electromechanical actuator 3670 allows the capacitor 3635 to recharge, and after the passage of a period of time from time Tb to time Tc (a period of time that may be determined by any of a number of factors as previously discussed), the power control 3652 may operate the power switch 3650 to again attempt to operate the electromechanical actuator 3670 in the manner originally intended at time Ta.

It should be noted that although Iact and Vact are depicted in FIG. 22 as being at non-zero levels prior to Ta, those skilled in the art will readily recognize that whether these levels preceding time Ta are non-zero or at zero depends on the nature of the electromechanical actuator 3670 and the function it performs. Where the electromechanical actuator 3670 was already in operation at time Ta, and the higher Iact and Vact at time Ta are the result of a change in direction and/or speed, then non-zero levels preceding time Ta would be expected. However, where the electromechanical actuator was not already in operation at time Ta, then zero levels preceding time Ta would be expected.

Figure 23:
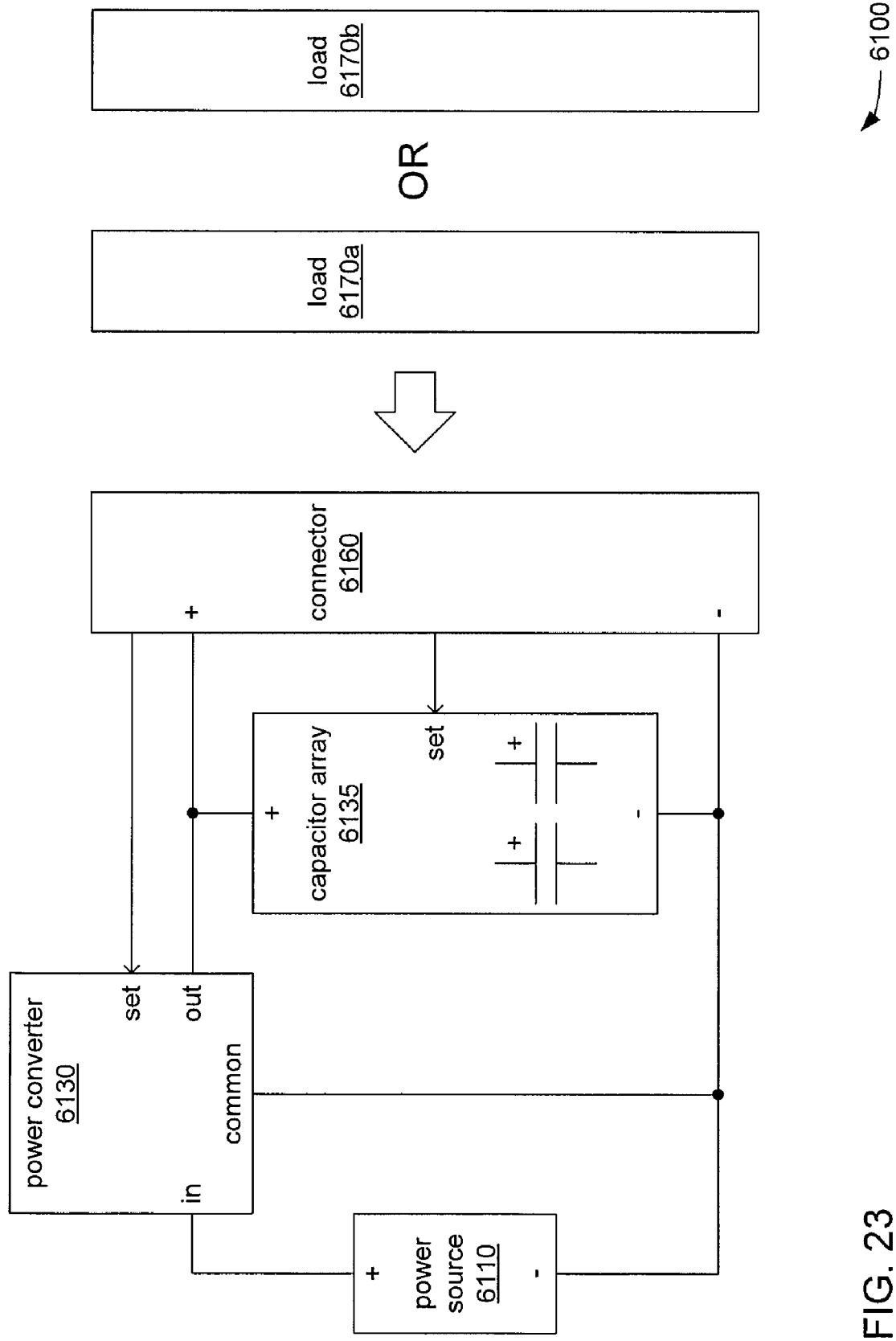
FIG. 23 is a circuit diagram of a power source and capacitor array coupled in parallel through a power converter, and further coupled through a connector to a load, with the load providing an indication of a setting through the connector.

FIG. 23 depicts a circuit 6100 in which a power source 6110 is coupled in parallel with a capacitor array 6135 through a power converter 6130 to supply power through a connector 6160 to one or the other of a pair of detachable loads 6170a and 6170b, either one of which could be connected to the connector 6160. The power converter 6130 may be configured to cause one or more capacitors within the capacitor array 6135 to be selectively charged and discharged in response to the amount of current drawn by whichever one of the loads 6170a and 6170b is connected to the connector 6160 by imposing a predetermined limit on the amount of current that may be drawn through the output terminal of the power converter 6130. In some embodiments, each of the loads 6170a and 6170b, while connected to the connector 6160, provides an indication to the power converter 6130 of a setting for the predetermined limit that is compatible with whichever one of the loads 6170a and 6170b is connected to the connector 6160. In some embodiments, each of the loads 6170a and 6170b, while connected to the connector 6160, provides an indication to the capacitor array 6135 of a configuration of interconnections between the capacitors of the capacitor array 6135 that is compatible with whichever one of the loads 6170a and 6170b is connected to the connector 6160. Thus, the setting of the predetermined limit imposed by the power converter 6130 and/or the configuration of interconnections between the capacitors of the capacitor array 6135 occurs automatically upon the connection of a load to the connector 6160.

In the circuit 6100, the anode of the capacitor array 6135 is coupled to the anode of the power source 6110 through the power converter 6130, and the cathode of the capacitor array 6135 is directly coupled to the cathode of the power source 6110. The input terminal of the power converter 6130 is coupled to the anode of the power source 6110, the output terminal of the power converter 6130 is coupled to the anode of the capacitor array 6135, and the common terminal of the power converter 6130 is coupled to the cathodes of the capacitor array 6135 and the power source 6110. When connected to the connector 6160, one pole of one or the other of the loads 6170a and 6170b becomes coupled to the anode of the capacitor array 6135 and to the output terminal of the power converter 6130, while the other pole becomes coupled to the cathodes of the capacitor array 6135 and the power source 6110, as well as the common terminal of the power converter 6130. Thus, whichever one of the loads 6170a and 6170b are connected to the connector 6160 becomes connected to both the capacitor array 6135 and the power source 6110 in parallel.

The power source 6110 may be a battery, a power source providing DC output from an AC main, a power feed provided from an external device (e.g., cabling conveying power in additional to digital serial communications from an electronic device such as a computer), or any of a variety of other types of power source. Although the power converter 6130 is preferably a buck converter, those skilled in the art will readily understand that other types of power converter may be used.

In various embodiments, the automatic setting of the predetermined limit imposed by the power converter 6130 on current flowing out through the output terminal in response to the connection of a load to the connector 6160 is brought about by any of a number of possible mechanisms. Possible mechanisms include, and are not limited to, at least one resistor carried by a load that forms part of a voltage divider to provide the power converter 6130 with a signal at a specific voltage level, selectively grounding and/or shunting to a high voltage level at least one contact of the connector 6160 that is coupled to the power converter 6130, or provision of a digital code by a load connected to the connector 6160 that indicates a setting.

The capacitors making up the capacitor array 6135 may be of any of a variety of types of capacitive element, including super capacitors or ultra capacitors. The configuration of interconnections between the capacitors within the capacitor array 6135 is meant to be alterable in response whichever one of the loads 6170a and 6170b is connected to the connector 6160, which thereby provides an indication of a particular configuration of capacitor interconnections to be adopted within the capacitor array 6135. Possible configurations of interconnections may include connecting multiple capacitors in series, connecting multiple capacitors in parallel, and/or either increasing or decreasing the quantity of capacitors that are used. In embodiments having enough capacitors within the capacitor array 6135, the possible configurations of interconnections may further include connecting multiple sets of capacitors in series where the capacitors in each set are connected in parallel.

In various embodiments, the automatic configuration of interconnections between the capacitors of the capacitor array 6135 in response to the connection of a load to the connector 6160 is brought about by any of a number of possible mechanisms. Possible mechanisms include, and are not limited to, pluralities of relays or contactors associated with the capacitor array 6135, banks of switches operated by a mechanical actuator associated with the connector 6160, magnetic switches operated by one or more magnets brought into proximity with the connector 6160, and various forms of transistor or other semiconductor switching devices associated with the capacitor array 6135. In some embodiments, a load connected to the connector 6160 may provide an analog or digital signal that is interpreted by a controlling device such as a microprocessor or microcontroller that in turn operates mechanical and/or semiconductor switching devices to bring about a configuration of capacitor interconnections indicated by the signal. In other embodiments, anodes and/or cathodes of multiple capacitors within the capacitor array 6135 are coupled to multiple contacts of the connector 6160, and a load connected to the connector 6160 selectively couples various ones of those contacts to thereby directly interconnect those capacitors in a configuration compatible with that load.

Furthermore, in some embodiments, there may be a default predetermined limit on current flow imposed by the power converter 6130 and/or there may be a default configuration of capacitor interconnections for the capacitors of the capacitor array 6135 that is automatically resorted to where a load is connected to the connector 6160, but provides no indication of a setting for the predetermined limit and/or no indication of a configuration of capacitor interconnections. Regardless of whether or not a given load connected to the connector 6160 actually provides one or more of such indications, the provision of the capability to allow a load to provide such indications enables the power converter 6130 and/or the capacitor array 6135 to be readied to provide that load with an amount of current flow and/or a voltage level that is compatible with the power requirements of that load. Furthermore, these indications are able to be provided without configuration steps being taken by a person who connects a load to the connector 6160, thereby removing an opportunity for human error. In embodiments where the capacitors of the capacitor array 6135 are each able to operate only at a specific voltage or within a relatively narrow range of voltages, and yet the circuit 6100 is desired to be able to supply power to loads with very different voltage requirements, the automatic configuration of capacitor interconnections may be employed to avoid damage to the capacitors and/or a load connected to the connector 6160.

In some embodiments, the capacitor array 6135 may serve merely to provide filtering of power supplied to one or the other of the loads 6170a and 6170b. In such embodiments, the indications of settings provided by one or the other of the loads 6170a and 6170b may be limited to specifying a compatible voltage for the capacitors of the capacitor array 6135 to be interconnected in a configuration that would match that voltage, and/or to specifying a compatible amount of current for the predetermined limit on current flow imposed by the power converter 6130 to be set to. Additionally and/or alternatively, such indications may be received and compared to known limitations of the power source 6110 to determine if the power requirements indicated by one or the other of the loads 6170a and 6170b can be met. Where such power requirements cannot be met, various actions may be taken in response, including and not limited to, providing some form of error or warning indication to the person connecting a load to the connector 6160, and/or disabling the operation of the power converter 6130 and/or some other power-related component such that no power is provided to that load.

However, in other embodiments, the capacitor array 6135 may cooperate with the power converter 6130 to provide support for temporary increases in current drawn by one or the other of the loads 6170a and 6170b. In such other embodiments, a load connected to the connector 6160 may provide indications of a setting for the predetermined limit on current flow imposed by the power converter 6130 and/or of a configuration of capacitor interconnections selected to tailor the support for temporary increases of current to achieve one or more specific characteristics (e.g., a desired current flow, a desired voltage level, a desired capacitor discharge time, etc.). Alternatively, in such other embodiments, a load connected to the connector 6160 may provide one or more values in a digitally encoded form that directly specify one or more of such characteristics desired to be met in providing for such temporary increases, and a microprocessor or microcontroller may employ such digitally encoded values to determine settings to be given to the power converter 6130 and/or the capacitor array 6135.

As previously mentioned, the predetermined limit on current flowing out through the output terminal of the power converter 6130 may be used to cause the capacitor array 6135 to be selectively charged and discharged depending on the amount of current drawn by a load connected to the connector 6160, and thereby allow the capacitor array 6135 to provide support for temporary increases in power. At times when a load connected to the connector 6160 draws a relatively small amount of current, such that the limit of current flowing out through the output terminal of the power converter 6130 is not exceeded, current from the power source 6110 is able to flow out through the output terminal without limits being imposed on it by the power converter 6130, and with a portion of that current used to charge capacitors of the capacitor array 6135. However, at times when a load connected to the connector 6160 attempts to draw a relatively large amount of current such that the limit of current flowing out through the output terminal of the power converter 6130 would be exceeded if this amount of current were permitted through the power converter 6130, the flow of current out through the output terminal becomes limited by the power converter 6130 to an amount less than the connected load is attempting to draw. The capacitor array 6135 then discharges which allows at least a portion of the higher current draw of the load 6170 to be partially supported by allowing that portion to be drawn through the capacitor array 6135 for up to the amount of time required for the capacitors of the capacitor array 6135 to discharge, thereby briefly circumventing the predetermined limit imposed by the power converter 6130.

Figure 24:
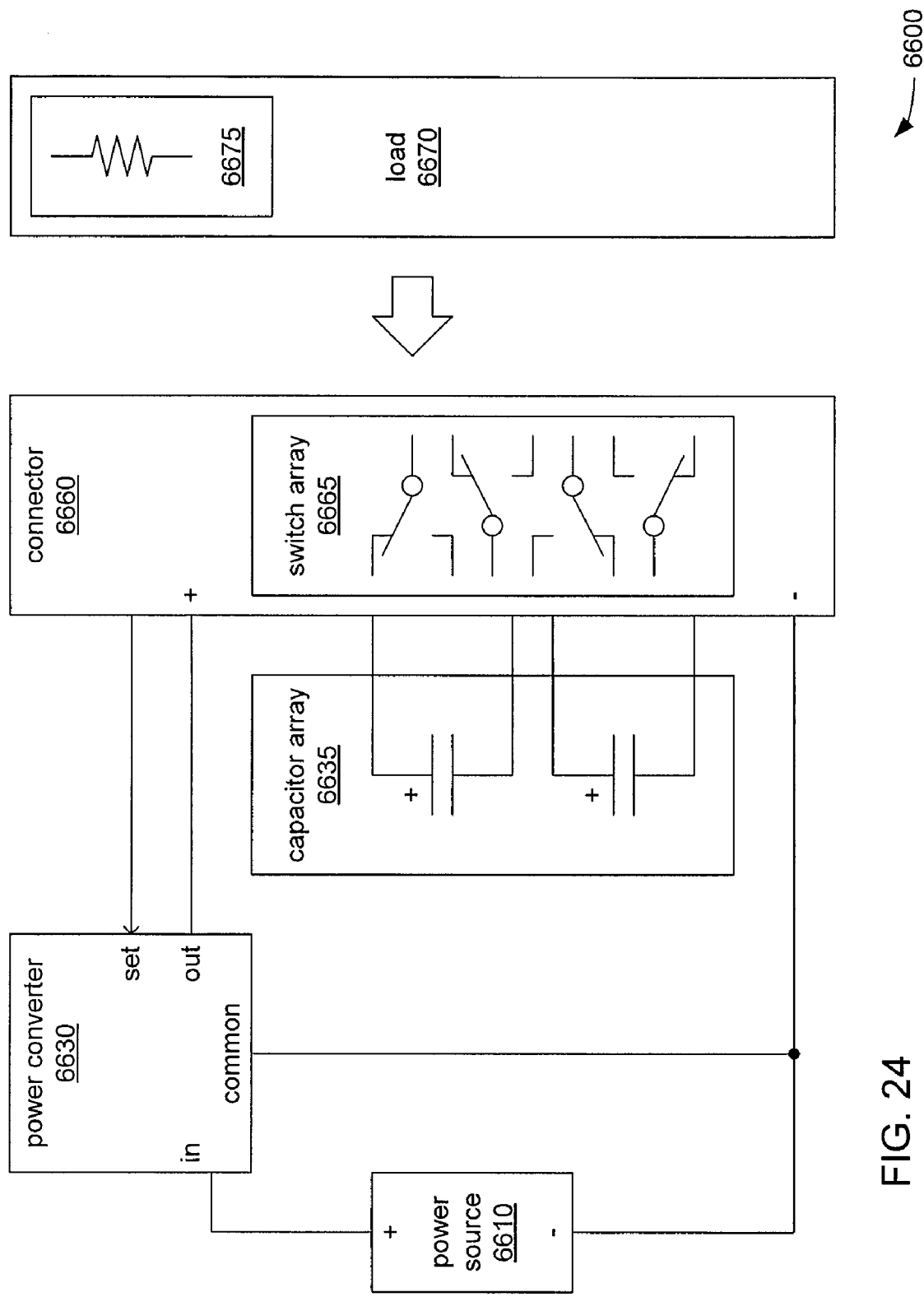
FIG. 24 is a circuit diagram of a power source and capacitor array coupled in parallel through a power converter, and further coupled through a connector to a load, with the load providing an indication of a setting to the power converter and a switch array.

FIG. 24 depicts a circuit 6600 in which a specific example of a load 6670 providing indications of settings for a predetermined limit on current flow and/or a configuration of capacitor interconnections is shown. The circuit 6600 is substantially similar to the circuit 6100 of FIG. 23, most notably in that a power source 6610 is coupled in parallel with a capacitor array 6635 through a power converter 6630 to supply power through a connector 6660 to a detachable load 6670 when the load 6670 is connected to the connector 6660. Furthermore, not unlike the power converter 6130 of the circuit 6100, the power converter 6630 of the circuit 6600 may be configured to cause one or more capacitors within the capacitor array 6635 to be selectively charged and discharged in response to the amount of current drawn by the load 6670 by imposing a predetermined limit on the amount of current that may be drawn through the output terminal of the power converter 6630.

The circuit 6600 illustrates an approach to setting a configuration of interconnections between capacitors within the capacitor array 6635 through a multitude of switches making up a switch array 6665 incorporated into the connector 6660. Those skilled in the art of connector design will be familiar with connectors having one or more built-in switching devices that are caused to change state depending upon whether that connector is connected to another connector through a mechanical interaction between the two connectors. A commonplace example of this is a 3.5 mm diameter female headphone connector provided by an appliance that outputs audio through a built-in speaker unless a 3.5 mm diameter male connector of a pair of headphones is inserted into the female headphone connector, and the audio is redirected by a switch within the female headphone connector from that speaker and to the headphones. In the case of the connector 6660, a mechanical interaction between the connector 6660 and a mating connector incorporated into the load 6670 causes individual switches within the switch array 6665 to be set to various predetermined states. The individual capacitors of the capacitor array 6635 are coupled to various ones of these individual switches of the switch array 6665, and through the predetermined states set by the mechanical interaction between the connector 6660 and the connector incorporated into the load 6670, those individual capacitors are interconnected in a chosen configuration.

In some embodiments, it may be possible through a mechanical interaction between the connector 6660 and the load 6670 to set one or more switches within the switch array 6665 to selectively disconnect one or more of the capacitors of the capacitor array 6635 to either reduce the quantity of capacitors employed or to entirely disconnect all of those capacitors from the rest of the circuit 6600. This may be done if it is deemed desirable to reduce the overall capacitance in parallel with the load 6670, or if neither filtering of power provided to the load 6670 or brief increases in current is desired.

The circuit 6600 also illustrates an approach to setting a predetermined limit imposed by the power converter 6630 on an amount of current flowing out through its output terminal through a resistor 6675 that is coupled to the power converter 6630 when the load 6670 is connected to the connector 6660. The resistor 6675 is incorporated into the load 6670, and in various embodiments, may be coupled to a ground or a voltage supply, such as a voltage provided by the power source 6610 when the load 6670 is connected to the connector 6660. The resistance of the resistor 6675 may be selected to provide the indication of a setting for the predetermined limit, and in some embodiments, the resistor 6675 may be a potentiometer allowing for the fine tuning of its resistance, and thereby allowing for the fine tuning of the predetermined limit. In being coupled to the power converter 6630 through the connector 6660, the resistor 6675 may, in some embodiments, form a voltage divider with another resistor also coupled to the power converter 6630, or in some other way either draw current from or convey current to a current limit setting input of the power converter 6630.

Figure 25:
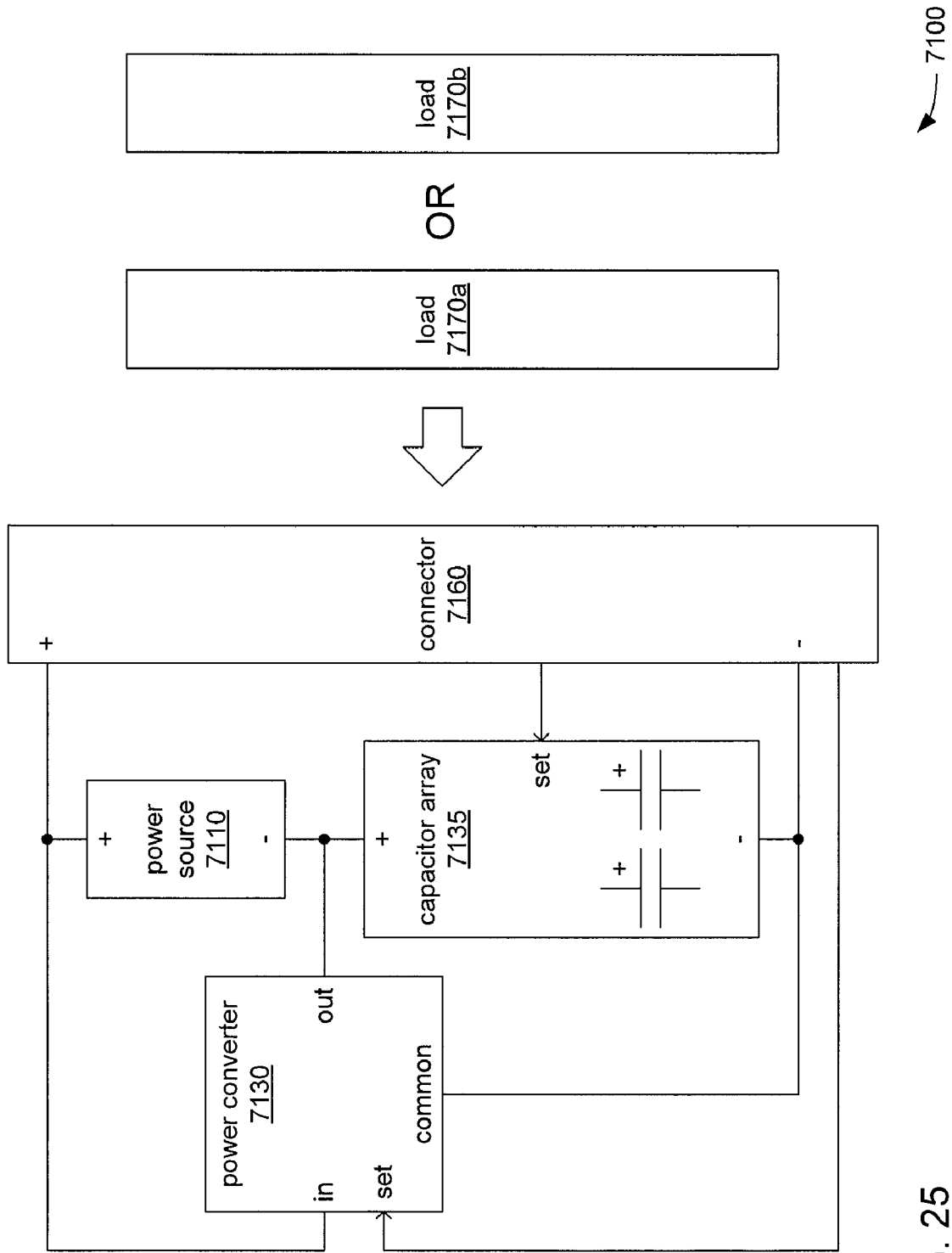
FIG. 25 is a circuit diagram of a power source and capacitor array coupled in series, and further coupled through a connector to a load, with the load providing an indication a of setting through the connector.

FIG. 25 depicts a circuit 7100 in which a power source 7110 is coupled in series with a capacitor array 7135 to supply power through a connector 7160 to one or the other of a pair of detachable loads 7170a and 7170b, either one of which could be connected to the connector 7160. The voltage provided to whichever one of the loads 7170a and 7170b is attached to the connector 7160 is the sum of the voltages across the power source 7110 and the capacitor 7135. The power converter 7130 is configured to cause one or more capacitors within the capacitor array 7135 to be selectively charged and discharged in response to the amount of current drawn by whichever one of the loads 7170a and 7170b is connected to the connector 7160 by imposing a predetermined limit on the amount of current that may be drawn through the output terminal of the power converter 7130. Not unlike the circuit 6100, in some embodiments of the circuit 7100, each of the loads 7170a and 7170b, while connected to the connector 7160, provides an indication to the power converter 7130 of a setting for the predetermined limit that is compatible with whichever one of the loads 7170a and 7170b is connected to the connector 7160. In some embodiments, each of the loads 7170a and 7170b, while connected to the connector 7160, provides an indication to the capacitor array 7135 of a configuration of interconnections between the capacitors of the capacitor array 7135 that is compatible with whichever one of the loads 7170a and 7170b is connected to the connector 7160.

In the circuit 7100, the cathode of the power source 7110 is coupled to the anode of the capacitor array 7135, and through the connector 7160, the anode of the power source 7110 and the cathode of the capacitor array 7135 are each coupled to a pole of whichever one of the loads 7170a and 7170b is connected to the connector 7160. The input terminal of the power converter 7130 is coupled to the anode of the power source 7110, the output terminal of the power converter 7130 is coupled to the cathode of the power source 7110 and the anode of the capacitor array 7135, and the common terminal of the power converter 7130 is coupled to the cathode of the capacitor array 7135.

Not unlike the circuit 6100, the automatic setting of the predetermined limit imposed by the power converter 7130 on current flowing out through the output terminal in response to the connection of a load to the connector 7160 is brought about by any of a number of possible mechanisms in various possible embodiments. Possible mechanisms include, and are not limited to, at least one resistor carried by a load that forms a voltage divider to provide the power converter 7130 with a signal at a specific voltage level, selectively grounding and/or shunting to a high voltage level at least one contact of the connector 7160 that is coupled to the power converter 7130, and provision of a digital code by a load connected to the connector 7160 that indicates a setting.

The configuration of interconnections between the capacitors within the capacitor array 7135 is meant to be alterable in response whichever one of the loads 7170a and 7170b is connected to the connector 7160, which thereby provides an indication of a particular configuration of capacitor interconnections to be adopted within the capacitor array 7135. Possible configurations of interconnections may include connecting multiple capacitors in series, connecting multiple capacitors in parallel, and/or either increasing or decreasing the quantity of capacitors that are used. In embodiments having enough capacitors within the capacitor array 7135, the possible configurations of interconnections may further include connecting multiple sets of capacitors in series where the capacitors in each set are connected in parallel.

Also not unlike the circuit 6100, the automatic configuration of interconnections between the capacitors of the capacitor array 7135 in response to the connection of a load to the connector 7160 is brought about by any of a number of possible mechanisms. Possible mechanisms include, and are not limited to, pluralities of relays or contactors associated with the capacitor array 7135, banks of switches operated by a mechanical actuator associated with the connector 7160, magnetic switches operated by one or more magnets brought into proximity with the connector 7160, and various forms of transistor or other semiconductor switching devices associated with the capacitor array 7135. In some embodiments, a load connected to the connector 7160 may provide an analog or digital signal that is interpreted by a controlling device such as a microprocessor or microcontroller that in turn operates mechanical and/or semiconductor switching devices to bring about a configuration of capacitor interconnections indicated by the signal. In other embodiments, anodes and/or cathodes of multiple capacitors within the capacitor array 7135 are coupled to multiple contacts of the connector 7160, and a load connected to the connector 7160 selectively couples various ones of those contacts to thereby directly interconnect those capacitors in a configuration compatible with that load.

Furthermore, in some embodiments, there may be a default predetermined limit on current flow imposed by the power converter 7130 and/or there may be a default configuration of capacitor interconnections for the capacitors of the capacitor array 7135 that is automatically resorted to where a load is connected to the connector 7160, but provides no indication of a setting for the predetermined limit and/or no indication of a configuration of capacitor interconnections. Regardless of whether or not a given load connected to the connector 7160 actually provides one or more of such indications, the provision of the capability to allow a load to provide such indications enables the power converter 7130 and/or the capacitor array 7135 to be readied to provide that load with an amount of current flow and/or a voltage level that is compatible with the power requirements of that load. Furthermore, these indications are able to be provided without configuration steps being taken by a person who connects a load to the connector 7160, thereby removing an opportunity for human error.

The capacitor array 7135 cooperates with the power converter 7130 to provide support for temporary increases in current drawn by one or the other of the loads 7170a and 7170b. A load connected to the connector 7160 may provide indications of a setting for the predetermined limit on current flow imposed by the power converter 7130 and/or of a configuration of capacitor interconnections selected to tailor the support for temporary increases of current to achieve one or more specific characteristics (e.g., a desired current flow, a desired voltage level, a desired capacitor discharge time, etc.). Alternatively, a load connected to the connector 7160 may provide one or more values in a digitally encoded form that directly specify one or more of such characteristics desired to be met in providing for such temporary increases, and a microprocessor or microcontroller may employ such digitally encoded values to determine settings to be given to the power converter 7130 and/or the capacitor array 7135.

As previously mentioned, the predetermined limit on current flowing out through the output terminal of the power converter 7130 is used to cause the capacitor array 7135 to be selectively charged and discharged depending on the amount of current drawn by a load connected to the connector 7160, and thereby allow the capacitor array 7135 to provide support for temporary increases in power. At times when a load connected to the connector 7160 draws a relatively small amount of current, such that the limit of current flowing out through the output terminal of the power converter 7130 is not exceeded, current from the power source 7110 is able to flow out through the output terminal without limits being imposed on it by the power converter 7130, and with a portion of that current used to charge capacitors of the capacitor array 7135. However, at times when a load connected to the connector 7160 attempts to draw a relatively large amount of current, such that the limit of current flowing out through the output terminal of the power converter 7130 would be exceeded if this amount of current were permitted through the power converter 7130, the flow of current out through the output terminal becomes limited by the power converter 7130 to an amount less than the connected load is attempting to draw. The capacitor array 7135 then discharges which allows at least a portion of the higher current draw of the load 7170 to be partially supported by the capacitor array 7135 by flowing through the capacitor array 7135 for up to the amount of time required for the capacitors of the capacitor array 7135 to discharge, thereby briefly circumventing the predetermined limit on current flow imposed by the power converter 7130.

Figure 26:
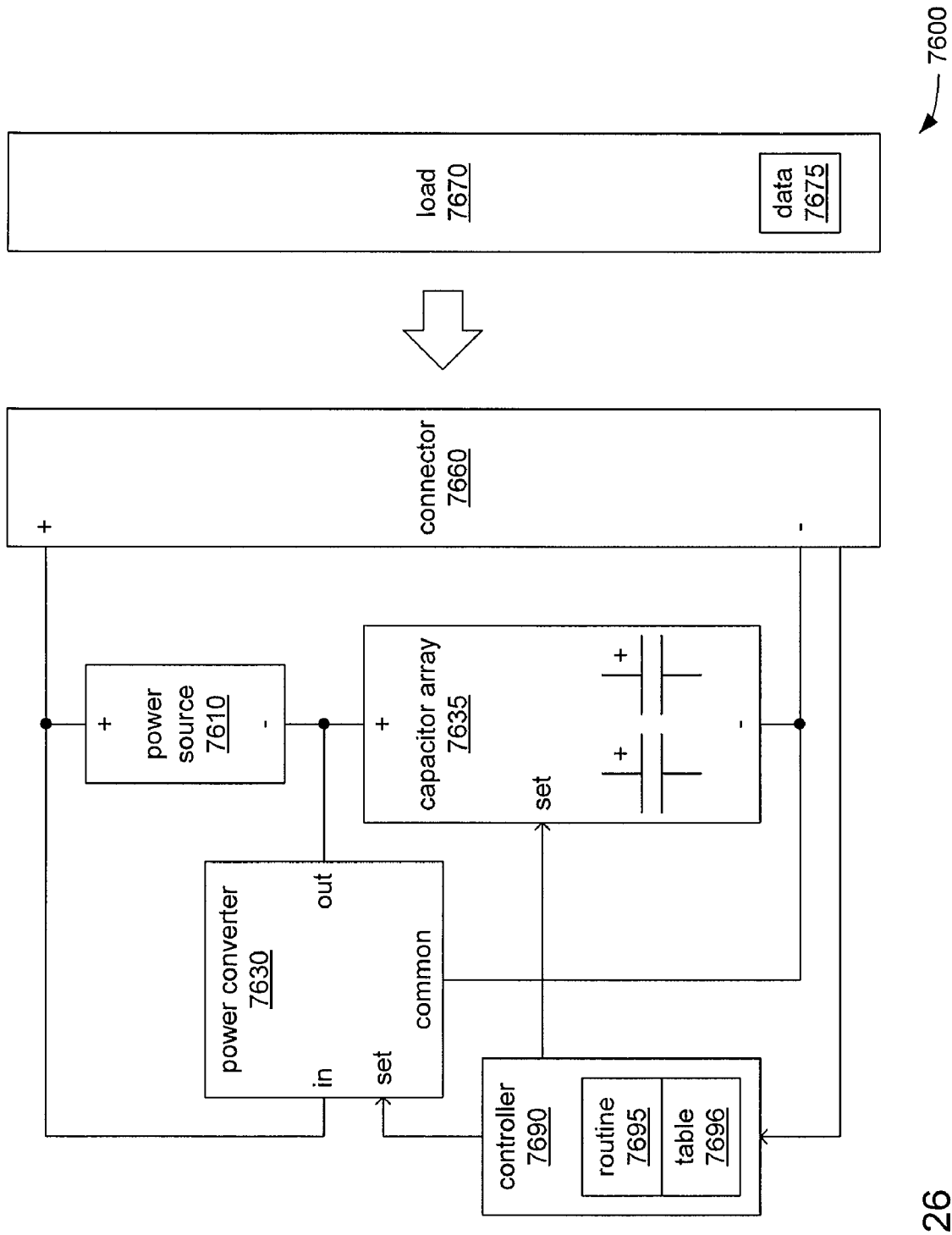
FIG. 26 is a circuit diagram of a power source and capacitor array coupled in series, and further coupled through a connector to a load, with the load providing a code indicating a setting to a controller.

FIG. 26 depicts a circuit 7600 in which a specific example of a load 7670 providing indications of settings for a predetermined limit on current flow and/or a configuration of capacitor interconnections is shown. The circuit 7600 is substantially similar to the circuit 7100 of FIG. 25, most notably in that a power source 7610 is coupled in series with a capacitor array 7635 to supply power through a connector 7660 to a detachable load 7670 when the load 7670 is connected to the connector 7660. Furthermore, not unlike the power converter 7130 of the circuit 7100, a power converter 7630 of the circuit 7600 is configured to cause one or more capacitors within the capacitor array 7635 to be selectively charged and discharged in response to the amount of current drawn by the load 7670 by imposing a predetermined limit on the amount of current that may be drawn through the output terminal of the power converter 7630.

The circuit 7600 illustrates an approach to setting a configuration of interconnections between capacitors within the capacitor array 7635 and setting the predetermined limit imposed by the power converter 7630 through a piece of data 7675 stored within a storage device incorporated into the load 7670 being conveyed through the connector 7660 and to a controller 7690. In some embodiments, the piece of data 7675 is a code for which a corresponding entry exists in a table 7696 in a storage device associated with or incorporated into the controller 7690, and that entry provides specific settings for the power converter 7630 and/or the capacitor array 7635. Whether such settings are retrieved from the table 7696 or are provided directly in the data 7675, a processing device (e.g., a microprocessor, microcontroller, sequencer, etc.) of the controller 7690 retrieves from a storage device and executes a sequence of instructions making up a routine 7695 that causes the controller to receive the data 7675, and in response, signal the power converter 7630 and/or the capacitor array 7635 to configure one or both of them to desired settings.

More specifically, in response to receiving the piece of data 7675, the controller 7690 is caused by the execution of the routine 7695 to operate switching devices associated with (perhaps incorporated into) the capacitor array 7635 to set a configuration of capacitor interconnections between multiple capacitors within the capacitor array 7635. Also in response to receiving the piece of data 7675, the controller 7690 is caused by the execution of the routine 7695 to signal the power converter 7630 to set the predetermined limit that it imposes on current flowing out through the output terminal. In some embodiments, execution of the routine 7695 may further cause the controller 7690 to signal the load 7670 with an indication of whether or not the predetermined limit of the power converter 7630 and/or the configuration of capacitor interconnections of the capacitor array 7635 have been done as specified. Such a signal to the load 7670 may be used to provide an indication of an error condition, such as when one or more settings specified by the load 7670 cannot somehow be achieved. Receipt of such an error signal by the load 7670 may prompt the load 7670 to send another signal that possibly specifies one or more alternate settings, and/or specifies a different code corresponding to a different entry in the table 7696.

Still further, in some embodiments, the controller 7690 may be further caused by the routine 7695 to engage in controlling the limit imposed by the power converter 7630 as part of preventing damage to either the power source 7610 or a load connected to the connector 7660. Upon detecting the connection of a load to the connector 7660, the controller 7690 may initially be caused to reduce the limit imposed by the power converter 7630 to zero or a sufficiently low level to prevent a sudden rise in current drawn from the power source 7610 as a result of the connection. Then, within a relatively short period of time, thereafter, the controller 7690 may then raise the limit to a predetermined default level until the piece of data 7675 is received, or the controller 7690 may first wait until the piece of data 7676 is received before raising the limit. Alternatively and/or additionally, the controller 7690 may be caused to operate the capacitor array 7635 to disconnect the capacitor array 7635 for a relatively short period of time. Still other approaches to limiting current output from either the power source 7610 or the capacitor array 7635 may be employed depending on characteristics of the loads to be connected, the power source 7610 and/or the capacitors of the capacitor array 7635.

Figure 27:
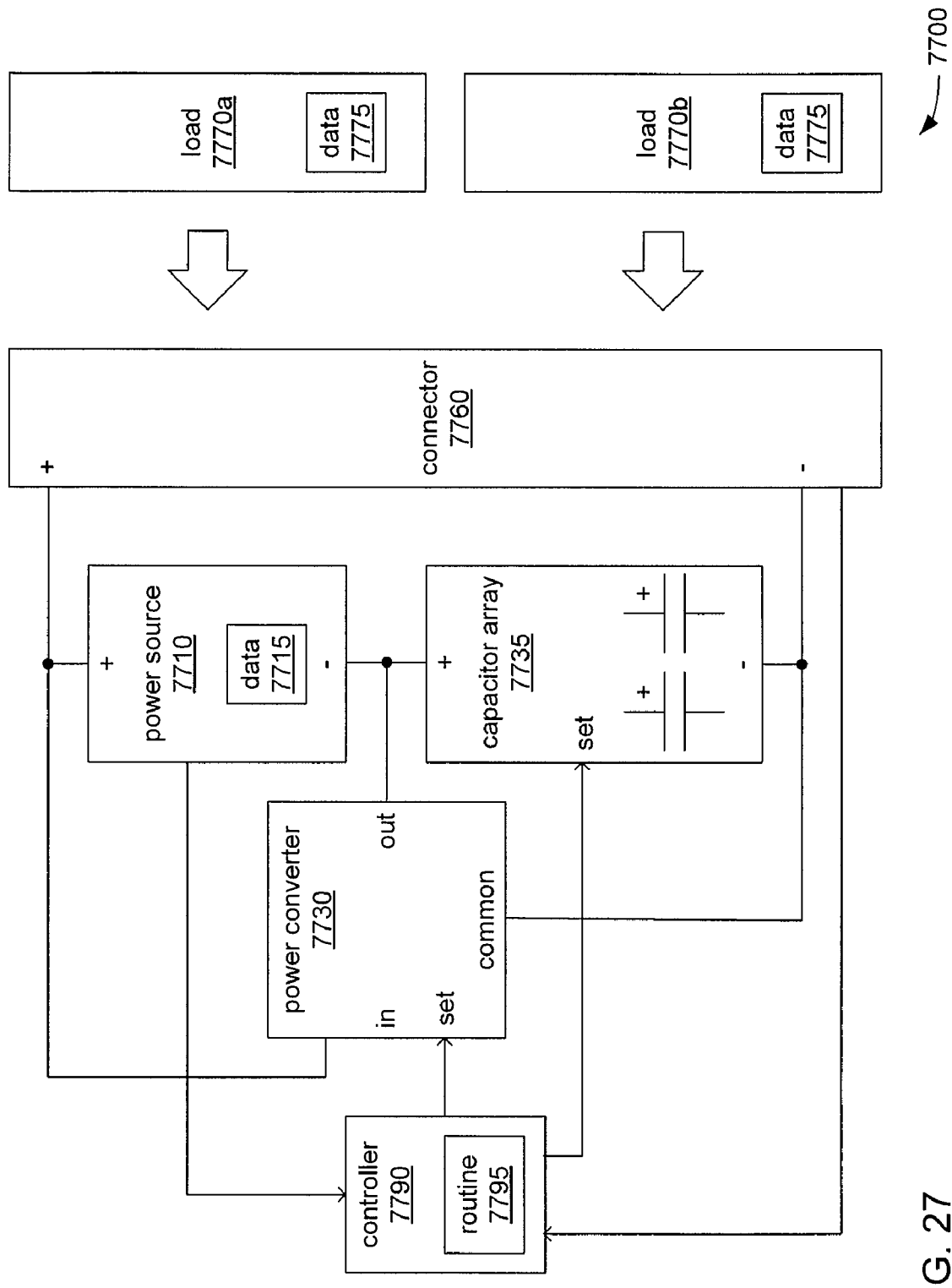
FIG. 27 is a circuit diagram of a power source and capacitor array coupled in series, and further coupled through a connector to one or more loads, with the power source and the load providing indications of settings to a controller.

FIG. 27 depicts a circuit 7700 in which a specific example of one or both of loads 7770a and 7770b providing indications of settings for a predetermined limit on current flow and/or a configuration of capacitor interconnections is shown. The circuit 7700 is substantially similar to the circuit 7100 of FIG. 25, most notably in that a power source 7710 is coupled in series with a capacitor array 7735 to supply power through a connector 7760 to one or more of the detachable loads 7770a and 7770b when connected to the connector 7760. Furthermore, not unlike the power converter 7130 of the circuit 7100, a power converter 7730 of the circuit 7700 is configured to cause one or more capacitors within the capacitor array 7735 to be selectively charged and discharged in response to an amount of current drawn by imposing a predetermined limit on the amount of current that may be drawn through the output terminal of the power converter 7730. However, a significant difference between the circuit 7100 of FIG. 25 and the circuit 7700 is that in the circuit 7700, more than one of the loads 7770a and 7770b may be connected to the connector 7760 at the same time.

Not unlike the circuit 7600, the circuit 7700 illustrates an approach to setting a configuration of interconnections between capacitors within the capacitor array 7735 and setting the predetermined limit imposed by the power converter 7730 through a piece of data 7775 stored within a storage device incorporated into each of the loads 7770a and 7770b being conveyed through the connector 7760 and to a controller 7790. A processing device (e.g., a microprocessor, microcontroller, sequencer, etc.) of the controller 7790 retrieves from a storage device and executes a sequence of instructions making up a routine 7795 that causes the controller to receive pieces of data 7775 from one or both of the loads 7770a and 7770b, and in response, signal the power converter 7730 and/or the capacitor array 7735 to configure one or both of them to desired settings. In so doing, the execution of instructions of the routine 7795 may further cause the controller 7790 to perform one or more calculations to determine what those desired settings should be, especially where both of the loads 7770a and 7770b are connected to the connector 7760 such that pieces of data 7775 are received from both of these loads.

Where in performing such calculations, the controller 7790 determines that it is not possible to provide for the power requirements of both of the loads 7770a and 7770b, the controller 7790 may respond in a number of ways intended to prevent damage to components and/or to signal a user of the circuit 7700 of the situation. In some embodiments, the controller 7790 may take a default course of action such as disabling the power converter 7730 and/or some other portion of the circuit 7700 to provide no power to any load connected to the connector 7760. In other embodiments where there is the ability to selectively power less than all of whatever loads may be connected to the connector 7760, the controller 7790 may select one or more of such loads to not be powered as needed to avoid damaging components.

Furthermore, the circuit 7700 illustrates the controller 7790 receiving an additional piece of data 7715 from the power source 7710. The piece of data 7715 may specify one or more characteristics of the power source 7710, such as limitations on current capacity, safe operating voltage range, rate of charging, etc. Where the controller 7790 receives both the piece of data 7715 from the power source 7710 and one or more pieces of data 7775 from one or both of the loads 7770a and 7770b, the controller 7790 may be caused by the execution of the routine 7795 to perform one or more comparisons and/or calculations to determine whether or not the power requirements of whichever ones of the loads 7770a and 7770b are connected to the connector 7760 are able to be supported given the capabilities of the power source 7710.

Still further, in some embodiments, the controller 7790 may be further caused by the routine 7795 to engage in controlling the limit imposed by the power converter 7730 as part of preventing damage to either the power source 7710 or a load connected to the connector 7760. Upon detecting the connection of a load to the connector 7760, the controller 7790 may initially be caused to reduce the limit imposed by the power converter 7730 to zero or a sufficiently low level to prevent a sudden rise in current drawn from the power source 7710 as a result of the connection. Then, within a relatively short period of time, thereafter, the controller 7790 may then raise the limit to a predetermined default level until the piece of data 7775 is received, or the controller 7790 may first wait until the piece of data 7676 is received before raising the limit. Alternatively and/or additionally, the controller 7790 may be caused to operate the capacitor array 7735 to disconnect the capacitor array 7735 for a relatively short period of time. Still other approaches to limiting current output from either the power source 7710 or the capacitor array 7735 may be employed depending on characteristics of the loads to be connected, the power source 7710 and/or the capacitors of the capacitor array 7735.

Figure 28:
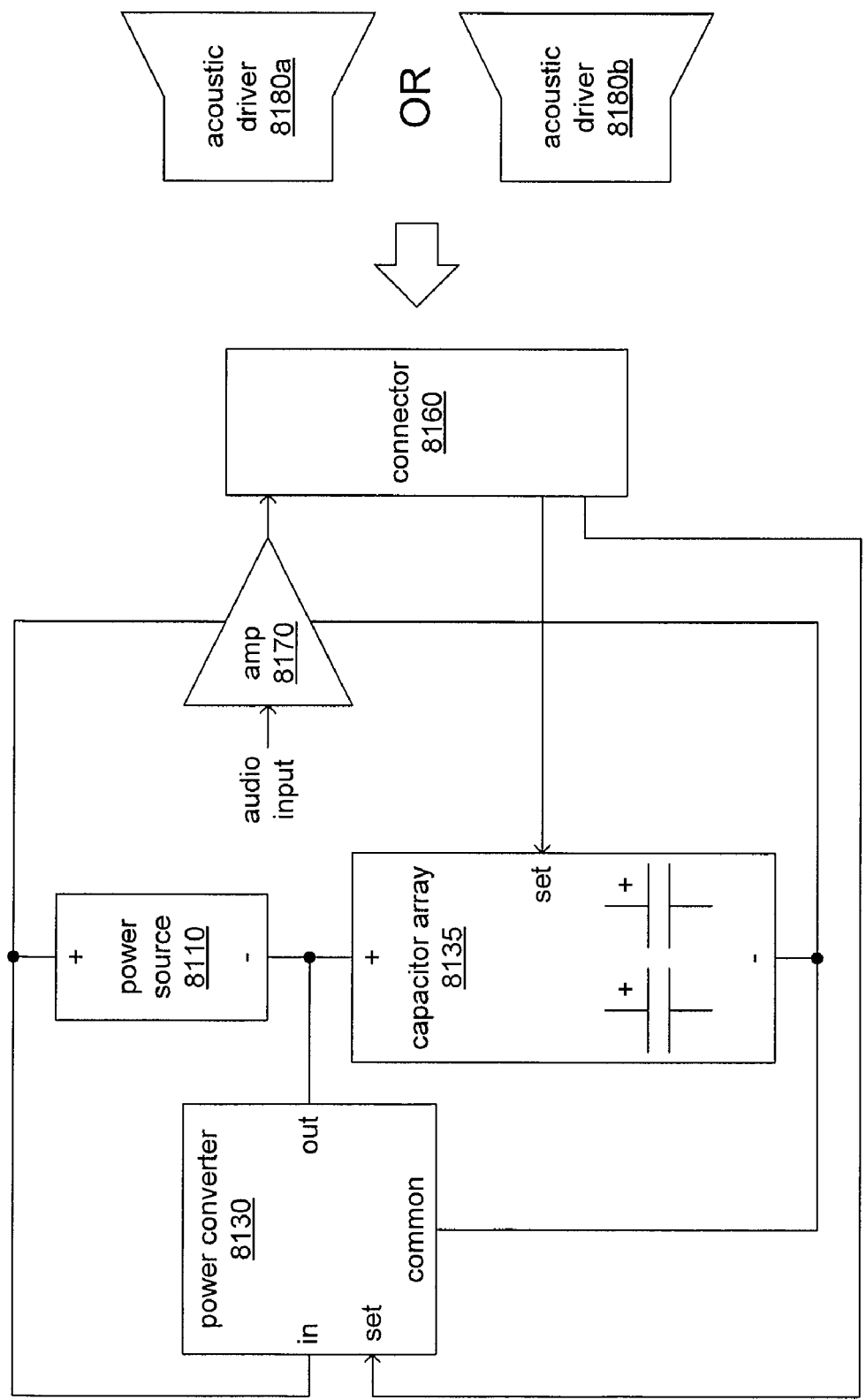
FIG. 28 is a circuit diagram of a power source and capacitor array coupled in series, and further coupled to an amplifier, with the amplifier driving an acoustic driver through a connector, and with the acoustic driver providing an indication a of setting through the connector.

FIG. 28 depicts a circuit 8100 in which a power source 8110 is coupled in series with a capacitor array 8135 to supply power to an amplifier 8170 that amplifies an audio input to drive one or the other of a pair of detachable acoustic drivers 8180a and 8180b through a connector 8160 to which either of the acoustic drivers 8180a and 8180b may be connected. The voltage provided to the amplifier 8170 is the sum of the voltages across the power source 8110 and the capacitor 8135. The power converter 8130 is configured to cause one or more capacitors within the capacitor array 8135 to be selectively charged and discharged in response to the amount of current drawn by the amplifier 8170 in driving whichever one of the acoustic drivers 8170a and 8170b is connected to the connector 8160 by imposing a predetermined limit on the amount of current that may be drawn through the output terminal of the power converter 8130.

Although there are substantial similarities between the circuit 8100 and the earlier-discussed circuit 7100, the circuit 8100 differs somewhat from circuits discussed previously herein in that part of the load provided with power is not detachable (namely, the amplifier 8170), while part of the load is detachable and exchangeable with alternate detachable load parts (namely the acoustic drivers 8180a and 8180b). However, as those skilled in the art will readily recognize, it is not uncommon for a load to have separable subparts that may be exchanged with other subparts that present differing power requirements, and as those skilled in the art of audio amplification and playback will readily recognize, the amount of power required by a given amplifier can vary greatly depending on the specific acoustic driver that it drives.

In some embodiments of the circuit 8100, each of the acoustic drivers 8180a and 8180b, while connected to the connector 8160, provides an indication to the power converter 8130 of a setting for the predetermined limit that is compatible with whichever one of the acoustic drivers 8180a and 8180b is connected to the connector 8160. In some embodiments, each of the acoustic drivers 8180a and 8180b, while connected to the connector 8160, provides an indication to the capacitor array 8135 of a configuration of interconnections between the capacitors of the capacitor array 8135 that is compatible with whichever one of the acoustic drivers 8180a and 8180b is connected to the connector 8160. Providing the ability for acoustic drivers to specify such settings may be advantageous where different acoustic drivers have widely varying resistances such that one acoustic driver may require that an amplifier be provided with higher voltage, but not as much current, as compared to another acoustic driver (e.g., switching between 4Ω and 8Ω speakers).

In the circuit 8100, the cathode of the power source 8110 is coupled to the anode of the capacitor array 8135, and through the connector 8160, the anode of the power source 8110 and the cathode of the capacitor array 8135 are each coupled to a pole of the amplifier 8170. The input terminal of the power converter 8130 is coupled to the anode of the power source 8110, the output terminal of the power converter 8130 is coupled to the cathode of the power source 8110 and the anode of the capacitor array 8135, and the common terminal of the power converter 8130 is coupled to the cathode of the capacitor array 8135.

Not unlike previously discussed circuits, the automatic setting of the predetermined limit imposed by the power converter 8130 on current flowing out through the output terminal in response to the connection of a given acoustic driver to the connector 8160 is brought about by any of a number of possible mechanisms in various possible embodiments. Possible mechanisms include, and are not limited to, at least one resistor carried by an acoustic driver that forms a voltage divider to provide the power converter 8130 with a signal at a specific voltage level, selectively grounding and/or shunting to a high voltage level at least one contact of the connector 8160 that is coupled to the power converter 8130, and provision of a digital code by an acoustic driver connected to the connector 8160 that indicates a setting.

The configuration of interconnections between the capacitors within the capacitor array 8135 is meant to be alterable in response whichever one of the acoustic drivers 8180a and 8180b is connected to the connector 8160, which thereby provides an indication of a particular configuration of capacitor interconnections to be adopted within the capacitor array 8135. Possible configurations of interconnections may include connecting multiple capacitors in series, connecting multiple capacitors in parallel, and/or either increasing or decreasing the quantity of capacitors that are used. In embodiments having enough capacitors within the capacitor array 8135, the possible configurations of interconnections may further include connecting multiple sets of capacitors in series where the capacitors in each set are connected in parallel.

Also not unlike previously discussed circuits, the automatic configuration of interconnections between the capacitors of the capacitor array 8135 in response to the connection of an acoustic driver to the connector 8160 is brought about by any of a number of possible mechanisms. Possible mechanisms include, and are not limited to, pluralities of relays or contactors associated with the capacitor array 8135, banks of switches operated by a mechanical actuator associated with the connector 8160, magnetic switches operated by one or more magnets brought into proximity with the connector 8160, and various forms of transistor or other semiconductor switching devices associated with the capacitor array 8135. In some embodiments, an acoustic driver connected to the connector 8160 may provide an analog or digital signal that is interpreted by a controlling device such as a microprocessor or microcontroller that in turn operates mechanical and/or semiconductor switching devices to bring about a configuration of capacitor interconnections indicated by the signal. In other embodiments, anodes and/or cathodes of multiple capacitors within the capacitor array 8135 are coupled to multiple contacts of the connector 8160, and an acoustic driver connected to the connector 8160 selectively couples various ones of those contacts to thereby directly interconnect those capacitors in a configuration compatible with that load.

Furthermore, in some embodiments, there may be a default predetermined limit on current flow imposed by the power converter 8130 and/or there may be a default configuration of capacitor interconnections for the capacitors of the capacitor array 8135 that is automatically resorted to where an acoustic driver is connected to the connector 8160, but provides no indication of a setting for the predetermined limit and/or no indication of a configuration of capacitor interconnections. Regardless of whether or not a given acoustic driver connected to the connector 8160 actually provides one or more of such indications, the provision of the capability to allow an acoustic driver to provide such indications enables the power converter 8130 and/or the capacitor array 8135 to be readied to provide that acoustic driver with an amount of current flow and/or a voltage level that is compatible with the power requirements of the amplifier 8170 driving that acoustic driver. Furthermore, these indications are able to be provided without configuration steps being taken by a person who connects a load to the connector 8160, thereby removing an opportunity for human error.

The capacitor array 8135 cooperates with the power converter 8130 to provide support for temporary increases in current drawn by the amplifier 8170 while driving one or the other of the acoustic drivers 8180*a* and 8180*b*. An acoustic driver connected to the connector 8160 may provide indications of a setting for the predetermined limit on current flow imposed by the power converter 8130 and/or of a configuration of capacitor interconnections selected to tailor the support for temporary increases of current to achieve one or more specific characteristics (e.g., a desired current flow, a desired voltage level, a desired capacitor discharge time, etc.). Alternatively, an acoustic driver connected to the connector 8160 may provide one or more values in a digitally encoded form that directly specify one or more of such characteristics desired to be met in providing for such temporary increases, and a microprocessor or microcontroller may employ such digitally encoded values to determine settings to be given to the power converter 8130 and/or the capacitor array 8135.

As previously mentioned, the predetermined limit on current flowing out through the output terminal of the power converter 8130 is used to cause the capacitor array 8135 to be selectively charged and discharged depending on the amount of current drawn by the amplifier 8170 in driving an acoustic driver connected to the connector 8160, and thereby allow the capacitor array 8135 to provide support for temporary increases in power. At times when driving an acoustic driver connected to the connector 8160 causes the amplifier 8170 to draw a relatively small amount of current, such that the limit of current flowing out through the output terminal of the power converter 8130 is not exceeded, current from the power source 8110 is able to flow out through the output terminal without limits being imposed on it by the power converter 8130, and with a portion of that current used to charge capacitors of the capacitor array 8135. However, at times when driving an acoustic driver connected to the connector 8160 causes the amplifier 8170 to attempt to draw a relatively large amount of current, such that the limit of current flowing out through the output terminal of the power converter 8130 would be exceeded if this amount of current were permitted through the power converter 8130, the flow of current out through the output terminal becomes limited by the power converter 8130 to an amount less than the amplifier 8170 is attempting to draw. The capacitor array 8135 then discharges which allows at least a portion of the higher current draw of the amplifier 8170 to be partially supported by the capacitor array 8135 by flowing through the capacitor array 8135 for up to the amount of time required for the capacitors of the capacitor array 8135 to discharge, thereby briefly circumventing the predetermined limit on current flow imposed by the power converter 8130.

Figure 29:
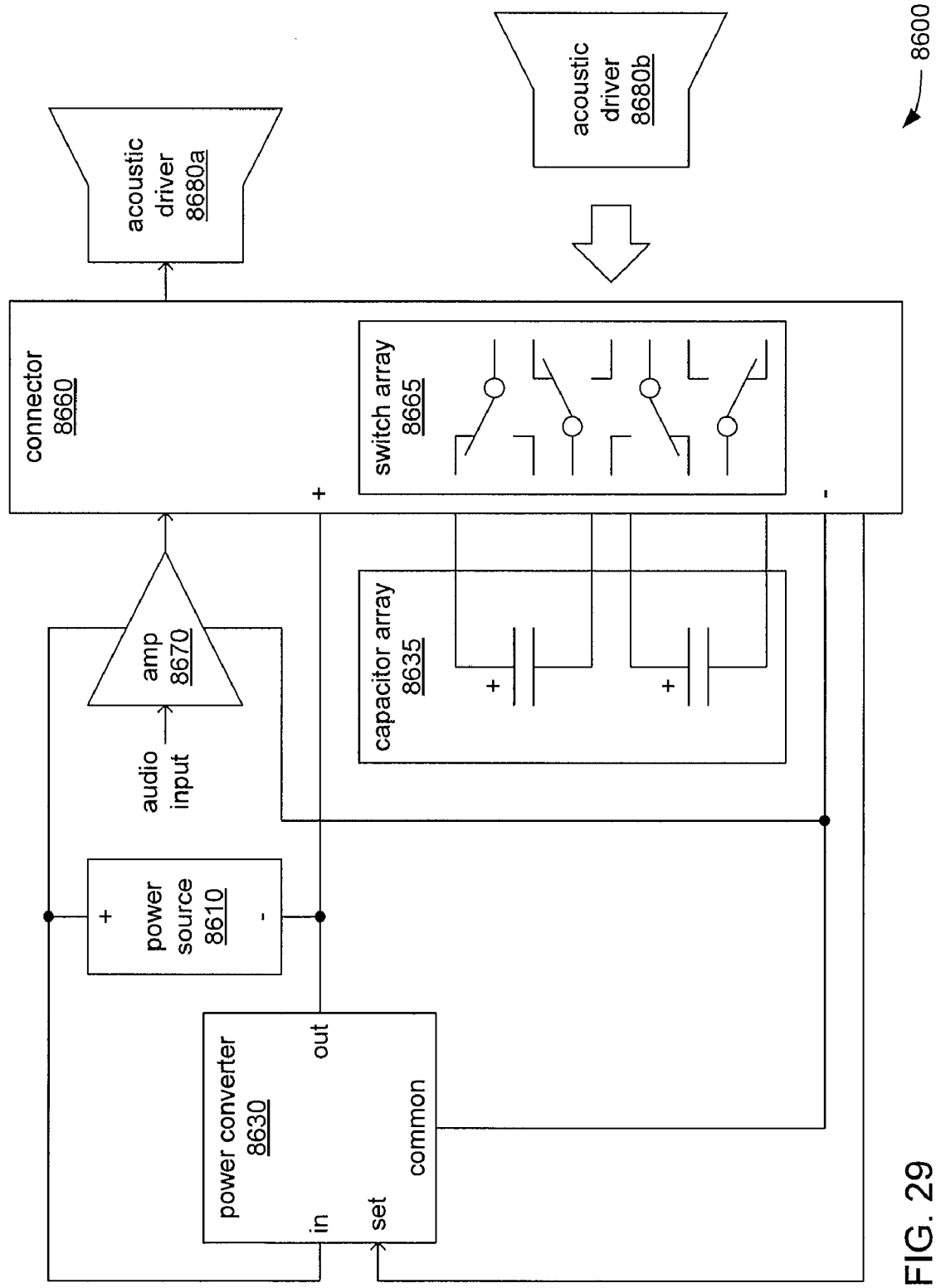
FIG. 29 is a circuit diagram of a power source and capacitor array coupled in series, and further coupled to an amplifier, with the amplifier driving either a detachable acoustic driver or a non-detachable acoustic driver depending on the connection or disconnection of the detachable driver, and with an indication of a setting also depending on the connection or disconnection of the detachable driver.

FIG. 29 depicts a circuit 8600 in which a specific example of a load providing indications of settings for a predetermined limit on current flow and/or a configuration of capacitor interconnections is shown. The circuit 8600 is substantially similar to the circuit 8100 of FIG. 28, most notably in that a power source 8610 is coupled in series with a capacitor array 8635 to supply power to an amplifier 8670 to drive an acoustic driver. Furthermore, not unlike the power converter 8130 of the circuit 8100, a power converter 8630 of the circuit 8600 may be configured to cause one or more capacitors within the capacitor array 8635 to be selectively charged and discharged in response to the amount of current drawn by the amplifier 8670 by imposing a predetermined limit on the amount of current that may be drawn through the output terminal of the power converter 8630.

Although there are substantial similarities between the circuit 8100 and the earlier-discussed circuit 8600, in the circuit 8600, one of the acoustic drivers that may be chosen for use with the amplifier 8670 is not detachable. More specifically, one acoustic driver 8680*a* is a non-detachable part of the circuit 8600, while another acoustic driver 8680*b* is detachable, and the connection and disconnection of the acoustic driver 8680*b* automatically determines whether or not the amplifier 8670 drives the acoustic driver 8680*a*. The connector 8660 is of a type that incorporates a switch to selectively direct the amplified output of the amplifier 8670 either towards the acoustic driver 8680*a* when no acoustic driver is connected to the connector 8660, or towards another acoustic driver (such as the acoustic driver 8680*b*) that is connected to the connector 8660 during the time that the other acoustic driver is connected to the connector 8660. The switch that carries out this redirection of amplified audio between acoustic drivers may be one of the individual switches of a switch array 8665 incorporated into the connector 8660.

The circuit 8600 illustrates an approach to setting a configuration of interconnections between capacitors within the capacitor array 8635 through a multitude of switches making up the switch array 8665 incorporated into the connector 8660. While no acoustic driver is connected to the connector 8660, individual switches within the switch array 8665 are allowed to remain in predetermined default states. The individual capacitors of the capacitor array 8635 are coupled to various ones of these individual switches, and with those switches in their default states, a configuration of capacitor interconnections is formed among the capacitors of the capacitor array 8635 is formed that is compatible with the power requirements of the amplifier 8670 driving the acoustic driver 8680*a*. However, the act of connecting the acoustic driver 8680*b* to the connector 8660 causes at least some of the individual switches within the switch array 8665 to be set to various alternate predetermined states, thereby forming a configuration of capacitor interconnections that is compatible with the power requirements of the amplifier 8670 driving the acoustic driver 8680*b*.

The circuit 8600 also illustrates a similar approach to setting a predetermined limit imposed by the power converter 8630 on an amount of current flowing out through the use of another switch for which the state changes in response to the acts of connecting and disconnecting an acoustic driver (such as the acoustic driver 8680*b*) to and from the connector 8660. The change in state of this switch may alter a level of resistance coupled to an input of the power converter 8630 or convey some other form of signal to the power converter 8630 to cause the power converter 8630 to change its predetermined limit.

Thus, in various possible embodiments, the act of connecting the acoustic driver 8680*b* to the connector 8660 causes the amplified output of the amplifier 8670 to be redirected from the acoustic driver 8680*a* to the acoustic driver 8680*b*, and may cause one or both of a change in predetermined limit of the power converter 8630 and a change in the capacitor interconnections configuration to occur to accommodate the amplifier 8670 driving the acoustic driver 8680*b*, instead of the acoustic driver 8680*a*. Furthermore, these changes are reversed in response to the act of disconnecting the acoustic driver 8680*b* from the connector 8660. This may be desirable where it is expected that the acoustic driver 8680*b* may be unexpectedly connector and disconnected frequently, such as in the case of an electronic device incorporating the circuit 8600 wherein the acoustic driver 8680*a* is a built-in speaker and the acoustic driver 8680*b* is an earpiece. As those skilled in the art will readily recognize, the characteristics of the power required by the amplifier 8670 to drive a speaker versus an earpiece are substantially different, as is the amount of power required for each.

It should be noted that, depending on the nature of the loads to be connected in each of these embodiments, it may prove to be prudent practice to incorporate various current-limiting measures to prevent or at least control sudden fluctuations in current flow through a power source, capacitors and/or various conductors and switching devices as a result of the connection/disconnection of loads. It should also be noted that, depending on the nature of the capacitors employed in each of the above arrays of capacitors, it may prove to be prudent practice to incorporate voltage-balancing measures to prevent individual capacitor voltages from exceeding a limit by which a capacitor, a load, or conductors used in conveying current to and from the capacitors are not damaged.

Such measures as have already been discussed herein may be augmented or replaced by other measures, including thermally-reactive current limiting devices placed in series with a power source and/or capacitor array. Either or both of FET devices and resistors may be coupled to each capacitor of a capacitor array to prevent occurrences of capacitor voltages exceeding limits. Still other measures will occur to those skilled in the art.

Other embodiments are within the scope of the following claims.

What is claimed is:

1. An apparatus comprising:
   a connector;
   a power source to provide power to support at least one part of either a first load or a second load connected to the connector; and
   a capacitor array comprising a first capacitor and a second capacitor having an alterable interconnection that changes between a series configuration and a parallel configuration in response to the connection of the at least one part of one or the other of the first load and the second load to the connector.

2. The apparatus of claim 1, further comprising a power converter, wherein the power converter is structured to impose a predetermined limit on a flow of current from the power source through a portion of the power converter, and wherein the power converter is structured to cooperate with the capacitor array to provide a temporary flow of current from the power source circumventing the power converter in response to an increase in power requirements of at least one of the first load and the second load.

3. The apparatus of claim 2, wherein the power converter is structured to change the predetermined limit in response to the receipt of a signal from the at least one part of one or the other of the first load and the second load connected to the connector.

4. The apparatus of claim 1, further comprising a switching device incorporated into the connector to change the alterable interconnection in response to a mechanical interaction between the connector and the at least one part of one or the other of the first load and the second load arising from the connection of the at least one part to the connector.

5. The apparatus of claim 1, further comprising a switching device to change the alterable interconnection in response to a signal received from the at least one part of one or the other of the first load and the second load through the connector, wherein the signal is indicative of whether it is the at least one part of the first load or the at least one part of the second load that is connected to the connector.

6. The apparatus of claim 5, further comprising a processing device and a storage device in which a routine is stored that comprises a sequence of instructions that when executed by the processing device causes the processing device to:
   receive the signal from the at least one part of one or the other of the first load and the second load; and
   operate the switching device in response to receiving the signal.

7. The apparatus of claim 6, wherein the signal specifies a characteristic of electrical power required by the one or the other of the first load and the second load, and wherein the processing device is further caused by the routine to perform a calculation based on the signal to derive a configuration of the alterable interconnection.

8. The apparatus of claim 7, wherein the power source is structured to provide an additional signal specifying a characteristic of the power source to the processing device, and wherein the processing device is further caused by the routine to perform a calculation based on the signal and the additional signal to determine if the characteristic of electrical power required by one or the other of the first load and the second load is able to be satisfied utilizing the power source.

9. The apparatus of claim 1, wherein the connector comprises a first contact coupled to the first capacitor and a second contact coupled to the second capacitor, and wherein the connector is structured to enable the alterable interconnection to be changed by enabling the at least one part of one or the other of the first load and the second load to couple the first and second contacts when connected to the connector.

10. The apparatus of claim 1, wherein at least one of the first load and the second load comprises an audio amplifier and an acoustic driver, and wherein the at least one part is the acoustic driver.

11. An apparatus comprising:
a connector;
a power source to provide power to support at least one part of either a first load or a second load connected to the connector; and
a power converter, wherein the power converter is structured to impose a predetermined limit on a flow of current from the power source through a portion of the power converter, and wherein the power converter is structured to change the predetermined limit in response to the connection of the at least one part of one or the other of the first load and the second load to the connector.

12. The apparatus of claim 11, further comprising a capacitor array comprising a first capacitor and a second capacitor having an alterable interconnection that changes between a series configuration and a parallel configuration in response to the connection of the at least one part of one or the other of the first load and the second load to the connector, and wherein the capacitor array is structured to cooperate with the power converter to provide a temporary flow of current from the power source circumventing the power converter in response to an increase in power requirements of at least one of the first load and the second load.

13. The apparatus of claim 11, wherein the power converter is structured to enable changing the predetermined limit in response to the receipt of a signal from the at least one part of one or the other of the first load and the second load connected to the connector, wherein the signal is indicative of whether it is the at least one part of the first load or the at least one part of the second load that is connected to the connector.

14. The apparatus of claim 13, further comprising a processing device and a storage device in which a routine is stored that comprises a sequence of instructions that when executed by the processing device causes the processing device to:

receive the signal from the at least one part of one or the other the first load and the second load; and
operate the power converter to change the predetermined limit in response to receiving the signal.

15. The apparatus of claim 14, wherein the signal specifies a characteristic of electrical power required by the one or the other of the first load and the second load, and wherein the processing device is further caused by the routine to perform a calculation based on the signal to derive a degree to which the predetermined limit is changed.

16. The apparatus of claim 15, wherein the power source is structured to provide an additional signal specifying a characteristic of the power source to the processing device, and wherein the processing device is further caused by the routine to perform a calculation based on the signal and the additional signal to determine if the characteristic of electrical power required by one or the other of the first load and the second load is able to be satisfied utilizing the power source.

17. The apparatus of claim 11, wherein at least one of the first load and the second load comprises an audio amplifier and an acoustic driver, and wherein the at least one part is the acoustic driver.

18. An apparatus comprising:
a connector;
an audio amplifier to output amplified audio to the connector;
a power source to provide power to the amplifier; and
a power control device with an alterable power control parameter, wherein the power control device is structured to change the alterable power control parameter to accommodate either a first acoustic driver or a second acoustic driver in response to the connection of the first acoustic driver to the connector.

19. The apparatus of claim 18, wherein the power control device is a capacitor array comprising a first capacitor and a second capacitor, and wherein the alterable power control parameter is an alterable interconnection between the first and second capacitors that is changeable between a series configuration and a parallel configuration.

20. The apparatus of claim 18, wherein the power control device is a power converter, and wherein the alterable power control parameter is a predetermined limit imposed by the power converter on a flow of current through a portion of the power converter to provide power to at least the audio amplifier to drive one or the other of the first acoustic driver and the second acoustic driver.

21. The apparatus of claim 18, further comprising
a switching device structured to redirect the amplified audio from the connector and to the second acoustic driver in response to the second acoustic driver not being connected to the connector.

* * * * *